United States Patent
Bae et al.

(10) Patent No.: US 8,134,866 B2
(45) Date of Patent: *Mar. 13, 2012

(54) PHASE CHANGE MEMORY DEVICES AND SYSTEMS, AND RELATED PROGRAMMING METHODS

(75) Inventors: Jun-Soo Bae, Hwaseong-si (KR); Kwang-Jin Lee, Hwaseong-si (KR); Beak-Hyung Cho, Hwaseong-si (KR); Woo-Yeong Cho, Suwon-si (KR); Hye-Jin Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 253 days.

This patent is subject to a terminal disclaimer.

(21) Appl. No.: 12/652,842

(22) Filed: Jan. 6, 2010

(65) Prior Publication Data
US 2010/0103726 A1 Apr. 29, 2010

Related U.S. Application Data

(63) Continuation-in-part of application No. 12/559,792, filed on Sep. 15, 2009, which is a continuation of application No. 12/395,999, filed on Mar. 2, 2009, which is a continuation of application No. 11/727,711, filed on Mar. 28, 2007, now Pat. No. 7,529,124.

(30) Foreign Application Priority Data

Apr. 6, 2006 (KR) .................... 10-2006-0031494

(51) Int. Cl.
*G11C 11/00* (2006.01)
(52) U.S. Cl. ................. 365/163; 365/189.09; 365/210.1
(58) Field of Classification Search .................. 365/163, 365/158, 171, 173
See application file for complete search history.

(56) References Cited

U.S. PATENT DOCUMENTS

| 6,075,719 A | 6/2000 | Lowrey et al. |
| 6,928,022 B2 | 8/2005 | Cho et al. |
| 6,967,865 B2 | 11/2005 | Lee |
| 6,982,913 B2 | 1/2006 | Oh et al. |

(Continued)

FOREIGN PATENT DOCUMENTS

| JP | 07254291 A | 10/1995 |
| KR | 1020000029264 A | 5/2000 |
| KR | 1020050085619 A | 8/2005 |
| WO | 2004055827 A1 | 7/2004 |

OTHER PUBLICATIONS

Bedeschi, Ferdinando et al.; "A Bipolar-Selected Phase Change Memory Featuring Multi-Level Cell Storage"; IEEE Journal of Solid-State Circuits, vol. 44, No. 1, Jan. 2009, pp. 217-227.

*Primary Examiner* — Gene Auduong
(74) *Attorney, Agent, or Firm* — Volentine & Whitt, PLLC

(57) ABSTRACT

A method programs a phase change memory device. The method comprises receiving program data for selected memory cells; generating bias voltages based on reference cells; sensing read data stored in a selected memory cell by supplying the selected memory cell with verification currents determined by the bias voltages; determining whether the read data is identical to the program data; and upon determining that the program data for one or more of the selected memory cells is not identical to the corresponding read data, iteratively applying a write current to the one or more selected memory cells.

20 Claims, 56 Drawing Sheets

U.S. PATENT DOCUMENTS

| | | |
|---|---|---|
| 7,042,760 B2 | 5/2006 | Hwang et al. |
| 7,050,328 B2 | 5/2006 | Khouri et al. |
| 7,529,124 B2 * | 5/2009 | Cho et al. ............... 365/163 |
| 7,646,632 B2 * | 1/2010 | Philipp et al. ............ 365/163 |
| 2008/0074918 A1 | 3/2008 | Ro et al. |
| 2008/0123389 A1 | 5/2008 | Cho et al. |
| 2009/0161415 A1 * | 6/2009 | Philipp et al. ............ 365/163 |
| 2009/0161421 A1 * | 6/2009 | Cho et al. ............... 365/163 |
| 2010/0008133 A1 * | 1/2010 | Cho et al. ............... 365/163 |

* cited by examiner

Memory Cell

Fig. 20

| 1-1 | 1-2 | 1-3 | 1-4 | 1-5 | 1-6 | 1-7 | 1-8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(2_1) | | SA/WD(2_2) | | SA/WD(2_3) | | SA/WD(2_4) | |
| Peripheral Circuit Region 3 | | | | | | | |
| SA/WD(2_8) | | SA/WD(2_7) | | SA/WD(2_6) | | SA/WD(2_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1-16 | 1-15 | 1-14 | 1-13 | 1-12 | 1-11 | 1-10 | 1-9 |

Fig. 26
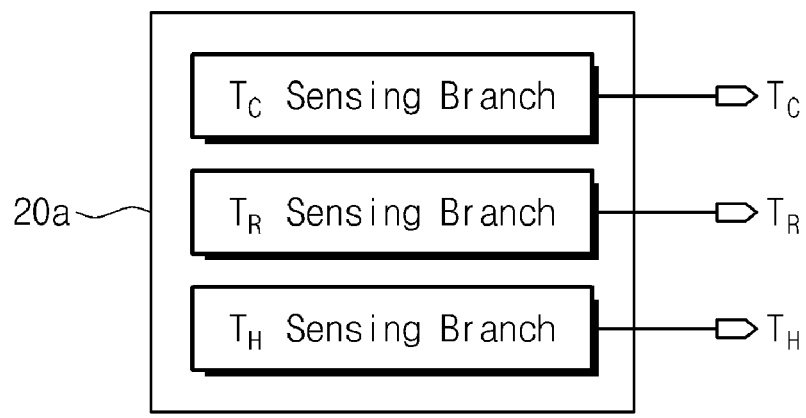
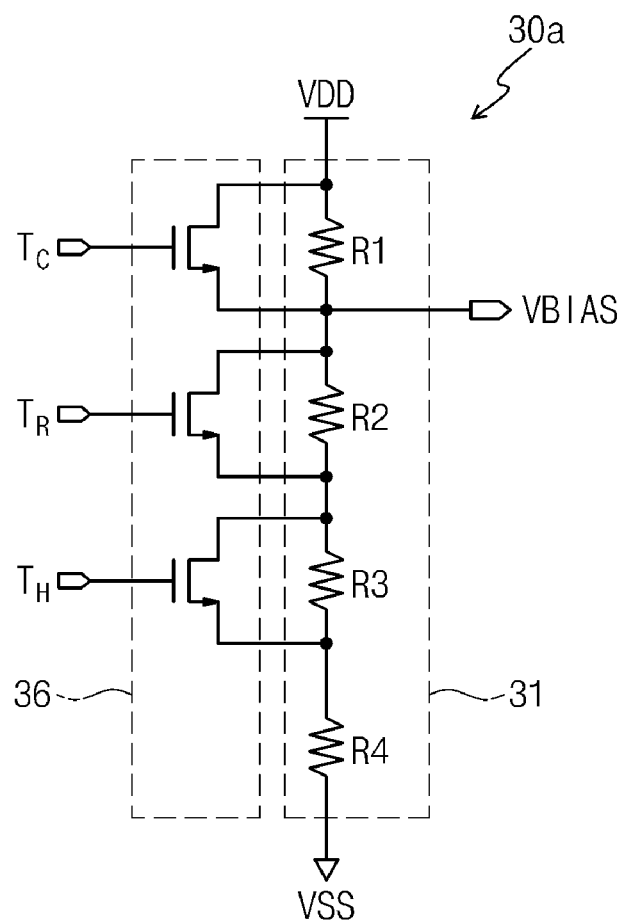

PHASE CHANGE MEMORY DEVICES AND SYSTEMS, AND RELATED PROGRAMMING METHODS

CROSS-REFERENCE TO RELATED APPLICATIONS

This application is a Continuation-In-Part of pending U.S. application Ser. No. 12/559,792 filed on Sep. 15, 2009, which is a Continuation of pending U.S. application Ser. No. 12/395,999 filed on Mar. 2, 2009, which is a Continuation of U.S. application Ser. No. 11/727,711 filed Mar. 28, 2007 (now U.S. Pat. No. 7,529,124) which makes a claim of priority to Korean Patent Application No. 10-2006-0031494 filed on Apr. 6, 2006, the collective disclosures of which are hereby incorporated by reference.

BACKGROUND

Embodiments of the inventive concept relate generally to semiconductor memory devices. More particularly, embodiments of the inventive concept relate to phase change memory devices and systems, and related programming methods.

Phase change memory devices store data using phase change materials, such as chalcogenide, which are capable of stably transitioning between amorphous and crystalline phases. The amorphous and crystalline phases (or states) exhibit different resistance values, which are used to distinguish different logic states of memory cells in the memory devices. In particular, the amorphous phase exhibits a relatively high resistance, and the crystalline phase exhibits a relatively low resistance.

Phase change memory devices typically use the amorphous state to represent a logical "1" and the crystalline state to represent a logical "0". The crystalline state is generally referred to as a "set state", and the amorphous state is referred to as a "reset state". Accordingly, phase change memory cells in the phase change memory devices typically store a logical "0" ("SET data") by "setting" a phase change material in the memory cells to the crystalline state, and the phase change memory cells store a logical "1" ("RESET data") by "resetting" the phase change material to the amorphous state. A phase change memory cell having the "reset state" can be said to store "RESET data" and a phase change memory cell having the "set state" can be said to store "SET data". Various phase change memory devices are disclosed, for example, U.S. Pat. Nos. 6,487,113 and 6,480,438.

The phase change material in a phase change memory device is typically converted to the amorphous state by heating the material to above a predetermined melting temperature and then quickly cooling the material. The phase change material is typically converted to the crystalline state by heating the material at another predetermined temperature below the melting temperature for a period of time. Accordingly, data is written to memory cells in a phase change memory device by converting the phase change material in memory cells of the phase change memory device between the amorphous and crystalline states using heating and cooling as described.

The phase change material in a phase change memory device typically comprises a compound including germanium (Ge), antimony (Sb), and tellurium (Te), i.e., a "GST" compound. The GST compound is well suited for a phase change memory device because it can quickly transition between the amorphous and crystalline states by heating and cooling.

At least one type of phase change memory cell comprises a top electrode, a chalcogenide layer, a bottom electrode contact, a bottom electrode, and an access transistor or a diode, wherein the chalcogenide layer is the phase change material of the phase change memory cell. Accordingly, a read operation is performed on the phase change memory cell by measuring the resistance of the chalcogenide layer, and a program operation is performed on the phase change memory cell by heating and cooling the chalcogenide layer as described above. A phase change memory cell typically further comprises a switching element used to control a supply of current to the phase change material for program operations.

FIG. 1 is a schematic block diagram and a circuit diagram illustrating one type of conventional phase change memory cell. The phase change memory cell of FIG. 1 comprises a resistor and a switching element (shown by circuit symbols in a broken oval). The resistor comprises a phase change layer 1, an upper electrode 2 formed above phase change layer 1, and a lower electrode 3 formed below phase change layer 1. In the example of FIG. 1, phase change layer 1 comprises the phase change material for the phase change memory cell.

As described above, the phase of the phase change material can be transformed by temperature changes. For example, the phase change memory cell of FIG. 1 can be programmed by closing the switching element to supply a current to the resistor. When the current is supplied to the resistor, lower electrode 3 heats up, causing phase change layer 1 to heat up.

Accordingly, as described above, the phase change memory cell of FIG. 1 can be programmed to the amorphous, or "reset" state by heating phase change layer 1 to a temperature T1 using lower electrode 3 and then quickly cooling phase change layer 1. Similarly, the phase change memory cell of FIG. 1 can be programmed to the crystalline, or "set" state by heating phase change layer 1 to a second temperature T2 (T2<T1) and maintaining phase change layer 1 at temperature T2 using lower electrode 3, and then and then cooling phase change layer 1. In one example, T1 is roughly equal to 1 ns and T2 is around 30-50 ns.

As an example, FIG. 2 is a graph illustrating a temperature profile of a phase change memory cell during a program operation. As seen in FIG. 2, the phase change memory cell is programmed to the reset state by applying a current "i1" to the phase change memory cell for a first time period to heat the phase change material within the phase change memory cell to above temperature T1. After the phase change material reaches temperature T1, current "i1" is no longer applied to the phase change memory cell and the phase change material rapidly cools.

The phase change memory cell is programmed to the set state by applying a current "i2" to the phase change memory cell for a second time period longer than the first time period. Current "i2" heats the phase change material to above temperature T2 and maintains the phase change material above temperature T2 throughout the second time period. Then, after the second time period, current "i2" is no longer applied to the phase change memory cell, allowing the phase change material to cool.

An amount of heat "J" applied to phase change layer 1 is proportional to $I^2R$, where "I" denotes a magnitude of a current "I" flowing through lower electrode 3, and "R" denotes a resistance "R" of lower electrode 3. Resistance "R" is proportional to a cross-sectional area of lower electrode 3, and the cross-sectional area of lower electrode 3 is proportional to $\pi r^2$, where "r" denotes a radius "r" of lower electrode 3. Therefore, heat "J" applied to phase change layer 1 is generated in proportion to the square of the radius of lower electrode 3. In other words, heat "J" is proportional to $r^2$.

The lower electrodes of different phase change memory cells in a phase change memory device tend to have slightly different radii due to minor variations in processes used to form the phase change memory cells. As a result, the amount of heat generated around each of the lower electrodes will vary, even when the same voltage is applied to each of the phase change memory cells. These different amounts of heat will lead to differences in the respective resistances of corresponding phase change layers. Accordingly, phase change memory cells programmed to the same state may have different resistances.

The resistances of phase change memory cells (or in other words, the resistance of the corresponding phase change materials) within a phase change memory device typically exhibit bell shaped distributions. As a result, a state of a phase change memory cell is typically determined by comparing the resistance of the phase change memory cell with a reference read resistance between the distributions corresponding to the crystalline state and the amorphous state. To properly distinguish between the crystalline and amorphous states, the reference read resistance is located within a read margin between a minimum value of the distribution corresponding to the amorphous state and a maximum value of the distribution corresponding to the crystalline state.

Unfortunately, the distributions corresponding to the crystalline and amorphous states may be so close to each other that the read margin may be undesirably small. Where the read margin of the phase change memory cells is undesirably small, the reliability of the phase change memory device tends to be degraded because smaller read margins make it increasingly difficult for the reference read resistance to distinguish between the crystalline and amorphous states.

Of further note, the resistance of a phase change material may be varied as an external (ambient or operating) temperature changes. For example, assuming a set resistance of about 6 k$\Omega$ at 25° C. and a reset resistance of about 150 k$\Omega$ at 25° C., it is not uncommon for the set resistance to fall from about 6 k$\Omega$ to 3.45 k$\Omega$ and the reset resistance to fall from about 150 k$\Omega$ to 50 k$\Omega$ as the temperature rises from 25° C. to 85° C. Since this temperature variation in the reset resistance is more than the variation in the set resistance, a loss of read margin may arise between the set resistance and the reset resistance. This makes it increasingly difficult to distinguish between the set state and reset state at an associated sense amplifier. That is, if the reset resistance is much reduced, the prevalence of read errors will rise where a reset state must be discriminated form a set state.

SUMMARY OF THE INVENTIVE CONCEPT

According to an embodiment of the inventive concept, a method of performing a program operation in a phase change memory device is provided. The method comprises receiving program data to be programmed in selected memory cells among the plurality of phase change memory cells; generating bias voltages based on reference cells; sensing read data stored in the selected memory cells by supplying the selected memory cells with verification currents each determined by the bias voltages; determining whether the read data is identical to the program data; and upon determining that the program data for one or more of the selected memory cells is not identical to the corresponding read data, iteratively applying a write current to the one or more selected memory cells.

According to another embodiment of the inventive concept, a phase change memory device is provided. The phase change memory device comprises an array comprising a plurality of phase change memory cells configured to store write data; and a generator configured to generate a level-controlled write current based on first reference cells and apply the level-controlled write current to the memory array, wherein the level-controlled write current is adjusted with each iterative application of the level-controlled write current, until a resistive state of the selected phase change memory cell falls within a defined resistance distribution corresponding to the write data.

According to still another embodiment of the inventive concept, there is provided a method of writing data to a memory comprising a plurality phase change memory cells each storing N-bit data according to respectively corresponding $N^2$ resistance distributions. The method comprises receiving write data to be written to a selected phase change memory cell in the plurality of phase change memory cells; applying a write current to the selected phase change memory cell, wherein the write current is defined in relation to the write data; after applying the write current, sensing a resistive state of the selected phase change memory cell; comparing the sensed resistive state of the selected phase change memory cell to a reference defined in relation to the write data; and if the sensed resistive state fails comparison with the reference, adjusting the write current, and applying the adjusted write current to the selected phase change memory cell, the write current being generated based on reference cells formed identically to the phase change memory cells.

BRIEF DESCRIPTION OF THE DRAWINGS

Embodiments of the inventive concept are described below in relation to the accompanying drawings. Throughout the drawings like reference numbers indicate like exemplary elements, components, and steps. In the drawings:

FIG. 20 is a block diagram illustrating a non-volatile memory device according to still another embodiment of the inventive concept.

FIGS. 26, 27 and 28 are circuit diagrams further illustrating the temperature sensor and compensation control signal generator circuit of FIG. 21.

DETAILED DESCRIPTION OF EMBODIMENTS

Embodiments of the inventive concept are described below with reference to the corresponding drawings. These embodiments are presented as teaching examples. The actual scope of the inventive concept is defined by the claims that follow.

The collective disclosures of U.S. Pat. No. 6,242,605; published Patent Applications Nos. 2007-0236987 and 2008-0123389, and Korean Patent Documents 2008-0074656; 2008-0133071; and 2009-0066990 are hereby incorporated by reference.

Figure 3:
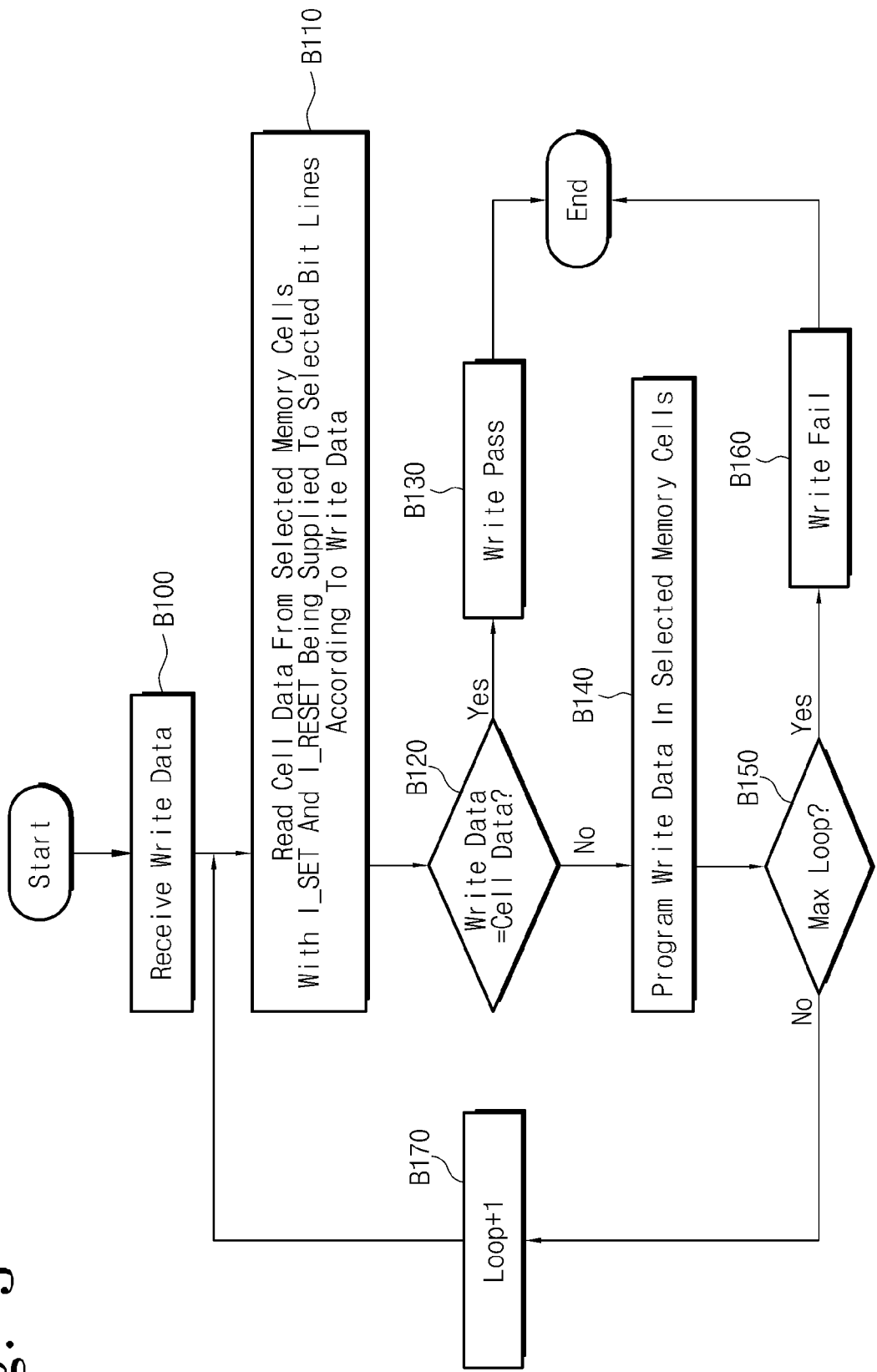
FIG. 3 is a flowchart illustrating a method of programming a phase change memory device according to one embodiment of the inventive concept.
Figure 4:
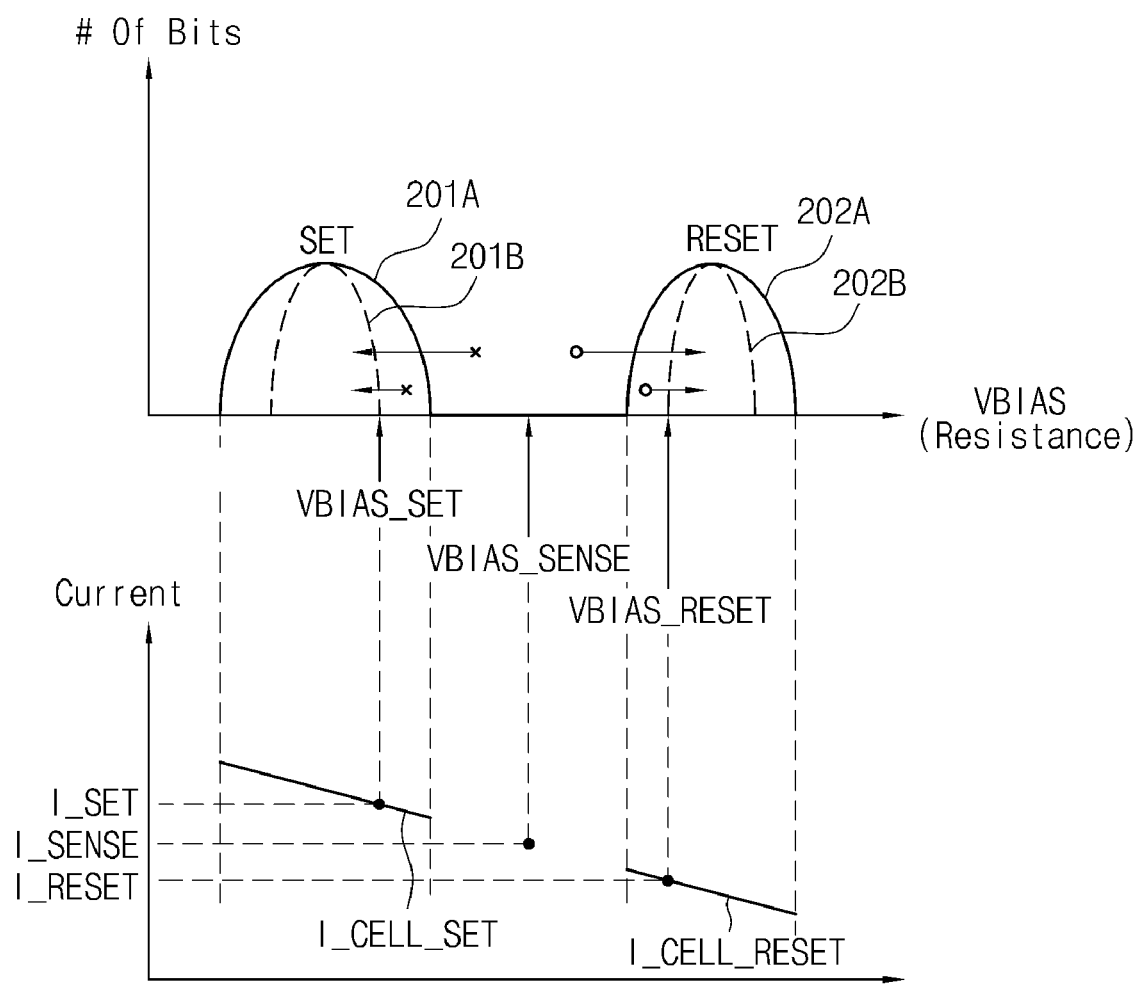
FIG. 4 is a graph illustrating resistance distributions for set and reset states of phase change memory cells in a phase change memory device according to one embodiment of the inventive concept.

FIG. 3 is a flowchart illustrating a method of programming a phase change memory device according to one embodiment of the inventive concept. FIG. 4 includes a first graph illustrating resistance distributions for set and reset states of the phase change memory cells in a phase change memory device according to one embodiment of the inventive concept, and a second graph illustrating program current characteristics corresponding to the resistance distributions illustrated in the first graph.

Figure 5:
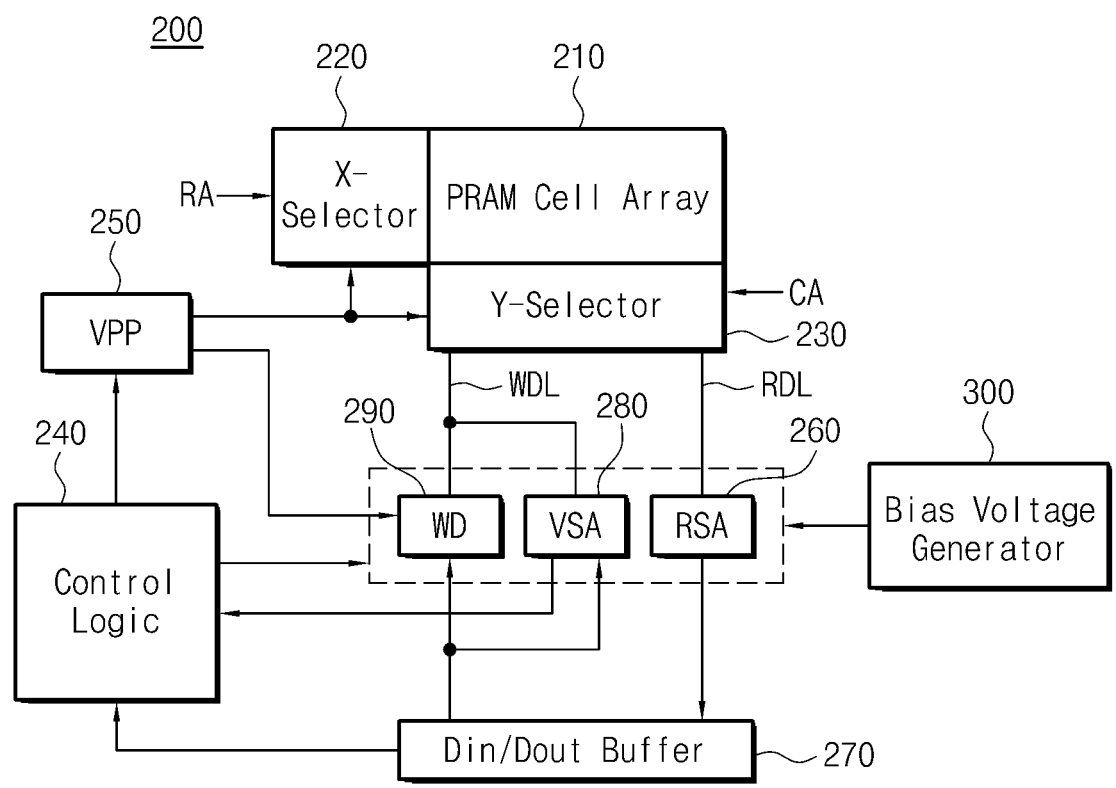
FIG. 5 is a block diagram illustrating a phase change memory device according to one embodiment of the inventive concept.

In this written description, exemplary method steps are denoted by parentheses (BXXX), to distinguish them from exemplary device or system elements such as those illustrated, for example, in FIG. 5.

Referring to FIG. 3, the phase change memory device receives program data (also referred to as "write data") to be programmed in selected memory cells (B100). After receiving the program data, the phase change memory device reads cell data stored in the selected memory cells (B110). Next, the phase change memory device compares the cell data with the program data and determines whether the program data is identical to the cell data stored in the selected memory cells (B120). Where the cell data is the identical to the program data (B120=Yes), the phase change memory device generates a "write pass" or "program pass" indication (B130) and the program operation terminates.

Otherwise, where the cell data is not identical to the program data (B120=No), the phase change memory device re-programs the program data into the selected memory cells (B140). Next, the phase change memory device determines whether a predetermined maximum number of program loops including steps B110, B120, and B140 have been performed (B150). Where the maximum number of program loops have been performed (B150=Yes), the phase change memory device generates a "write fail" or "program fail" indication (B160) and the method terminates. Otherwise (B150=No), the phase change memory device increments a loop number variable denoting the number of program loops that have been performed (B170), and step B110 is repeated. Each time that step B110 is performed, other steps follow, as indicated by the arrows in FIG. 3.

Steps B120 and B130 can be referred to collectively as a "verify read section", and steps B140, B150 and B170 can be referred to collectively as a "write execution section" or "program execution section".

Referring to FIG. 4, curves labeled 201A and 201B represent resistance distributions of phase change memory cells in the set state, and curves labeled 202A and 202B represent resistance distributions of phase change memory cells in the reset state. In FIG. 4, resistance is measured on the x-axis and a number of phase change memory cells having each resistance is measured on the y-axis. Alternatively, the x-axis may represent a bias voltage required to turn on the phase change memory cells.

In FIG. 4, a curve labeled 201A represents a resistance distribution for phase change memory cells in the set state when the phase change memory cells are programmed using a conventional programming method. On the other hand, a dotted curve labeled 201B represents a resistance distribution for phase change memory cells in the set state when the phase change memory cells are programmed using the programming method illustrated in FIG. 3. Similarly, a curve labeled 202A represents a resistance distribution for phase change memory cells in the reset state when the phase change memory cells are programmed using a conventional programming method, and a dotted curve labeled 202B represents a resistance distribution for phase change memory cells in the reset state when the phase change memory cells are programmed using the programming method illustrated in FIG. 3.

In step B110 of FIG. 3, the phase change memory device uses different bias voltages to read the cell data stored in the selected memory cells than the bias voltages used in normal read operations. In other words, different bias voltages are used for read verify operations than for normal read operations.

For example, where the program data for a selected memory cell is a logical "1" corresponding to the RESET state, a verify current I_RESET current is applied to the selected memory cell through a corresponding bit line, as illustrated in FIG. 4. Verify current I_RESET current is generated using a bias voltage VBIAS_RESET applied to a bias current supply circuit. Where the selected memory cell has a lower resistance than a resistance corresponding to bias voltage VBIAS_RESET for generating verify current I_RESET, the selected memory cell will be determined to be in the SET state. In this case, the program execution section of the method of FIG. 3 is repeated for the selected memory cell.

On the other hand, where the program data for the selected memory cell is a logical "0" corresponding to the SET state, a verify current I_SET is applied to the selected memory cell through the corresponding bit line, as illustrated in FIG. 4. Verify current I_SET is generated using a bias voltage VBIAS_SET applied to the bias current supply circuit. Where the selected memory cell has higher resistance than a resistance corresponding to bias voltage VBIAS_SET for generating verify current I_SET, the selected memory cell will be determined to be in the RESET state. In this case, the program execution section of the method of FIG. 3 is repeated for the selected memory cell.

By selectively repeating the program execution section on selected memory cells as described above, the RESET and SET state distributions for the selected memory cells are narrowed as illustrated in FIG. 4. As a result, a sending margin between the SET state distribution and the RESET state distribution is increased. In other words, it is possible to improve a read margin of the phase change memory device. In addition to improving the read margin for 1-bit data, the method of FIG. 3 could also be used to distinguish between multiple resistance distributions so that multi-bit data could be stored in phase change memory cells.

FIG. 5 is a block diagram illustrating a phase change memory device according to one embodiment of the inventive concept.

Referring to FIG. 5, a phase change memory device 200 comprises a memory cell array 210 wherein each memory cell stores N-bit data (N is an integer greater than 0). Although not shown in detail in FIG. 5, memory cell array 210 comprises a plurality of rows corresponding to word lines and columns corresponding to bit lines, and memory cells arranged in a matrix at intersections between the bit lines and word lines.

Figure 1:
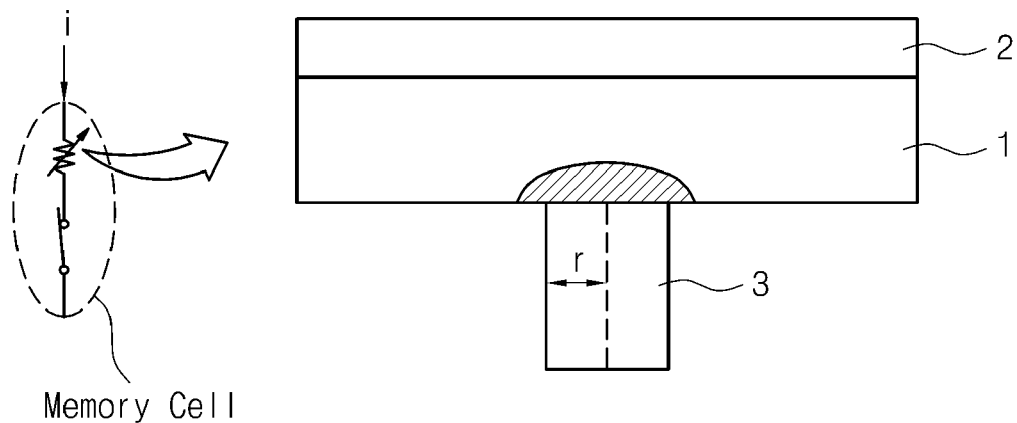
FIG. 1 is a schematic view illustrating a cell structure of a conventional phase change memory device.
Figure 2:
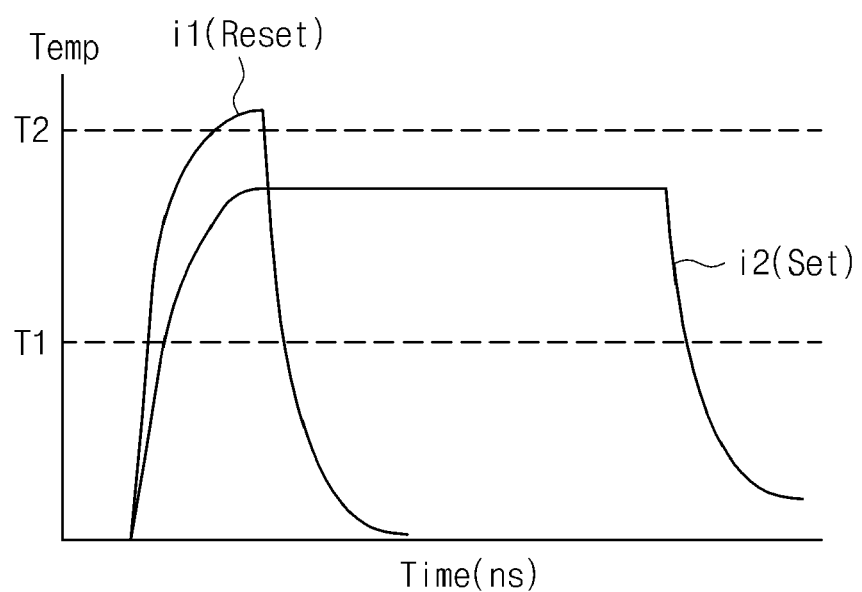
FIG. 2 is a graph illustrating a temperature profile of a phase change memory cell during program operations.

Each of the memory cells in memory cell array 210 typically comprises a switching device and a resistor such as that illustrated in FIG. 1. In general, the switching device may be embodied by various elements such as a metal-oxide semiconductor (MOS) transistor or a diode. In addition, each memory cell in memory cell array 210 is an over-writable memory cell. Examples of memory cells that could be used in memory cell array 210 are described in U.S. Pat. No. 6,928,022 entitled "write Drive Circuit in Phase Change Memory Device and Method for Applying Write Current", U.S. Pat. No. 6,967,865 entitled "Low-Current and High-Speed Phase-Change Memory Devices and Methods of Driving The Same", and U.S. Pat. No. 6,982,913 entitled "Data Read Circuit for Use in a Semiconductor Memory and a Memory Thereof". The respective disclosures of these patents are hereby incorporated by reference.

A row select circuit 220 selects at least one word line among the plurality of word lines in response to a row address RA, and a row select circuit 230 selects a subset of the plurality of bit lines in response to a column address CA. A control logic unit 240 is configured to control overall operations of phase change memory device 200 in response write/read commands from an external source. A high voltage generating circuit 250 is controlled by control logic unit 240, and is configured to generate a high voltage used by row and column select circuits 220 and 230 and a write driver circuit 290. For example, high voltage generating circuit 250 may comprise a charge pump. However, those skilled in the art will recognize that high voltage generating circuit 250 could be embodied by a variety of other elements besides a charge pump.

A first sense amplifier circuit 260, labeled RSA, is controlled by control logic unit 240, and senses cell data through bit lines selected by column select circuit 230 in a normal read operation. The sensed data is output via a data input/output buffer circuit 270. First sense amplifier circuit 260 is connected to a data bus RDL and applies sense current I_SENSE to data bus RDL in the normal read operation. A second sense amplifier circuit 280, labeled VSA, is also controlled by control logic unit 240 and senses cell data through the bit lines selected by column select circuit 230 using program data stored in data input/output buffer circuit 270 during the verify read operation. Second sense amplifier circuit 280 variably applies verify current I_SET or I_RESET to the selected bit lines according to program data temporarily stored in data input/output buffer circuit 270.

Cell data sensed by second sense amplifier circuit 280 is applied to control logic unit 240. Control logic unit 240 determines whether or not the cell data sensed by second sense amplifier circuit 280 is identical to the program data stored in data input/output circuit 270. Control logic unit 240 controls write driver circuit 290 according a result of this determination. For instance, where the program data is determined to be identical to the sensed data, control logic unit 240 does not generate set and reset pulse signals corresponding to program data. On the other hand, where the program data value is determined not to be identical to the sensed data, control logic unit 240 generates set and reset pulse signals corresponding to the program data, or in other words, a program loop is repeated.

With each repetition of the program loop, control logic unit 240 controls write drive circuit 290 such an amount of a write current I_SET_W or I_RESET_W applied to selected bit lines in the program loop increases or decreases gradually. A bias voltage generating circuit 300 is controlled by control logic unit 240, and is configured to generate bias voltages to be applied to first and second sense amplifier circuits 260 and 280 and write driver circuit 290, respectively.

Figure 6:
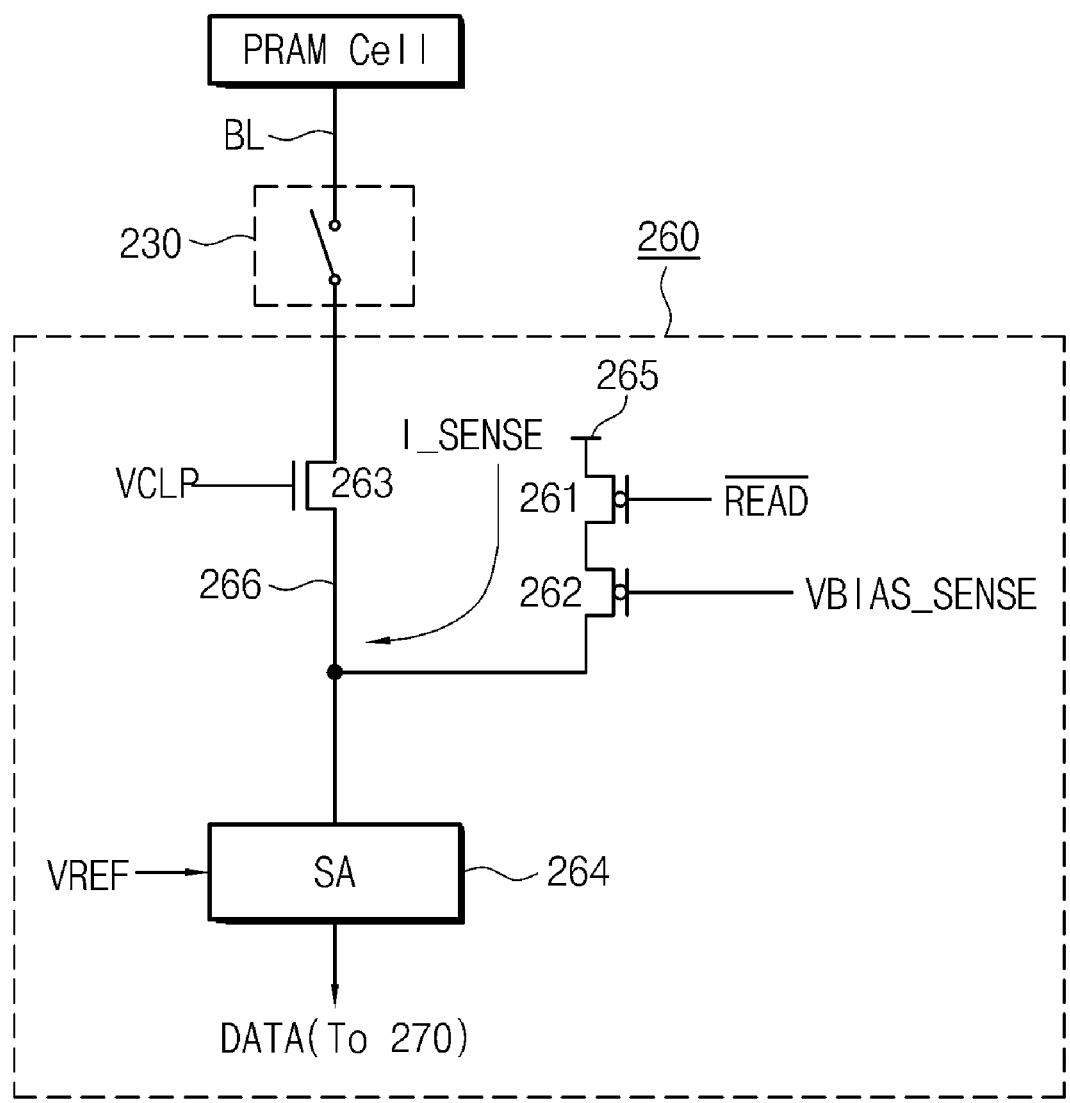
FIG. 6 is a circuit diagram illustrating an embodiment of a first sense amplifier circuit illustrated in FIG. 5.

FIG. 6 is a circuit diagram illustrating first sense amplifier circuit 260 shown in FIG. 5. First sense amplifier circuit 260 shown in FIG. 6 corresponds to a single bit line; however, phase change memory device 200 typically includes a similar first sense amplifier circuit for each bit line. For instance, where phase change memory device 200 comprises eight bit lines, eight first sense amplifier circuits corresponding to the eight bit lines are typically included.

Referring to FIG. 6, first sense amplifier circuit 260 comprises positive metal-oxide semiconductor (PMOS) transistors 261 and 262, a negative metal-oxide semiconductor (NMOS) transistor 263, and a sense amplifier 264. PMOS transistors 261 and 262 are connected in series between a power terminal 265 and a signal line 266, wherein a voltage corresponding to a power voltage or higher may be applied to power terminal 265. PMOS transistor 261 turns on/off in response to a control signal /READ indicating a normal read operation, and PMOS transistor 262 turns on/off in response to a bias voltage VBIAS_SENSE. Control signal /READ is supplied from control logic unit 240 of FIG. 5, and bias voltage VBIAS_SENSE is supplied from bias voltage generating circuit 300 of FIG. 5. NMOS transistor 263 is connected between signal line 266 and column select circuit 230, and is controlled by a clamp voltage VCLP to restrict a bit line voltage. Clamp voltage VCLP is used for maintaining the bit line voltage below a threshold voltage at which the RESET state of the phase change layer is changed. Sense amplifier 264, labeled SA, senses whether the bit line voltage is above or below a reference voltage VREF through column select circuit 230, and outputs a sensed result to data input/output buffer circuit 270 as the cell data.

PMOS transistors 261 and 262 constitute a sense current supplying part supplying current, i.e., sense current I_SENSE, to signal line 266 and bit line BL, in the normal read operation, wherein the magnitude of sense current I_SENSE is determined by bias voltage VBIAS_SENSE. Sense current I_SENSE is typically generated when bias voltage VBIAS_SENSE between bias voltages VBIAS_SET and VBIAS_RESET is applied to sense current supplying part 261 and 262. Sense current I_SENSE is applied to a selected memory cell through the bit line in the normal read operation.

Figure 7A:
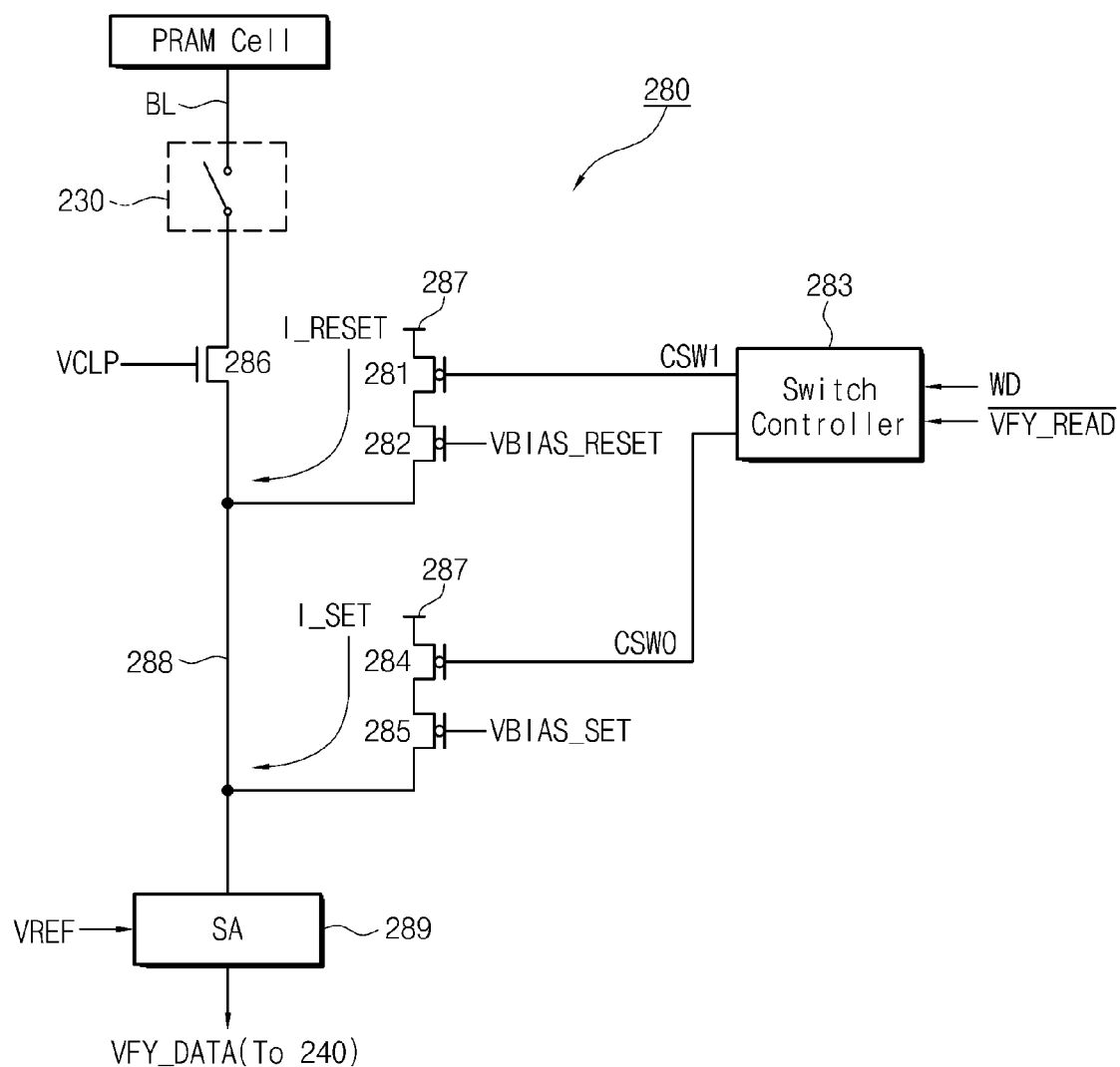
FIGS. 7A and 7B are circuit diagrams illustrating embodiments of a second sense amplifier circuit illustrated in FIG. 5.
Figure 7B:
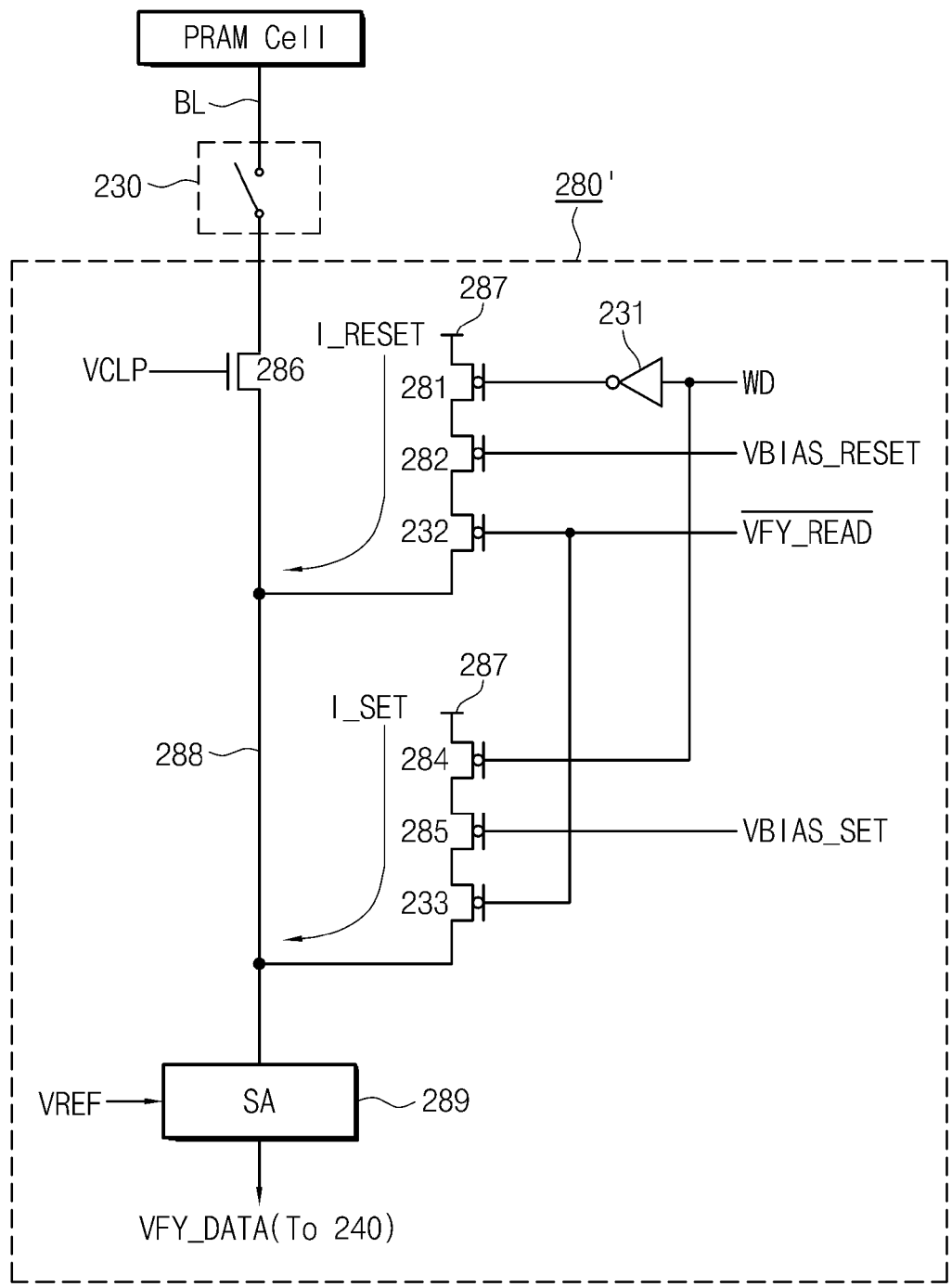

FIGS. 7A and 7B are circuit diagrams illustrating second sense amplifier circuit 280 of FIG. 5. Second sense amplifier circuit 280 in FIGS. 7A and 7B corresponds to a single bit line; however, phase change memory device 200 typically includes a similar second sense amplifier circuit for each bit line.

Referring to FIG. 7A, second sense amplifier circuit 280 comprises PMOS transistors 281, 282, 284 and 285, a switch controller 283, and a sense amplifier 289.

Switch controller 283 receives a control signal /VFY_READ indicating a verify read operation and the program data and generates switch control signals CSW0 and CSW1 in response to control signal /VFY_READ and the program data. Control signal /VFY_READ is supplied from control logic unit 240, and program data WD is supplied from data input/output buffer circuit 270. Where control signal /VFY_READ is deactivated, switch control signals CSW0 and CSW1 are deactivated to logic level "high" regardless of program data WD. Where control signal /VFY_READ is activated, i.e., in the verify read operation, one of switch control signals CSW0 and CSW1 is activated to logic level "low" according to program data WD. For example, switch control signal CSW1 is activated to logic level "low" where program data WD is a logical "1", and switch control signal CSW0 is activated to logic level "low" where program data WD is a logical "0".

Referring to FIG. 7A, PMOS transistors 281 and 282 are connected in series between a power terminal 287 and a signal line 288. A voltage corresponding to the power voltage or higher may be applied to power terminal 287. PMOS transistor 281 turns on/off in response to switch control signal CSW1 of switch controller 283, and PMOS transistor 282 turns on/off in response to bias voltage VBIAS_RESET. Bias voltage VBIAS_RESET is supplied from bias voltage generating circuit 300 of FIG. 5, which is greater than bias voltage VBIAS_SENSE supplied from first sense amplifier circuit 260. PMOS transistor 284 turns on/off in response to switch control signal CSW0 supplied from switch controller 283, and PMOS transistor 285 turns on/off in response to bias voltage VBIAS_SET. Bias voltage VBIAS_SET is supplied from bias voltage generating circuit 300 of FIG. 5, which is lower than bias voltage VBIAS_SENSE supplied from first sense amplifier circuit 260. NMOS transistor 286 is connected between signal line 288 and column select circuit 230, and is controlled by clamp voltage VCLP to restrict the bit line voltage. Clamp voltage VCLP may be commonly applied, or separately applied to first and second sense amplifier circuits 260 and 280. Sense amplifier circuit 289, labeled SA, senses whether the bit line voltage is lower or higher than reference voltage VREF through column select circuit 230, and outputs a resulting sensed result to control logic unit 240 of FIG. 5 as verify data VFY_DATA.

PMOS transistors 281 and 282 constitute a first verify current supplying part supplying verify current I_RESET to signal line 288 (i.e., bit line BL) in the verify read operation, wherein the magnitude of verify current I_RESET is determined by bias voltage VBIAS_RESET. Verify current I_RESET, as illustrated in FIG. 4, may be generated when bias voltage VBIAS_RESET greater than bias voltages VBIAS_SENSE is applied to PMOS transistor 282. Verify current I_RESET is supplied to the selected memory cell through the bit line in the verify read operation.

Similarly, PMOS transistors 284 and 285 constitute a second verify current supplying part supplying verify current I_SET to signal line 288 (i.e., bit line BL) in the verify read operation, wherein the magnitude of verify current I_SET is determined by bias voltage VBIAS_SET. Verify current I_SET, as illustrated in FIG. 4, may be generated when bias voltage VBIAS_SET lower than bias voltage VBIAS_SENSE is applied to the PMOS transistor 285. The verify current I_SET is supplied to the memory cell through the bit line in the verify read operation.

As described in relation to FIG. 4, the magnitude of verify current I_RESET supplied by first verify current supplying part 281 and 282 is smaller than the magnitude of verify current I_SET supplied by second verify current supplying part 284 and 285. In the verify read operation, only one of verify currents I_RESET and I_SET is supplied to the selected memory cell according to program data WD. For example, where the program data is a logical "1" in the verify read operation, switch control signal CSW1 is activated to logic level "low" and switch control signal CSW0 is deactivated to logic level "high". First verify current supplying part 281 and 282 generates verify current I_RESET with a magnitude determined by bias voltage VBIAS_RESET. Since PMOS transistor 284 turns off in response to switch control signals CSW0, verify current I_SET is not generated. On the other hand, where program data is a logical "0", switch control signal CSW0 is activated to logic level "low" and switch control signal CSW1 is deactivated to logic level "high". Second verify current supplying part 284 and 285 generates verify current I_SET with a magnitude determined by bias voltage VBIAS_SET. PMOS transistor 281 is turned off by switch control signal CSW1 so that verify current I_RESET is not generated.

Assuming that PMOS transistors 282 and 285 have the same size, the magnitude of the verify current is controlled by bias voltages VBIAS_RESET and VBIAS_SET. Alternatively, the magnitude of the verify current may be controlled by adjusting the sizes of PMOS transistors 282 and 285 assuming that bias voltages VBIAS_RESET and VBIAS_SET have the same voltage level.

Referring to FIG. 7B, second sense amplifier circuit 280' may be configured such that the verify current is applied to bit line BL according to program data WD only during the verify read operation. Sense amplifier circuit 280' of FIG. 7B operates only when control signal /VFY_READ is activated to logic level "low". Sense amplifier circuit 280' does not operate when control signal /VFY_READ is deactivated to logic level "high".

Figure 8:
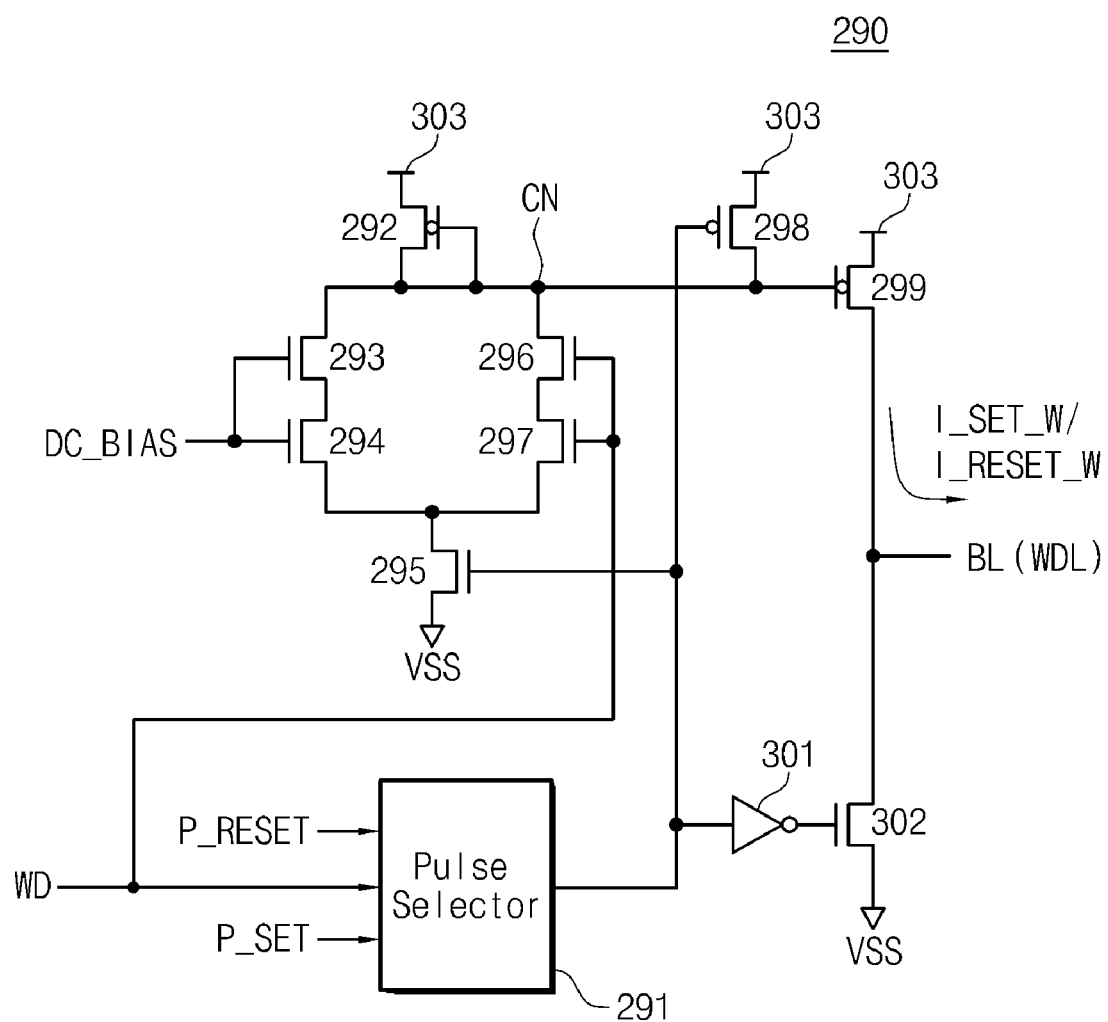
FIG. 8 is a circuit diagram illustrating an embodiment of a write driver circuit illustrated in FIG. 5.

FIG. 8 is a circuit diagram illustrating write driver circuit 290 of FIG. 5. Write driver circuit 290 illustrated in FIG. 8 corresponds to a single bit line; however, phase change memory device 200 typically comprises a write driver circuit for each bit line.

Referring to FIG. 8, write driver circuit 290 comprises a pulse selector 291, PMOS transistors 292, 298 and 299, an inverter 301, and NMOS transistors 293, 294, 295, 296, 297 and 302. Pulse selector 291 selects one signal between a set pulse signal P_SET and a reset pulse signal P_RESET according to program data WD. Where program data WD is a logical "1", pulse selector 291 selects reset pulse signal P_RESET. On the other hand, where program data WD is a logical "0", pulse selector 291 selects set pulse signal P_SET. PMOS transistor 292 is connected between a power terminal 303 and a control node CN, and is controlled by a voltage level of control node CN. A power voltage or higher is typically applied to power terminal 303.

Pulse signals P_SET and P_RESET are supplied from control logic unit 240 of FIG. 5, and the pulse width of set pulse signal P_SET may be greater than that of set pulse signal P_RESET. NMOS transistors 293, 294 and 295 are connected in series between control node CN and ground VSS. A bias voltage DC_BIAS is commonly applied to the respective gates NMOS transistors 293 and 294, and the pulse signal selected by pulse selector 291 is applied to the gate of NMOS transistor 295. Bias voltage DC_BIAS is supplied from bias voltage generating circuit 300. Bias voltage DC_BIAS increases gradually with successive program loops such that the magnitude of current applied to bit line BL gradually increases with each program loop.

NMOS transistors 296 and 297 are connected in series between control node CN and drain of NMOS transistor 295, and are commonly controlled by program data WD. PMOS transistor 298 is connected between power terminal 303 and control node CN, and is controlled by the pulse signal selected by pulse selector 291. PMOS transistor 299, which is connected between power terminal 303 and a data line (or bit line), acts as a pull-up driver supplying current to the data line in response to the voltage level of control node CN. NMOS transistor 302 is connected between the data line (or bit line) and ground VSS. The pulse signal selected by pulse selector 291 is inverted by inverter 301, and the inverted pulse signal is applied to the gate of NMOS transistor 302. Here, NMOS transistor 302 acts as a pull-down driver discharging the data line in response to the output of inverter 301.

In the embodiment illustrated in FIG. 8, PMOS transistors 292 and 299 constitute a current mirror. NMOS transistors 293 and 294 constitute a current source controlled by bias voltage DC_BIAS, and NMOS transistors 296 and 297 constitute a current source controlled by the voltage level of the pulse signal selected by pulse selector 291. The magnitude of write current I_SET_W is relatively small when generated using one current source 293 and 294 as opposed to when generated using two current sources 293/294 and 296/297. By controlling the level of bias voltage DC_BIAS, it is possible to control the amount of write current supplied through PMOS transistor 299. Herein, PMOS and NMOS transistors 292-298 constitute a control voltage generator for generating the control voltage to control node CN in response to the pulse signal selected by pulse selector 291, program data WD, and bias voltage DC_BIAS.

Control logic unit 240 typically generates set and reset pulse signals P_SET and P_RESET in the program operation. In response to set and reset pulses P_SET and P_RESET, bias voltage DC_BIAS is applied to the gates of NMOS transistors 293 and 294. Under these conditions, where program data WD is a logical "1" to place the selected memory cell in the RESET state, pulse selector 291 selects reset pulse signal P_RESET. Accordingly, PMOS and NMOS transistors 298 and 302 are turned off and NMOS transistor 295 is turned on. At the same time, NMOS transistors 296 and 297 are turned on by program data WD.

PMOS transistor 299, acting as the pull-up driver, supplies write current I_RESET_W to the bit line (or the data line) in response to the voltage level of control node CN. On the other hand, where program data WD is a logical "0" to place the selected memory cell in the SET state, pulse selector 291 selects set pulse signal P_SET. Accordingly, PMOS and NMOS transistors 298 and 302 are turned off and NMOS transistor 295 is turned on. At the same time, NMOS transistors 296 and 297 are turned off in response to program data WD. PMOS transistor 299 as the pull-up driver supplies the write current I_SET_W to the bit line (or the data line) in response to the voltage level of control node CN.

The voltage level of control node CN generated when NMOS transistors 293, 294, 296 and 297 are turned on (hereinafter, referred to as the first control voltage) is lower than the voltage level of control node CN generated when NMOS transistors 293 and 294 are turned on (hereinafter, referred to as the second control voltage). As a result, the magnitude of current I_RESET_W where the first control voltage is applied to the gate of PMOS transistor 299 is greater than the magnitude of current I_SET_W where the first control voltage is applied to the gate of PMOS transistor 299.

The magnitude of current I_RESET_W where the first control voltage is applied to the gate of PMOS transistor 299 is typically designed to change the phase change layer of the selected memory cell into the amorphous state. Similarly, the magnitude of current I_SET_W where the first control voltage is applied to the gate of PMOS transistor 299 is typically designed to change the phase change layer of the selected memory cell into the crystalline state.

Figure 9:
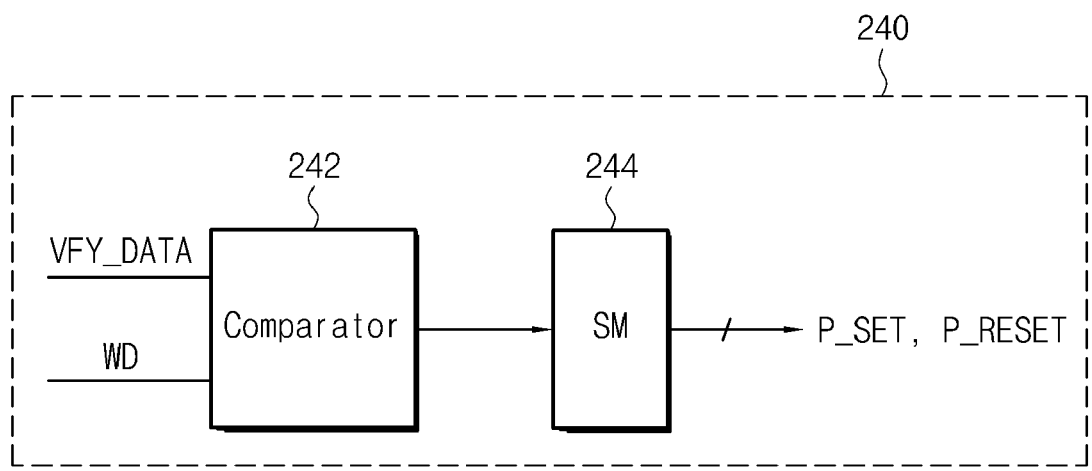
FIG. 9 is a block diagram illustrating a portion an embodiment of a control logic unit illustrated in FIG. 5.

FIG. 9 is a block diagram illustrating a portion of the control logic illustrated in FIG. 5.

Referring to FIG. 9, control logic unit 240 comprises a comparator 242 and a state machine 244 (labeled SM in FIG. 9). During the verify read operation, comparator 242 determines whether or not verify data VFY_DATA stored in second sense amplifier circuit 280 is identical to program data WD stored in data input/output buffer circuit 270 and generates a comparison result based on the comparison. During the program operation, state machine 244 controls the generation of pulse signals P_SET and P_RESET to be supplied to write driver circuit 280 in response to the comparison result of comparator 242. For example, where verify data VFY_DATA of second sense amplifier circuit 280 is identical to program data WD of data input/output buffer circuit 270, state machine 244 does not generate pulse signals P_SET and P_RESET. As a result, PMOS and NMOS transistors 298 and 302 are turned on and NMOS transistor 295 of FIG. 8 is turned off. Accordingly, the current is not applied to the bit line (or the data line) and the program operation is not performed.

On the other hand, where verify data VFY_DATA stored in second sense amplifier circuit 280 is not identical to program data WD stored in data input/output buffer circuit 270, state machine 244 generates pulse signals P_SET and P_RESET. As a result, current I_SET_W or I_RESET_W is supplied to the bit line (or the data line) by the same method as described above in relation to FIG. 8.

Figure 10:
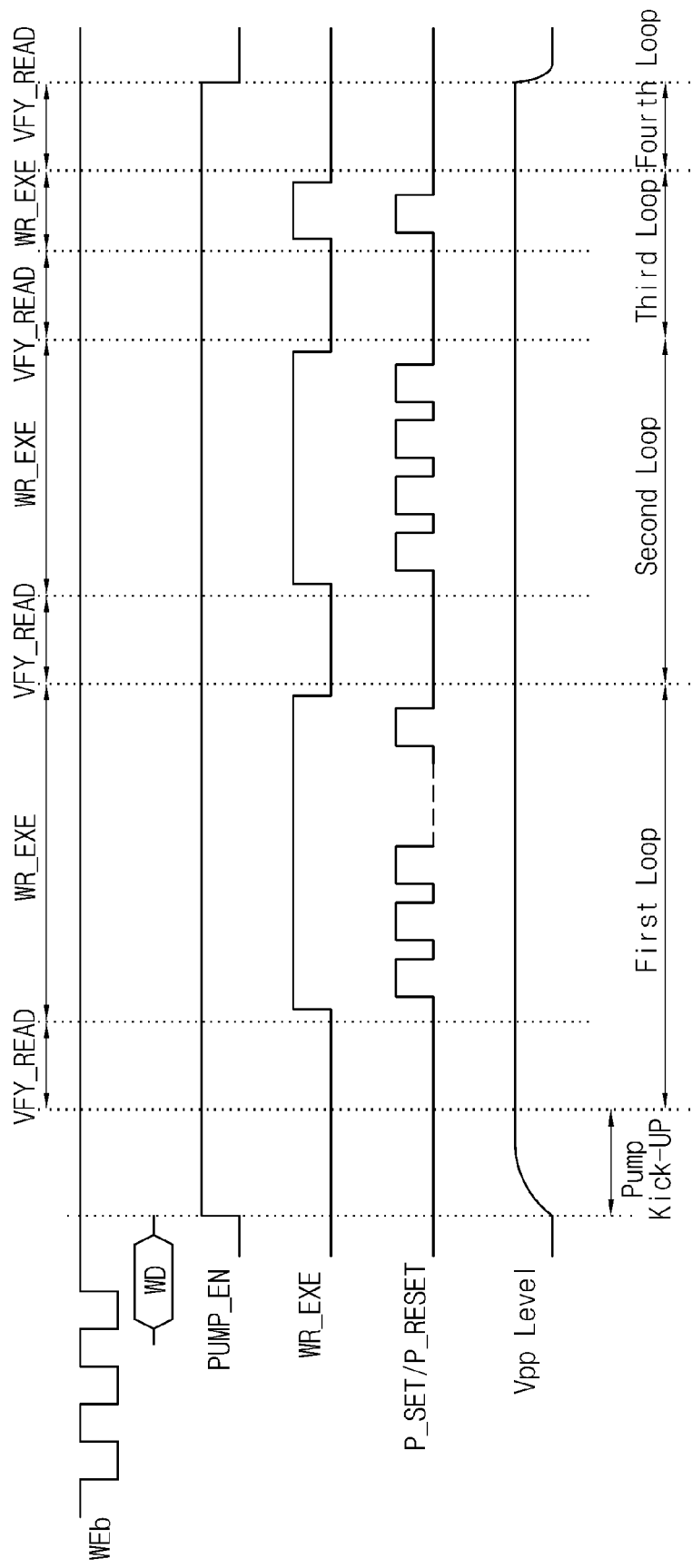
FIG. 10 is a timing diagram illustrating a program operation of the phase change memory device of FIG. 5 according to one embodiment of the inventive concept.

FIG. 10 is a timing diagram illustrating a program operation of phase change memory device 200 according to an embodiment of the inventive concept. In general, the program operation is performed by repeating a plurality of program loops, wherein each of the program loops comprises a verify read operation (or section) and a program execution operation (or section). In the example of FIG. 10, it will be assumed that 16 bits of program data are programmed to phase change memory device during the program operation.

The 16 bits can be programmed simultaneously, sequentially, or in units of N-bits (N is an integer and N>1); however, for convenience of illustration, it will be assumed that the program data is programmed sequentially, one bit at a time. In this case, control logic unit 240 successively generates set and reset pulse signals P_SET and P_RESET corresponding to respective program data bits in each program loop. For example, in each program loop, phase change memory device 200 first generates set and reset pulse signals P_SET and P_RESET corresponding to a first program data bit, followed by set and reset pulse signals P_SET and P_RESET corresponding to a second program data bit, and so on.

In order to perform the program operation, row and column addresses RA and CA are typically applied to phase change memory device 200 from an external source such as a host or a memory controller. Row address RA is transferred to row select circuit 220, and column address CA is transferred to column select circuit 230. Thereafter, program data WD is supplied to data input/output buffer circuit 270. Once program data WD is input, control logic unit 240 activates a pump enable signal PUMP_EN to logic level "high", and high-voltage generating circuit 250 starts generating a high voltage in response to the activation of pump enable signal PUMP_EN. Thereafter, the verify read operation of the first program loop is performed during a read verify section labeled VFY_READ. The verify read operation is performed by second sense amplifier circuit 280. During the verify read operation, first sense amplifier circuit 260 is deactivated by control logic unit 240. That is, control signal /READ applied to first sense amplifier circuit 260 is maintained at logic level "high".

In the verify read operation, bias voltages VBIAS_RESET and VBIAS_SET are respectively applied to PMOS transistors 282 and 285 of second sense amplifier circuit 280 from bias voltage generating circuit 300 under the control of control logic unit 240. Where program data WD of data input/output buffer circuit 270 is a logical "1" to place the selected memory cell in the RESET state, switch controller 283 activates switch control signal CSW1 to logic level "low" and deactivates switch control signal CSW0 to logic level "high". As a result, PMOS transistor 281 of second sense amplifier circuit 280 turns on in response to switch control signal CSW1 and PMOS transistor 284 of second sense amplifier circuit 280 turns off in response to switch control signal CSW0. Accordingly, verify current I_RESET is applied to signal line 288, i.e., bit line BL, through PMOS transistors 281 and 282. Under such conditions, cell data may be sensed through sense amplifier 289.

Where the magnitude of current flowing through the selected memory cell is smaller than the magnitude of verify current I_RESET, the bit line voltage is higher than the reference voltage. At this time, sense amplifier 289 senses the bit line voltage, and outputs the sensed result to control logic unit 240 as verify data VFY_DATA. Where verify data VFY_DATA indicates that the magnitude of current flowing through the selected memory cell is smaller than the magnitude of verify current I_RESET, it is determined that the selected memory cell is in the RESET state as desired.

On the other hand, where the magnitude of current flowing through the selected memory cell is larger than the magnitude of verify current I_RESET, the bit line voltage is lower than the reference voltage. Here, sense amplifier 289 senses the bit line voltage and outputs the sensed result to control logic unit 240 as the verify data VFY_DATA. Where the verify data VFY_DATA indicates that the magnitude of cell current flowing through the selected memory cell is greater than the magnitude of verify current I_RESET, it is determined that the selected memory cell is not in the RESET state as desired.

Where it is determined that the selected memory cell is in the RESET state, the program operation no longer applies a program current to the selected memory cell in further program loops. Otherwise, the program operation will apply the program current to the selected memory cell in further program loops under the control of control logic unit 240.

Where the program data stored in data input/output buffer circuit 270 is a logical "0" to program the selected memory cell into the SET state, switch controller 283 activates switch control signal CSW0 to logic level "low" and deactivates switch control signal CSW1 to logic level "high". PMOS transistor 284 of second sense amplifier circuit 280 turns on in response to switch control signal CSW0 and PMOS transistor 281 of second sense amplifier circuit 280 turns off in response to switch control signal CSW1. Accordingly, verify current I_SET is applied to signal line 288 through PMOS transistors 284 and 285. Under these conditions, cell data is sensed through sense amplifier 289, as described in further detail below.

Where the magnitude of cell current flowing through the selected memory cell is greater than the magnitude of verify current I_SET, the bit line voltage becomes lower than the reference voltage. Accordingly, sense amplifier 289 senses the bit line voltage and outputs the sensed result to control logic unit 240 as verify data VFY_DATA. Where verify data VFY_DATA indicates that the magnitude of current flowing through the selected memory cell is greater than the magnitude of verify current I_SET, it is determined that the selected memory cell is in the SET state as desired.

On the other hand, where the magnitude of current flowing through the selected memory cell is smaller than the magnitude of verify current I_SET, the bit line voltage becomes higher than the reference voltage. Here, sense amplifier 289 senses the bit line voltage and outputs the sensed result to control logic unit 240 as verify data VFY_DATA. Where verify data VFY_DATA indicates that the magnitude of current flowing through the selected memory cell is smaller than the magnitude of verify current I_SET, it is determined that the selected memory cell is not in the SET as desired.

In summary, where it is determined that the selected memory cell is in the SET state as desired, the program operation no longer applies a program current to the selected memory cell in further program loops. Otherwise, the program operation applies the program current to the selected memory cell in further program loops under the control of control logic unit 240.

Once the verify read operation of the first program loop is completed, verify data VFY_DATA sensed by second sense amplifier circuit 280 is output to control logic unit 240, as described above. Control logic unit 240 determines whether or not program data WD stored in buffer circuit 270 is identical to verify data VFY_DATA. Where program data WD is identical to verify data VFY_DATA, control logic unit 240 does not generate pulse signals P_SET and P_RESET corresponding to program data WD. As a result, the write current is not applied to the selected memory cell in further program loops. Where program data WD is not identical to the verify data VFY_DATA, control logic unit 240 generates pulse signals P_SET and P_RESET based on program data WD. Accordingly, write current I_SET_W and I_RESET_W is supplied to the bit line from write driver circuit 290.

Figure 11:
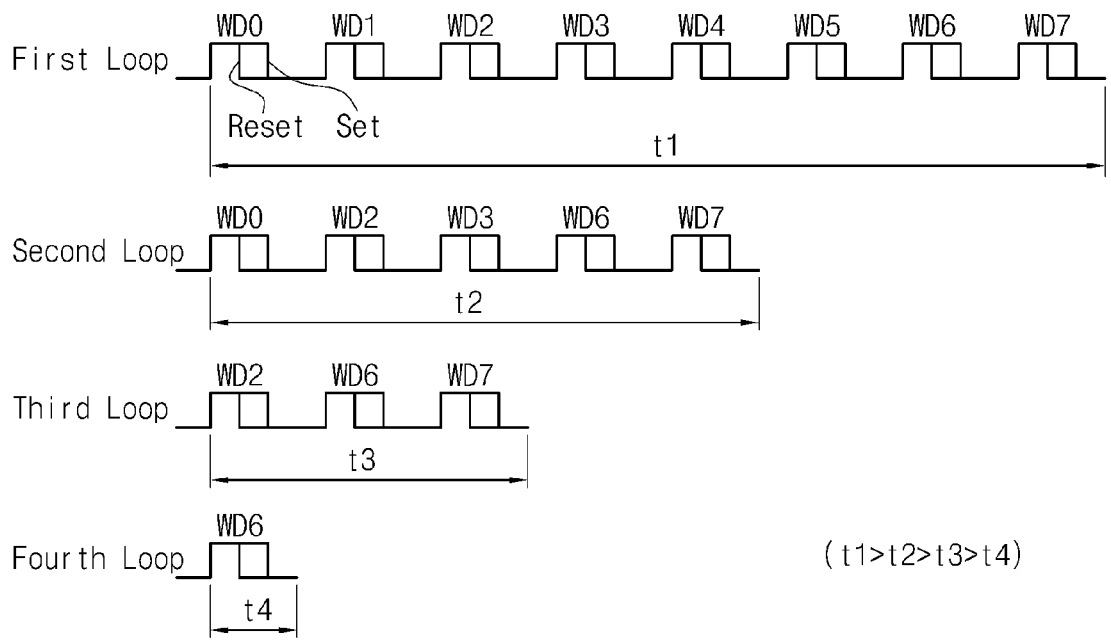
FIG. 11 is a schematic view illustrating pulse signals generated in successive program loops of the program operation illustrated in FIG. 10.

Since the program operation programs 16 bits of program data to phase change memory device 200, at most 16 set and reset pulse signals will be generated during the write execution section. Where some of the 16 bits of program data are identical to corresponding verify data bits, set or reset pulses will not be generated for these bits. On the other hand, pulse signals corresponding to respective program data bits which are not identical to corresponding verify data bits, as illustrated in FIG. 11, will be generated sequentially. As a result, the duration of successive program loops will tend to decrease.

Once the first program loop completes, a second program loop is performed similar to the first program loop. In verify read sections of program loops, selected memory cells not programmed into desired states are detected. Then, in program sections of the program loops, respective program currents are supplied selected memory cells detected not to be in desired states.

Using the above described techniques, the selected memory cells can be programmed to within desired resistance distributions such as those illustrated by dotted lines in FIG. 4, achieving desired read margins for the selected memory cells.

Figure 12:
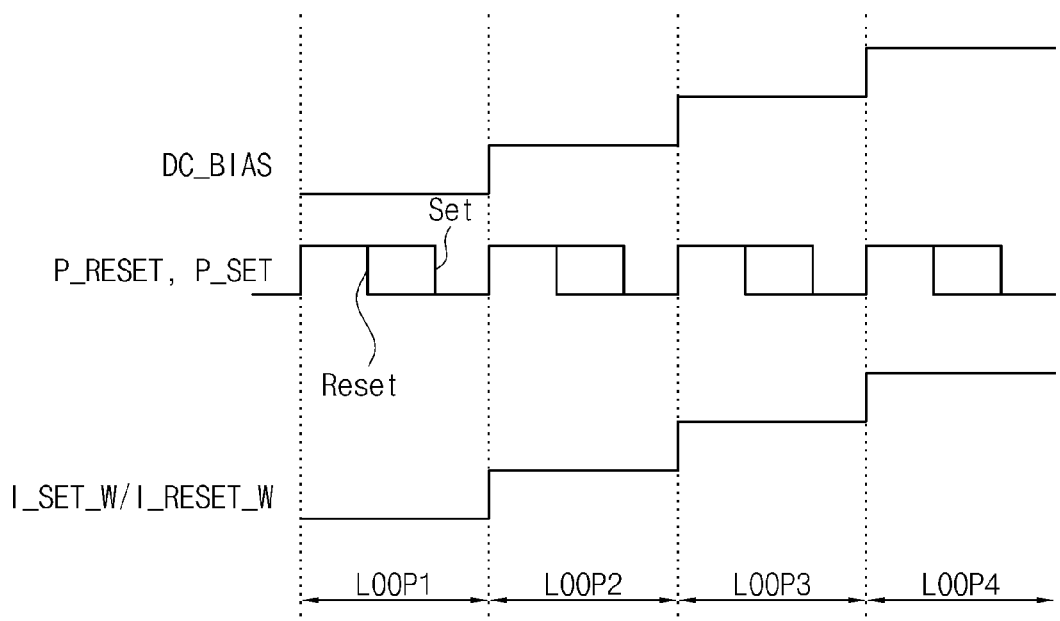
FIG. 12 is a schematic view illustrating a change of a program current in successive program loops of the program operation illustrated in FIG. 10.

In the method described above in relation to FIG. 10, the magnitude of current supplied from write driver circuit 290 is adjusted with successive program loops. This may be achieved by gradually increasing bias voltage DC_BIAS applied to write driver circuit 290 with an increasing program loop count, as illustrated in FIG. 12. As bias voltage DC_BIAS gradually increases, the magnitude of write current I_SET_W/I_RESET_W also increases gradually with successive program loops. Where the magnitude of the write current is relatively small, SET/RESET states of phase change memory cells having lower electrodes with relatively small radii are more quickly changed in comparison with phase change memory cells having lower electrodes with relatively larger radii.

Since memory cells having changed SET/RESET states are prevented from being further programmed after reaching desired states, programming of memory cells having lower electrodes with relatively smaller radii tend to be completed more quickly than programming of memory cell having the lower electrode with the relatively larger radii.

Rather than programming memory cells using sequentially applied pulses, as described above, selected memory cells could be programmed simultaneously. For example, control logic unit 240 could simultaneously generate set and reset pulse signals P_SET and P_RESET corresponding to multiple program data bits. However, in this case, only set and reset pulse signals P_SET and P_RESET corresponding to selected memory cells that have not yet reached desired states will be generated. As described above, set and reset pulse signals P_SET and P_RESET corresponding to the respective program data bits which are identical to the verify data bits are not generated.

Figure 13:
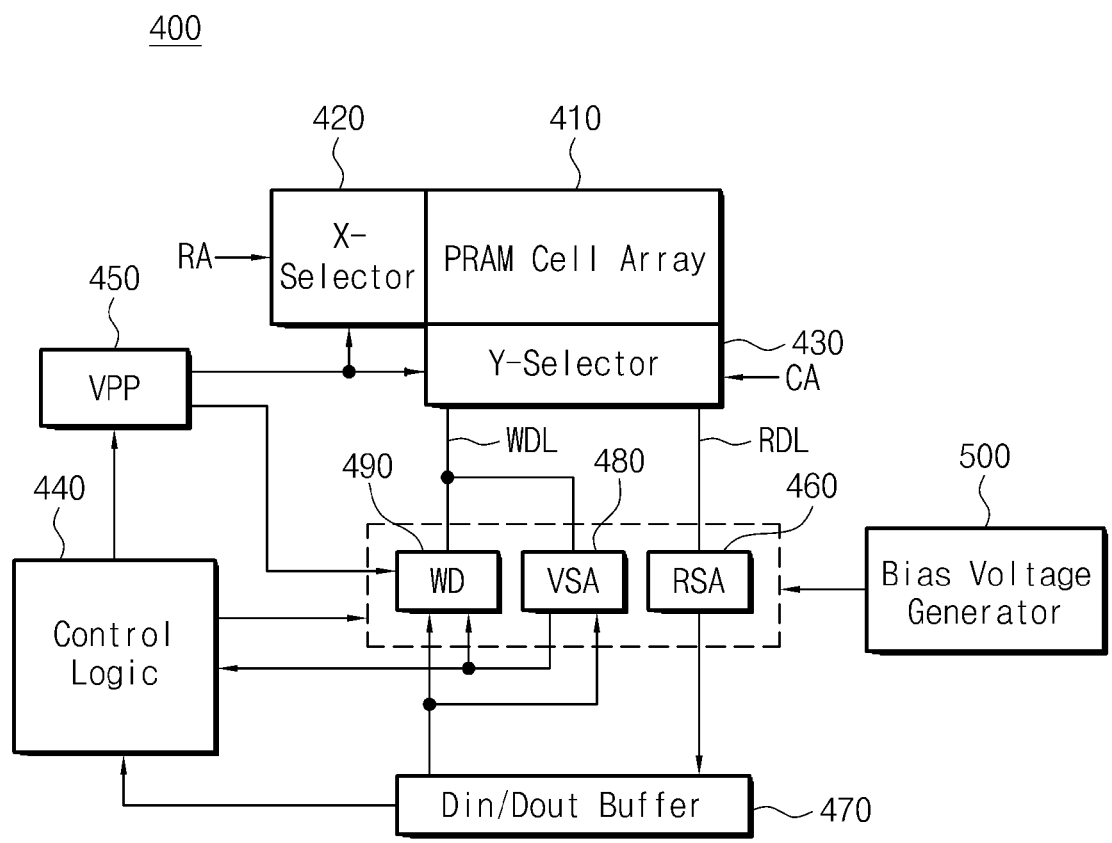
FIG. 13 is a block diagram illustrating a phase change memory device according to another embodiment of the inventive concept.

FIG. 13 is a block diagram illustrating a phase change memory device according to another embodiment of the inventive concept. In a phase change memory device 400 of FIG. 13, a memory cell array 410, a row select circuit 420, a column select circuit 430, a high voltage generating circuit 450, first and second sense amplifier circuits 460 and 480, a data input/output buffer circuit 470, and a bias voltage generating circuit 500 operate in a similar manner as corresponding elements in phase change memory device 200 illustrated in FIG. 5. Accordingly, further descriptions of these elements will be omitted to avoid redundancy.

In the verify read operation, a control logic unit 440 compares verify data output from second sense amplifier circuit 480 with program data stored in data input/output buffer circuit 470. Control logic unit 440 selectively generates pulse signals according to a result of the comparison. For example, where the verify data is identical to the program data, the pulse signals corresponding to the data are not generated, and where the verify data is not identical to the program data, pulse signals corresponding to the data are generated. The pulse signals corresponding to the respective program data which are not identical to the corresponding verify data bits may be generated in the same manner as illustrated in FIG. 11. Accordingly, the program loop duration will tend to decrease with successive program loops. As successive program loops are performed, control logic unit 240 controls bias voltage generating circuit 500 such that bias voltage DC_BIAS applied to second sense amplifier circuit 280 gradually increases.

Write driver circuit 490 supplies the write current to a data line WDL in response to the pulse signals supplied from control logic unit 240, verify data provided by second sense amplifier circuit 280, and program data generated by data input/output buffer circuit 470.

Figure 14:
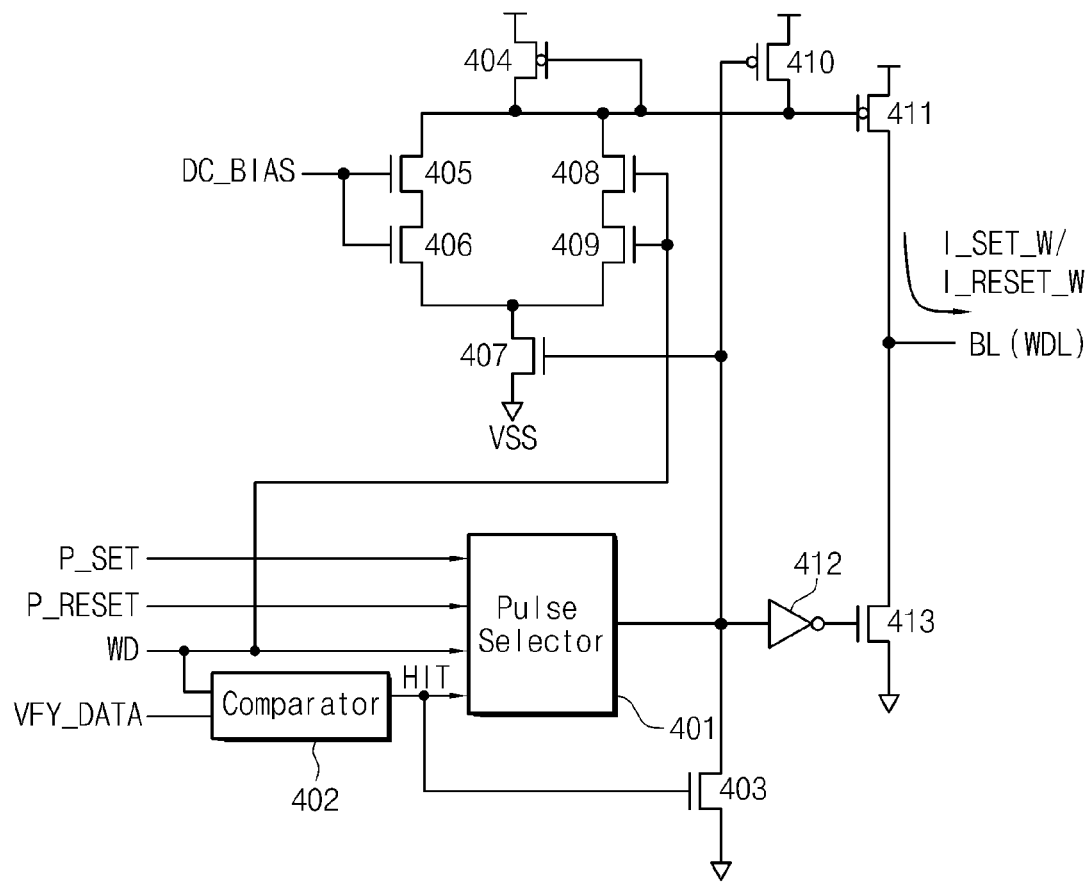
FIG. 14 is a block diagram illustrating an embodiment of a write driver in the phase change memory device of FIG. 13.

Referring to FIG. 14, write driver circuit 490 is similar to write driver circuit 290, but further comprises a comparator 402 and an NMOS transistor 403. Comparator 402 detects whether or not verify data VFY_DATA is identical to program data WD. Where verify data VFY_DATA is identical to program data WD, comparator 402 activates a hit signal HIT to logic level "high". On the other hand, where verify data VFY_DATA is not identical to program data WD, comparator 402 deactivates hit signal HIT to logic level "low".

Where hit signal HIT is activated to logic level "high", pulse selector 401 does not output any of pulse signals P_SET and P_RESET regardless of program data WD. Instead, NMOS transistor 413 is turned on, and PMOS transistor 410 is turned off. As a result, the bit line (or data line) is grounded through NMOS transistor 412 and the write current is not supplied to the bit line. Where hit signal HIT is deactivated to logic level "low", pulse selector 401 selects one of pulse signals P_SET and P_RESET according to program data WD. Where the pulse signal is selected by pulse selector 401, write driver circuit 490 operates in a manner substantially identical write driver circuit 290 of FIG. 8. Accordingly, the operation of write driver circuit 490 where pulse selector 401 selects the pulse signal will be omitted to avoid redundancy.

With the exception of control logic unit 440 and write driver circuit 490, phase memory device 400 of FIG. 13 operates in substantially the same manner as phase change memory device 200. Accordingly, a further description of phase change memory device 400 will be omitted to avoid redundancy.

Figure 15:
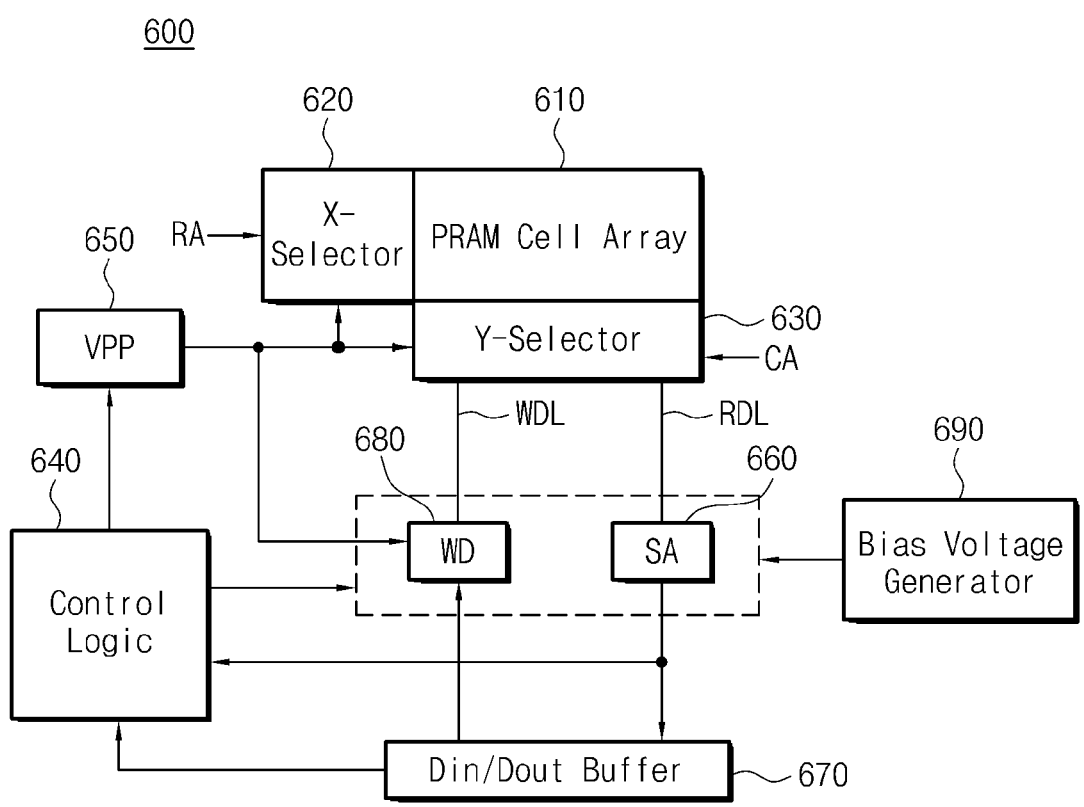
FIG. 15 is a block diagram illustrating a phase change memory device according to yet another embodiment of the inventive concept.
Figure 16:
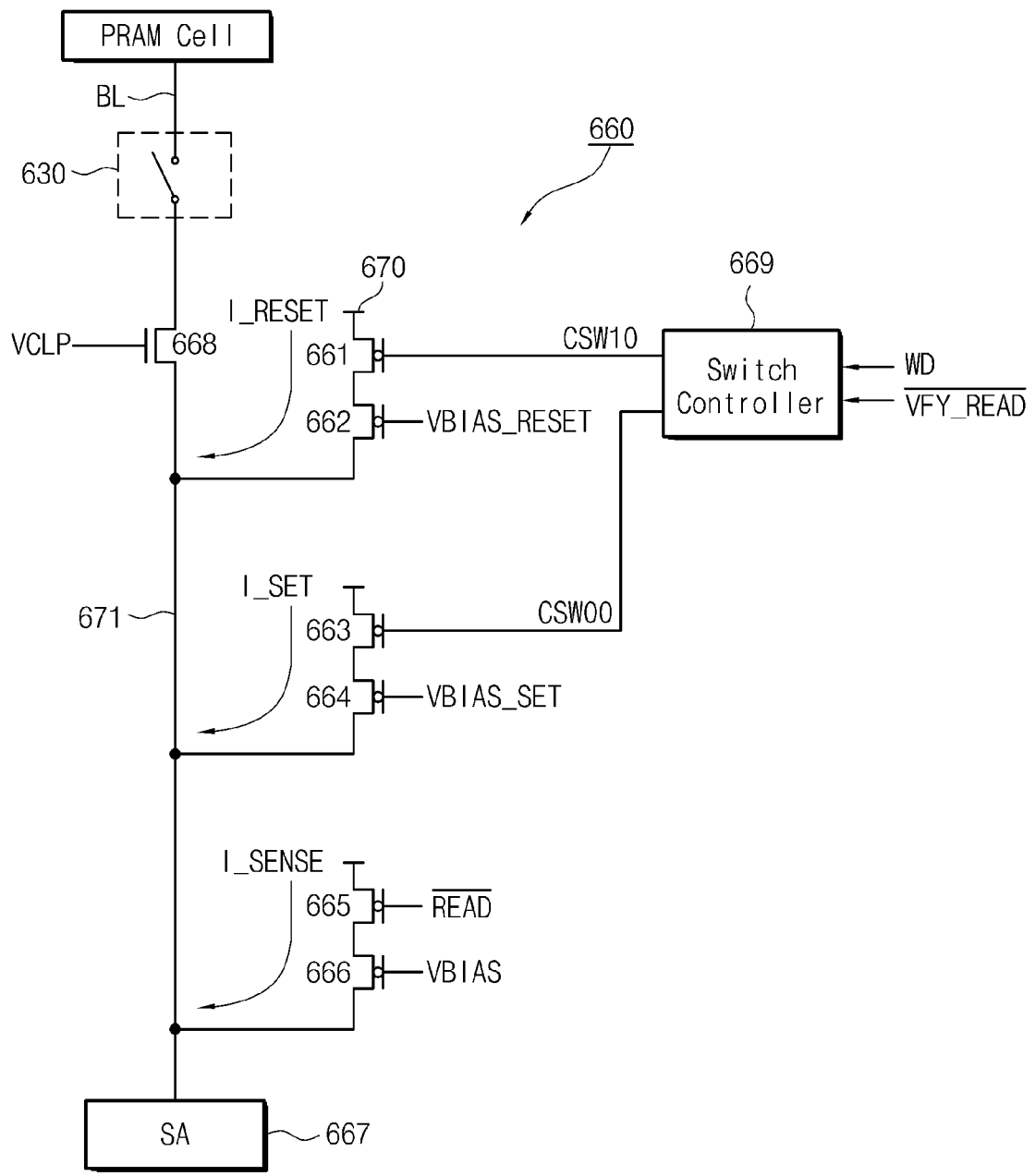
FIG. 16 is a circuit diagram illustrating an embodiment of a sense amplifier circuit in the phase change memory device of FIG. 15.

FIG. 15 is a block diagram illustrating a phase change memory device according to yet another embodiment of the inventive concept, and FIG. 16 is a circuit diagram illustrating a sense amplifier of FIG. 15. In a phase change memory device 600 of FIG. 15, a memory cell array 610, a row select circuit 620, a column select circuit 630, a control logic 640, a high voltage generating circuit 650, a data input/output buffer circuit 670, a write driver circuit 680, and a bias voltage generating circuit 690 operate in substantially the same manner as corresponding elements in phase change memory device 200 illustrated in FIG. 5. Accordingly, further descriptions of these elements will be omitted to avoid redundancy.

Unlike phase change memory device 200, sense amplifier circuit 660 of FIG. 15 performs sensing operations in verify read operations and normal read operations. As illustrated in FIG. 16, sense amplifier circuit 660 comprises PMOS transistors 661, 662, 663, 664, 665 and 666, an NMOS transistor 668, a sense amplifier 667, and a switch controller 669. Switch controller 669 activates one of switch control signals CSW00 and CSW10 to logic level "low" according to program data WD in the verify read operation. Switch controller 669 deactivates switch control signals CSW00 and CSW10 to logic level "high" where control signal /VFY_READ does not indicate the verify read operation.

PMOS transistors 661 and 662 constitute a verify current supplying part supplying verify current I_RESET (see FIG. 4) in response to switch control signal CSW10 and bias voltage VBIAS_RESET. PMOS transistors 663 and 664 constitute a verify current supplying part supplying verify current I_SET (see FIG. 4) in response to switch control signal CSW00 and bias voltage VBIAS_SET. Similarly, PMOS transistors 665 and 666 constitute a sense current supplying part supplying sense current I_SENSE (see FIG. 4) in response to control signal /READ and bias voltage VBIAS in the normal read operation. As it is understood from the above illustration, verify current I_RESET or I_SET is applied to the bit line in the verify read operation, and sense current I_SENSE is applied to the bit line in the normal read operation.

Except for the above-described differences, phase memory device 600 of FIG. 15 operates in substantially the same manner as phase change memory device 200 of FIG. 5. Accordingly, further description of phase change memory device 600 will be omitted to avoid redundancy.

Figure 17:
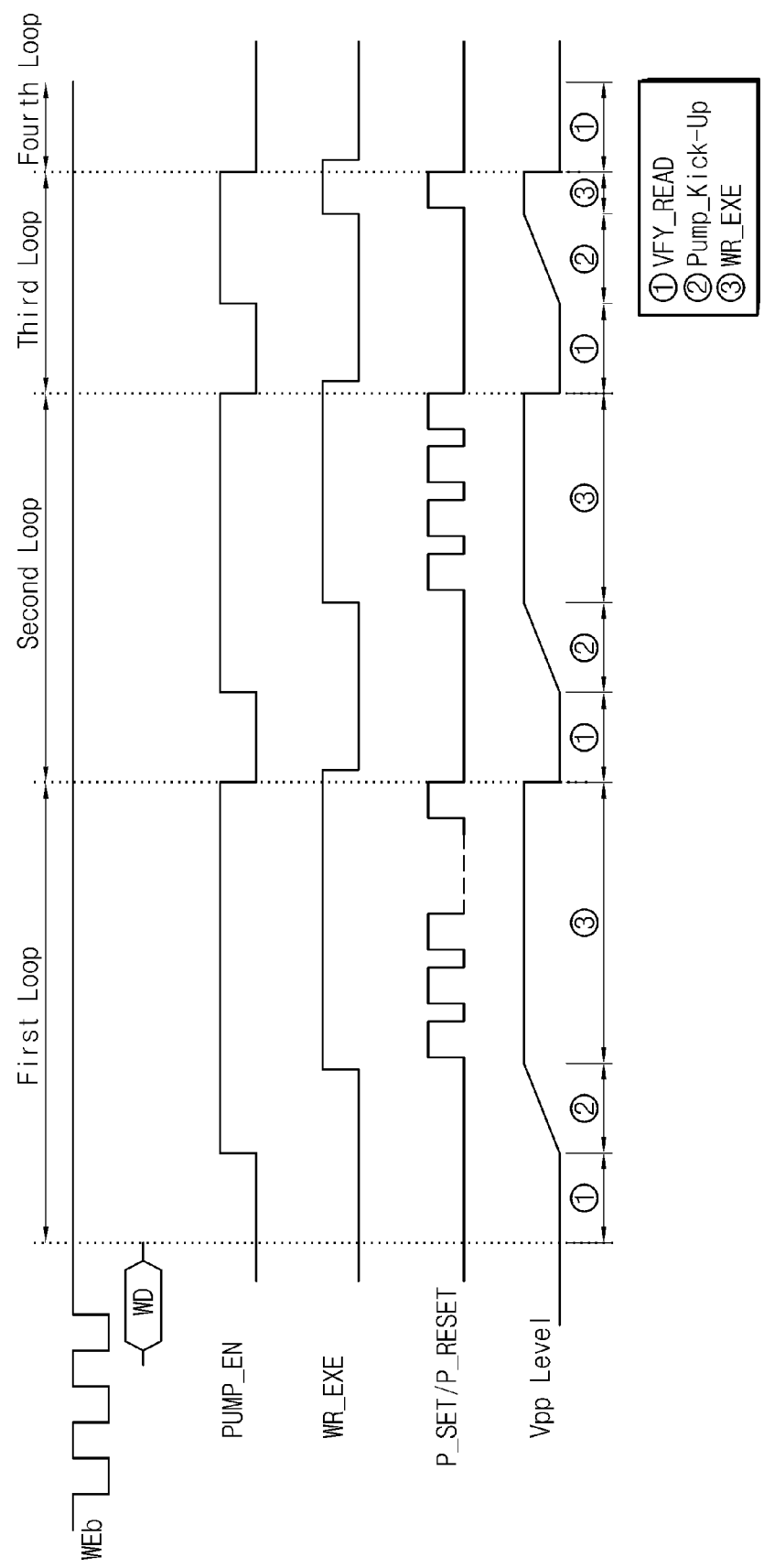
FIG. 17 is a timing diagram illustrating a program operation of the phase change memory device of FIG. 15.

FIG. 17 is a timing diagram illustrating a program operation of phase change memory device 600 of FIG. 15. The timing diagram of FIG. 17 is substantially identical to that of FIG. 10 with the exception that in FIG. 17, there is an additional section PUMP_KICK-UP used to generate a high voltage with a level higher than the power voltage in every program loop. During the section PUMP_KICK-UP, the high voltage is generated by high voltage generating circuit 650. The high voltage is required for program operations, but is not required for read operations. For this reason, high voltage generating circuit 650 is deactivated during the verify read operation. Since a predetermined time is required to generate the high voltage, the section PUMP_KICK-UP is required between the verify read section and the write execution section where one sense amplifier circuit is used. With the above exception, the timing diagram of FIG. 17 is substantially the same as the timing diagram of FIG. 10. Accordingly, additional description of the timing diagram of FIG. 17 will be omitted to avoid redundancy.

Figure 18:
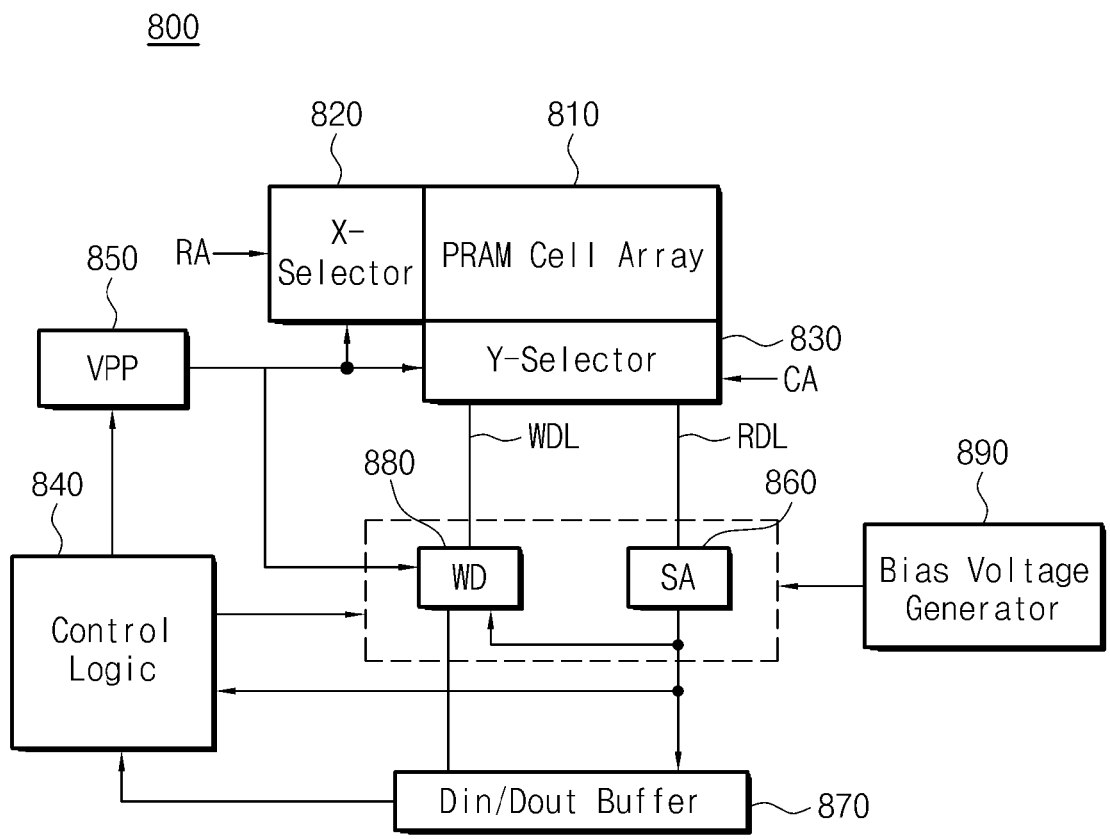
FIG. 18 is a block diagram illustrating a phase change memory device according to still another embodiment of the inventive concept.

FIG. 18 is a block diagram illustrating a phase change memory device according to still another embodiment of the inventive concept.

Referring to FIG. 18, a phase change memory device 800 is substantially identical to phase change memory device 200, except that the verify data are applied to a write driver circuit 880 in phase change memory device 800. Write driver circuit 880 selectively supplies the write current according to the verify data, and has a configuration substantially identical to write driver circuit 490 of FIG. 14. Remaining elements of phase change memory device 800 illustrated in FIG. 18 are substantially identical corresponding elements in phase change memory device 600 illustrated in FIG. 15, and therefore further descriptions of these elements are omitted in order to avoid redundancy.

Phase change memory devices are nonvolatile memory devices capable of retaining stored data even when disconnected from an external power supply. Phase change memory devices support random data access and provide high-speed data read and processing performance. As a result, phase change memory devices can be beneficially used for storing program code. As portable electronic devices such as cellular phones, personal digital assistants (PDA), digital cameras, portable game consoles, and MP3 players continue to proliferate, phase change memory devices can be used in these devices to provide data storage as well as code storage.

In addition, the phase change memory devices can also be beneficially used in home applications such as high-definition televisions (HDTVs), digital video disk (DVD) players, routers, and global positioning systems (GPS). An exemplary system including a phase change memory device according to one embodiment of the inventive concept is schematically illustrated in FIG. 19.

Figure 19:
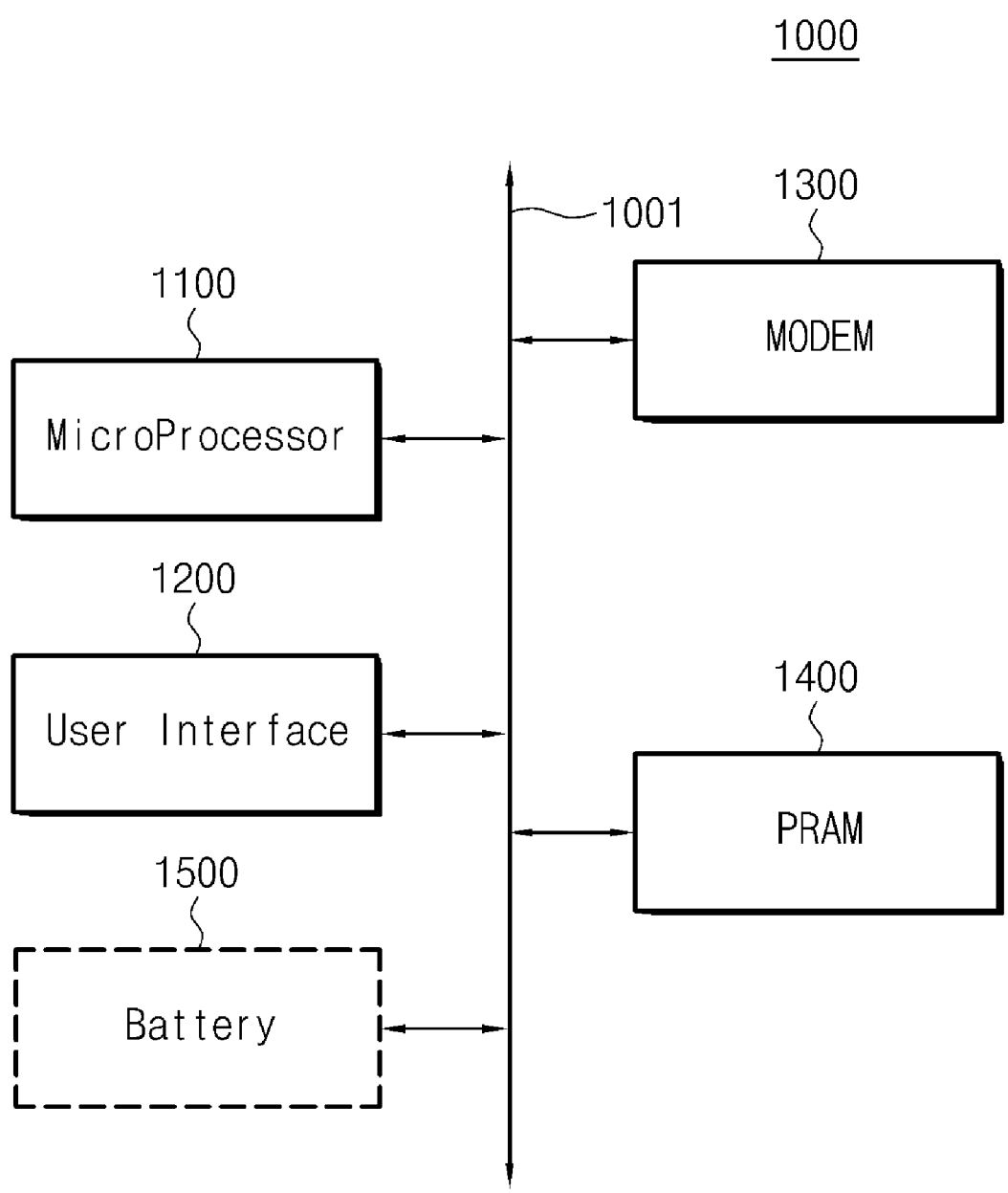
FIG. 19 is a block diagram illustrating a system including a phase change memory device according to an embodiment of the inventive concept.

Referring to FIG. 19, a system 1000 comprises a microprocessor 1100 electrically connected to a bus 1001, a user interface 1200, a modem 1300 such as baseband chipset, and a phase change memory device 1400 (denoted PRAM in FIG. 19). The label "PRAM" here denotes "phase change random access memory (RAM)". In system 1000, phase change memory device 1400 can be embodied, for example, by any of the phase change memory devices illustrated in FIGS. 5 through 17.

Phase change memory device 1400 stores N-bit data processed/to be processed by microprocessor 1100, where N is a positive integer. Where system 1000 comprises a mobile electronic device, a battery 1500 may be provided to supply operational power. Although not illustrated in FIG. 19, those skilled in the art will understand that system 1000 may further comprise other elements such as an application chipset, a camera image processor (CIS), a mobile DRAM, a NAND flash memory, and so on.

As described above, according to selected embodiments of the inventive concept, a program operation of selected memory cells is performed such that the selected memory cells assume states within SET/RESET state distributions such as those illustrated by dotted lines in FIG. 4. As a result, desired read margins, and consequently reliability can be achieved.

FIG. 20 is a block diagram illustrating a non-volatile memory device according to still another embodiment of the inventive concept. For ease of description, the embodiment of FIG. 20 is illustrated with only sixteen (16) memory banks. But, it is understood that the inventive concept is not limited to only this specific configuration of memory bank.

Referring to FIG. 20, the non-volatile memory device comprises a memory cell array (inclusive of 1-1 through 1-16), a plurality of sense amplifier and write driver blocks (inclusive of 2_1 to 2_8), and a peripheral circuit region 3.

The memory cell array has been divided in the illustrated example into a plurality of memory banks 1_1 to 1_16, each of which is formed of a plurality of memory blocks BLK0 to BLK7. Each of the memory blocks BLK0 to BLK7 may include a plurality of phase change (or, resistance variable) memory cells which are arranged in a matrix form. In the example of FIG. 20, each memory bank is formed of eight (8) memory blocks, but other memory bank configurations may be used.

Herein, a phase change memory cell may include a resistance variable element and an access element controlling current flowing via the resistance variable element. The resistance variable element may include a phase change material which is set to one of two different resistance values each corresponding to a crystalline state and an amorphous state. The access element may be formed of a coupling diode or a transistor which is serially connected with the resistance variable element. The phase change material may be formed of GaSb, InSb, InSe, $Sb_2Te_3$, GeTe, GeSbTe, GaSeTe, InSbTe, $SnSb_2Te_4$, InSbGe, AgInSbTe, (GeSn)SbTe, GeSb(SeTe), $Te_{81}Ge_{15}Sb_2S_2$, and the like. Among such materials, GeSbTe consisting of Ge, Sb, and Te may be used mainly as the phase change material.

Although not shown in figures, the non-volatile memory device may further comprise a row selector circuit and a column selector circuit in each memory bank to select rows and columns of phase change memory cells to be accessed.

Each of the sense amplifier and write driver blocks 2_1 to 2_8 may be used to read and write two (2) memory banks. For example, the sense amplifier and write driver block 2_1 may correspond to two memory banks 1-1 and 1-2, and the sense amplifier and write driver block 2_2 may correspond to two memory banks 1-3 and 1-4. However, it is also possible to dispose each sense amplifier and write driver block so as to correspond to one memory bank or four (4) memory banks.

Figure 21:
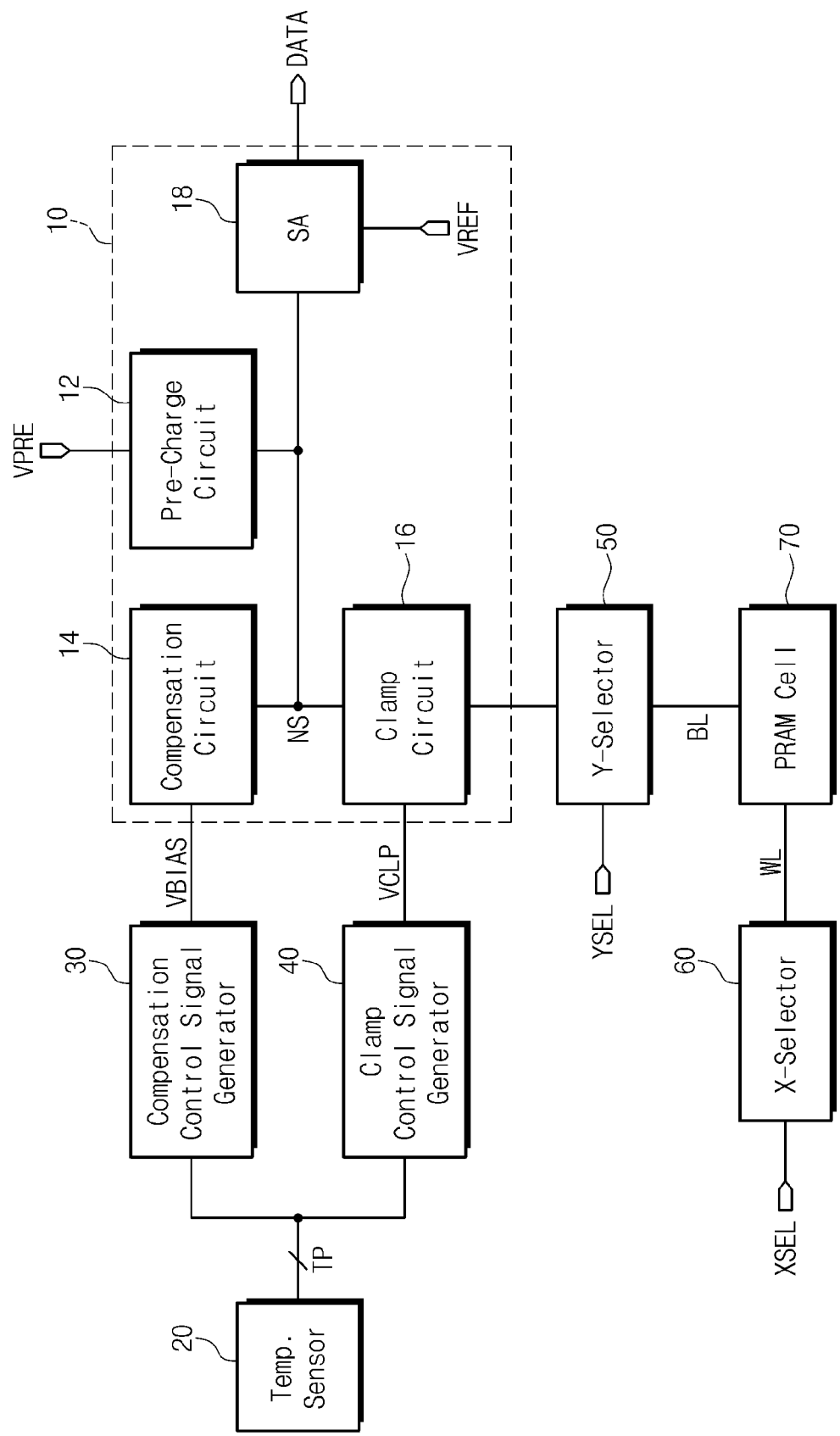
FIG. 21 is a block diagram illustrating a non-volatile memory device according to still another embodiment of the inventive concept.

The peripheral circuit region 3 comprises a voltage generator and a plurality of logic circuit blocks for operating the column selector circuits, the row selector circuits, the sense amplifier and write driver blocks 2_1 to 2_8. Referring to FIG. 21 in addition to FIG. 20, the peripheral circuit region 3 may also comprise a temperature sensor 20, a compensation control signal generator circuit 30, and a clamp control signal generator circuit 40. These components will be more in some additional detail hereafter.

Figure 22:
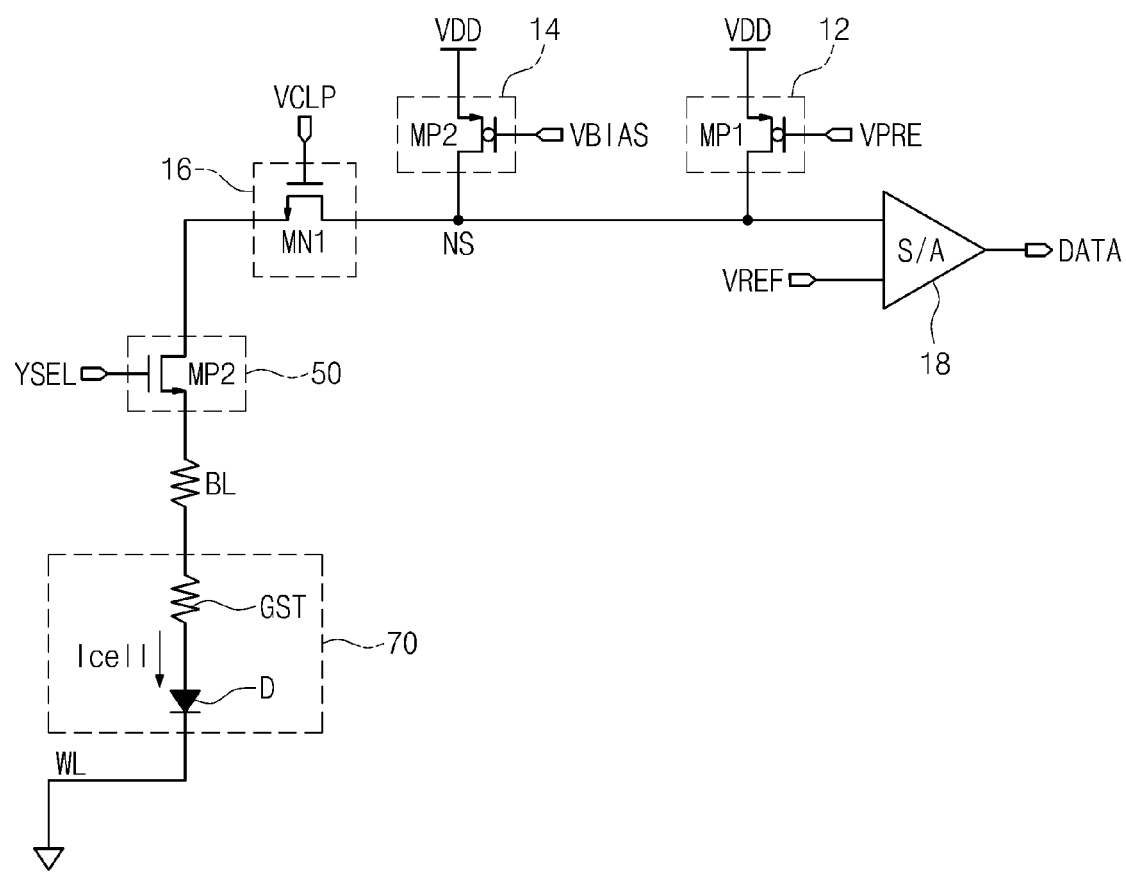
FIG. 22 is a circuit diagram illustrating a non-volatile memory device according to still another embodiment of the inventive concept.

FIGS. 21 and 22 are block diagrams variously illustrating a non-volatile memory device according to an embodiment of the inventive concept. In FIG. 22, a data read circuit, a column selector circuit, a row selector circuit, and a selected phase change memory cell are illustrated in some further detail.

Referring to FIGS. 21 and 22, a non-volatile memory device comprises a data read circuit 10, a temperature circuit 20, a compensation control signal generator circuit 30, a clamp control signal generator circuit 40, a column selector circuit 50, a row selector circuit 60, and a phase change memory cell 70.

The phase change memory cell 70 may be a phase change memory cell, which is selected to read data, among a plurality of phase change memory cells in a memory cell array. In particular, the column selector circuit 50 may be used to select a bit line BL in response to a column selection signal YSEL, and the row selector circuit 60 may be used to select a word line WL in response to a row selection signal XSEL. Selection of the phase change memory cell 70 may be accomplished by selection of the word line WL and the bit line BL.

The data read circuit 10 reads data by applying current to the selected phase change memory cell 70 and sensing a level variation of a sensing node NS caused by current Icell flowing through the selected phase change memory cell 70. In the illustrated embodiment, the data read circuit 10 comprises a pre-charge circuit 12, a compensation circuit 14, a clamp circuit 16, and a sense amplifier 18.

The pre-charge circuit 12 is configured to pre-charge a sensing node NS to a given level, (e.g.,) a power supply voltage VDD during a pre-charge period prior to a sensing operation. The pre-charge circuit 12, as illustrated in FIG. 22, may be coupled between a power supply voltage VDD and the sensing node NS and may be formed by a PMOS transistor (MP1) having a gate connected to receive a pre-charge control signal VPRE. The compensation circuit 14 is configured to provide a compensation current to the sensing node NS to compensate for a decrease in a level of the sensing node NS caused by current Icell flowing through a selected phase change memory cell 70. A more detailed description of this operative configuration is presented below.

In the event that the phase change memory cell 70 is in the set state, the current Icell may be relatively large since the resistance of a phase change material is low. However, in the event that the phase change memory cell 70 is in the reset state, the current Icell will be significantly reduced since the resistance of the phase change material is higher than in the set state. Herein, the amount of compensation current provided from the compensation circuit 14 may be determined to be enough to compensate for the reduced current Icell flowing during the reset state. In this case, the voltage level apparent at the sensing node NS during the reset state may be constantly maintained, but the voltage level apparent at the sensing node NS during the set state may drop. Thus, since there is a distinct difference between the voltage levels apparent at the sensing node NS corresponding to the reset and set states, it is easy to distinguish between the two memory cell states. Thus, as a result of the foregoing, the sensing margin for the PRAM memory cell may be increased. The compensation circuit 14, as illustrated in FIG. 22, may be coupled between a power supply voltage VDD and the sensing node NS and may be formed by a PMOS transistor (MP2) having a gate connected to receive a compensation control signal VBIAS from the compensation control signal generator 30.

The clamp circuit 16 may be used to clamp a voltage level to the bit line BL within a range suitable for reading stored data. For example, the clamp circuit 16 may be configured to clamp the level of the bit line BL to a level lower than a threshold voltage for the phase change material. If the level of the bit line BL exceeds this threshold voltage, the phase of a phase change material of the selected phase change memory cell 70 may be changed. In the illustrated example of FIG. 22, the clamp circuit 16 is coupled between the bit line BL and sensing node NS and is formed by an NMOS transistor (MN1) having a gate connected to receive a clamp control signal VCLP from the clamp control signal generator 40.

The sense amplifier 18 is configured to compare the voltage level apparent at the sensing node NS with a reference level (VREF) and provide a comparison result. The sense amplifier 18 may be a current sense amplifier configured to sense a variation in the flow of current through the bit line BL connected to the selected phase change memory cell 70 with respect to a reference current. Alternately, the sense amplifier 18 may be configured as a voltage sense amplifier sensing a voltage variation with respect to the reference voltage.

In certain embodiments of the inventive concept, the compensation circuit 14 may be configured to adjust the amount of the compensation current according to variation in operating temperature (i.e., the external or ambient associated with the current operating state of the memory cell array). Further, the clamp circuit 16 may be configured to adjust the level of the bit line BL according to variation in operating temperature. That is, the clamp circuit 16 may be configured to adjust the amount of clamp current flowing to the bit line connected to the selected phase change memory cell 70 from the sensing node NS when the operating temperature varies.

Several bases for altering these system conditions (i.e., the compensation current and the clamp current) in response to changes in operating temperature will be more fully described with reference to FIGS. 21 through 25.

Figure 23:
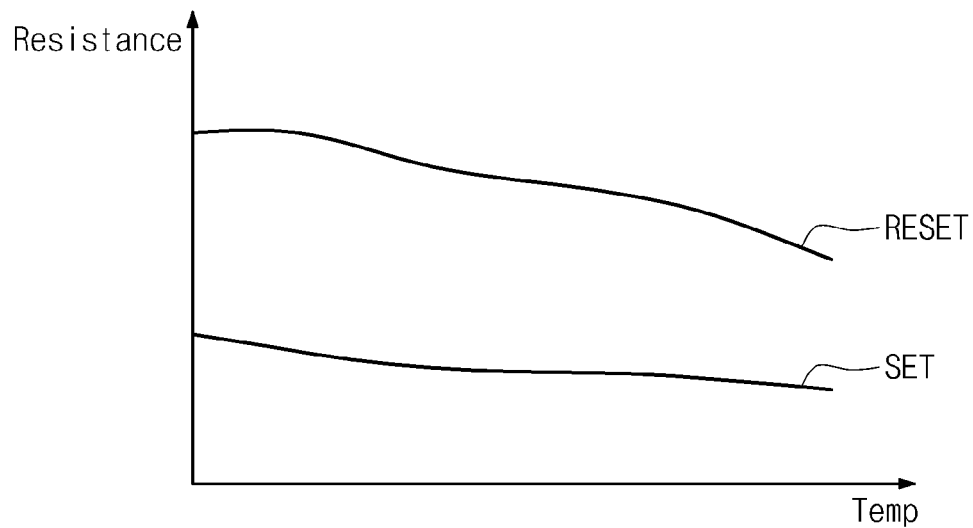
FIG. 23 is a diagram illustrating a relationship between a phase change material and its resistance according to variations in operating temperature.
Figure 24:
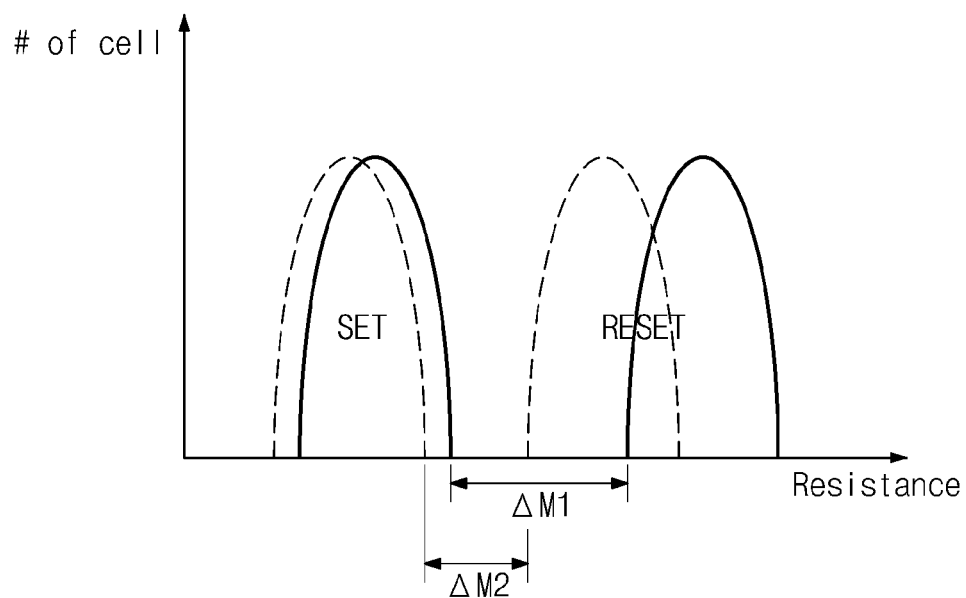
FIG. 24 is a diagram for illustrating a set resistance distribution and a reset resistance distribution of a phase change memory cell according to variation in operating temperature.
Figure 25:
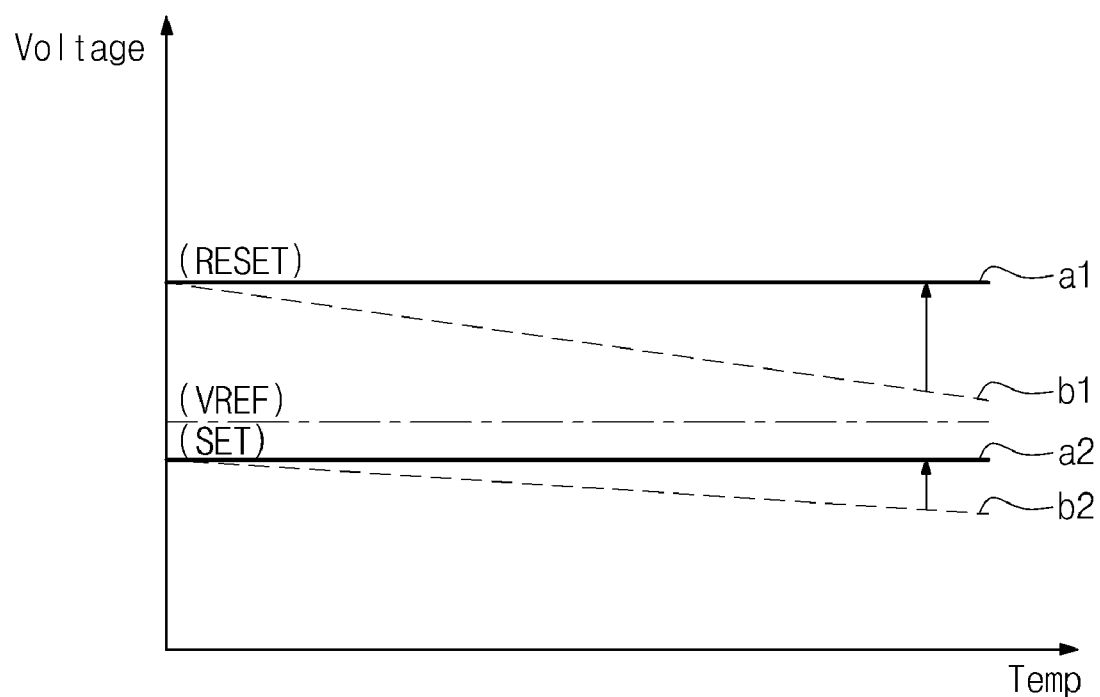
FIG. 25 is a diagram illustrating variation in the level of a sensing node according variation in operating temperature.

FIG. 23 is a diagram illustrating a relationship between the resistance of a phase change material and its operating temperature. FIG. 24 is a diagram illustrating variation in a set resistance distribution and a reset resistance distribution for a phase change memory cell according to operating temperature. FIG. 25 is a diagram further illustrating variation in the level of a sensing node (SN) according to variation in operating temperature.

As the operating temperature rises, the set resistance and reset resistance decrease as illustrated in FIG. 23. For example, it is assumed that a memory cell has a set resistance of about 6 kΩ and a reset resistance of about 150 kΩ at an operating temperature of about 25° C. If the operating temperature rises from 25° C. to about 85° C., the set resistance falls from 6 kΩ to about 3.45 kΩ, and the reset resistance falls from about 150 kΩ to about 50 kΩ. Thus, as illustrated in FIG. 23, when an operating temperature increases, the resulting drop in the set resistance is less than the resulting drop in the reset resistance.

Referring now to FIG. 24, it is assumed that a read margin (i.e., the difference between a first (set) voltage distribution state and a second (reset) voltage distribution state) is ΔM1 at an operating temperature of about 25° C. However, if the operating temperature rises from 25° C. to about 85° C., the read margin ΔM1 shrinks to ΔM2.

Since the set resistance and reset resistance are reduced in response to an increase in operating temperature, the overall level of current Icell—which is dependent on the resistance of the phase change material—also increases. Thus, as the operating temperature rises, the voltage level apparent at the sensing node NS during the set state and during the reset state will decrease as illustrated in FIG. 25.

In FIG. 25, the horizontal axis indicates operating temperature and the vertical axis indicates a corresponding voltage level apparent at the sensing node, where "a1" indicates the voltage level apparent at the sensing node NS during the reset state at an operating temperature of 25° C. (i.e., room temperature), and "a2" indicates the voltage level apparent at the sensing node NS during the set state at an operating temperature of 25° C. In similar manner "b1" indicates the voltage level apparent at the sensing node NS during the reset state at a temperature higher than room temperature, and "b2" indicates the voltage level apparent at the sensing node NS corresponding during the set state at the temperature higher than room temperature. As illustrated in FIG. 25, as the operating temperature rises, the read margin between voltage levels apparent at the sensing node NS and corresponding to the reset state and set state is reduced. Thus, the sense amplifier 18 will struggle to clearly distinguish between a set state and reset state for the selected memory cell. In other words, the temperature-induced loss of read margin may result in a rising probability of read errors.

To overcome the above-described phenomenon, the compensation circuit 14 may be configured to increase the amount of compensation current, and the clamp circuit 16 may be configured to decrease the amount of clamp current. That is, although an increased amount of current flowing through the selected memory cell is dependent on a reduced resistance of the constituent phase change material, the level of the set and reset voltage illustrated in FIG. 25 may nonetheless be held reasonably constant over the entire range of operating temperature. This compensation effect is illustrated in FIG. 25 by the upward drawn arrows and is accomplished by providing compensation current sufficient to compensate for the current flowing through the selected memory cell. Since the amount of current flowing through the selected memory cell decreases with a decrease in the amount of clamp current, the voltage level apparent at the sensing node NS may be maintained constant as illustrated by the arrows in FIG. 25. Accordingly, it is possible to secure additional read margin between the different voltage levels apparent at the sensing node NS during the reset state and set state. This means that the likelihood of read errors arising from operation of the sense amplifier 18 is reduced, and as a result, the reliability of the non-volatile memory device is improved.

Examples of reducing clamp current and increasing compensation current will be described in some additional detail hereafter.

Referring back to FIGS. 21 and 22, the non-volatile memory device according to an embodiment of the inventive concept has been described as including the temperature sensor 20 responsive to an operating temperature associated with a memory cell array and providing a temperature signal TP.

The compensation control signal generator circuit 30 generates the compensation control signal VBIAS indicating (or accounting for) the operating temperature level in response to the temperature signal TP.

The clamp control signal generator circuit 40 generates the clamp control signal VCLP also indicating (or accounting for) the level of the operating temperature in response to the temperature signal TP. For example, if the level of the operating temperature rises, the corresponding levels of the control signals VBIAS and VCP provided by the compensation control signal generator circuit 30 and the clamp control signal generator circuit 40 will be reduced. As the level of the applied compensation control signal VBIAS falls, the amount of compensation current provided by the PMOS transistor (MP1) of the compensation circuit 14 also falls. And as the level of the applied clamp control signal VCLP falls, the amount of the clamp current provided by the NMOS transistor (MN1) of the clamp circuit 16 also falls.

Figure 27:
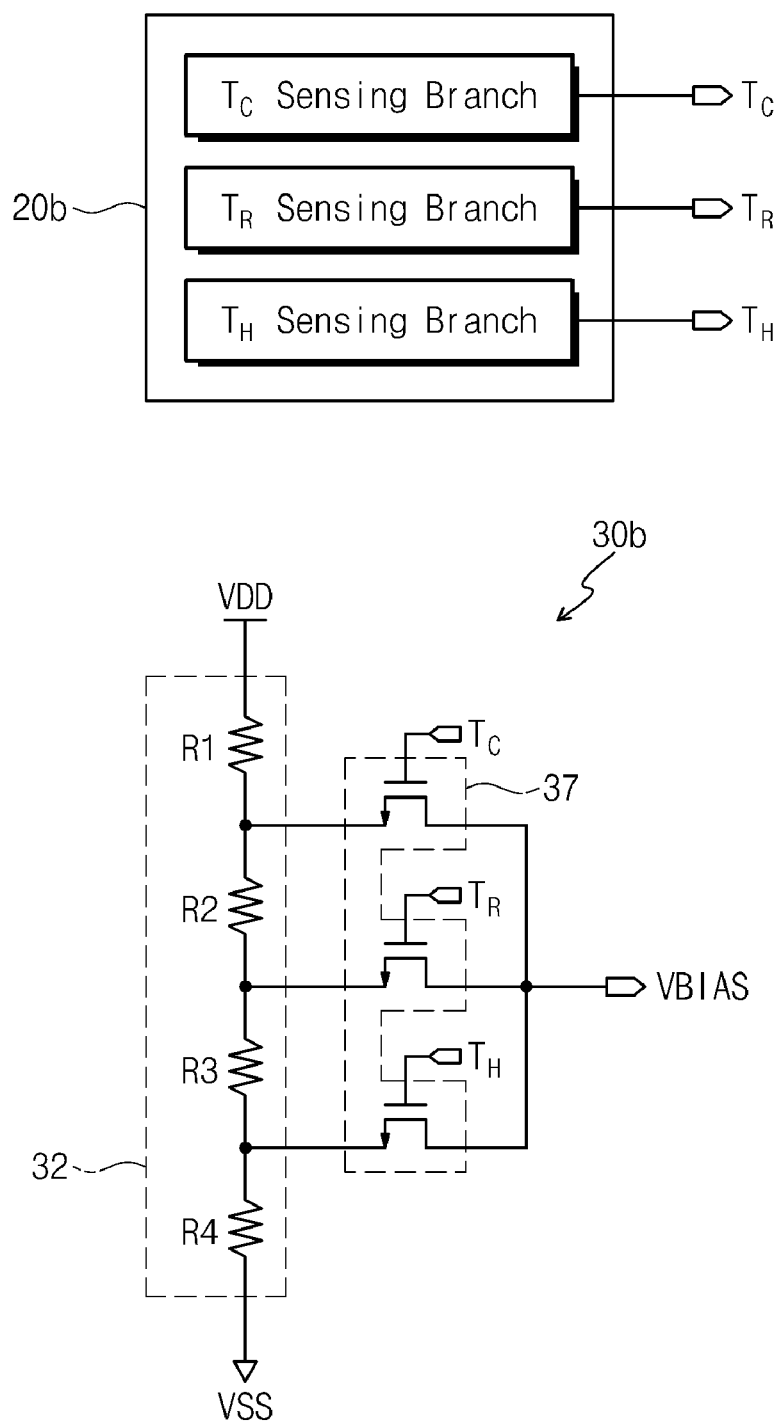
Figure 28:
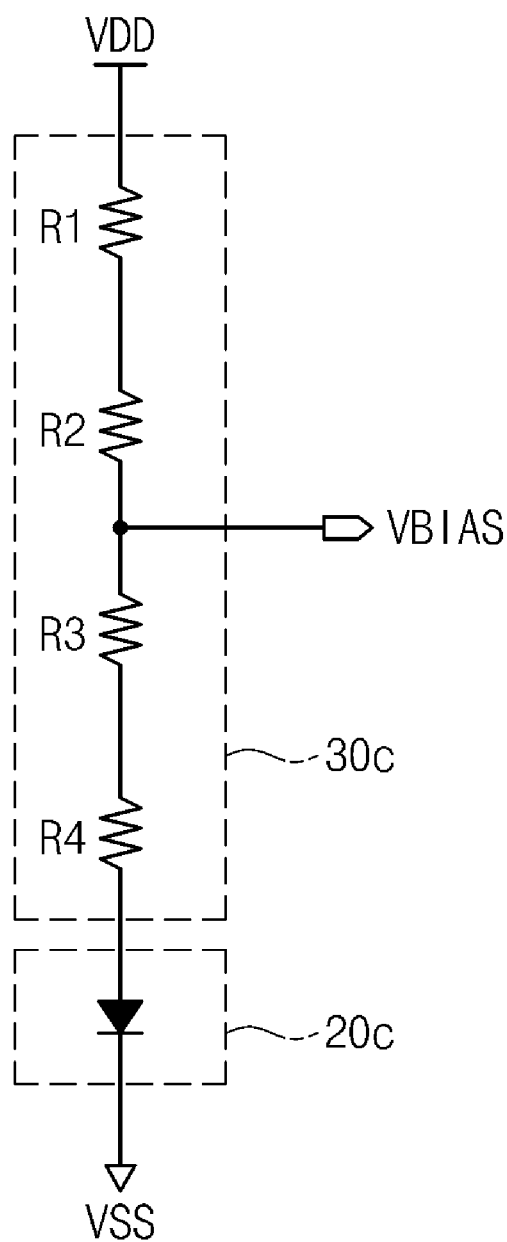

More specific embodiments for the temperature sensor 20 and compensation control signal generator circuit 30 are described in relation to FIGS. 26 through 28.

Referring to FIG. 26, a temperature sensor 20a comprises a plurality of temperature sensing branches which output temperature signals $T_R$, $T_H$, and $T_C$ in response to a detected operating temperature, respectively. For example, the temperature sensor 20a may include a $T_R$ sensing branch for sensing a room temperature, a $T_H$ sensing branch for sensing a temperature higher than room temperature, and a $T_C$ sensing branch for sensing a temperature lower than room temperature. That is, when the operating temperature of a non-volatile memory device is higher than room temperature, the temperature signal $T_H$ goes "high", and the temperature signals $T_H$ and $T_C$ go "low".

As further illustrated in FIG. 27, a compensation control signal generator circuit 30a comprises a resistor string 31 comprising a plurality of resistors R1 through R4, and a plurality of NMOS transistors 36 connected between nodes of the resistor string 31. The plurality of NMOS transistors 36 is turned ON/OFF respectively by the temperature signals $T_R$, $T_H$, and $T_C$. Herein, it is assumed in relation to the embodiment of FIG. 26 that R4>R3>R2>R1. In this case, the level of the compensation control signal VBIAS provided in response to the temperature signal $T_H$ will be lower than that level provided in response to either one of the temperature signals $T_R$ and $T_C$.

Referring to FIG. 27, a temperature sensor 20b comprises a plurality of temperature sensing branches which output temperature signals $T_R$, $T_H$, and $T_C$ in response to a detected operating temperature. A compensation control signal generator circuit 30b comprises a resistor string 32 having a plurality of resistors R1 through R4 and a plurality of NMOS transistors 37 connected respectively between nodes of the resistor string 31. Here again, each one of the plurality of the NMOS transistors 37 is turned ON/OFF by the temperature signals $T_R$, $T_H$, and $T_C$.

Referring to FIG. 28, a temperature sensor 20c comprises a diode, and a compensation control signal generator circuit 30c comprises a resistor string having serially connected resistors R1 through R4. The diode and the collection of resistors are connected in series. Since the resistance of the diode varies with operating temperature, the level of the compensation control signal VBIAS may also be varied in accordance with operating temperature.

Figure 29:
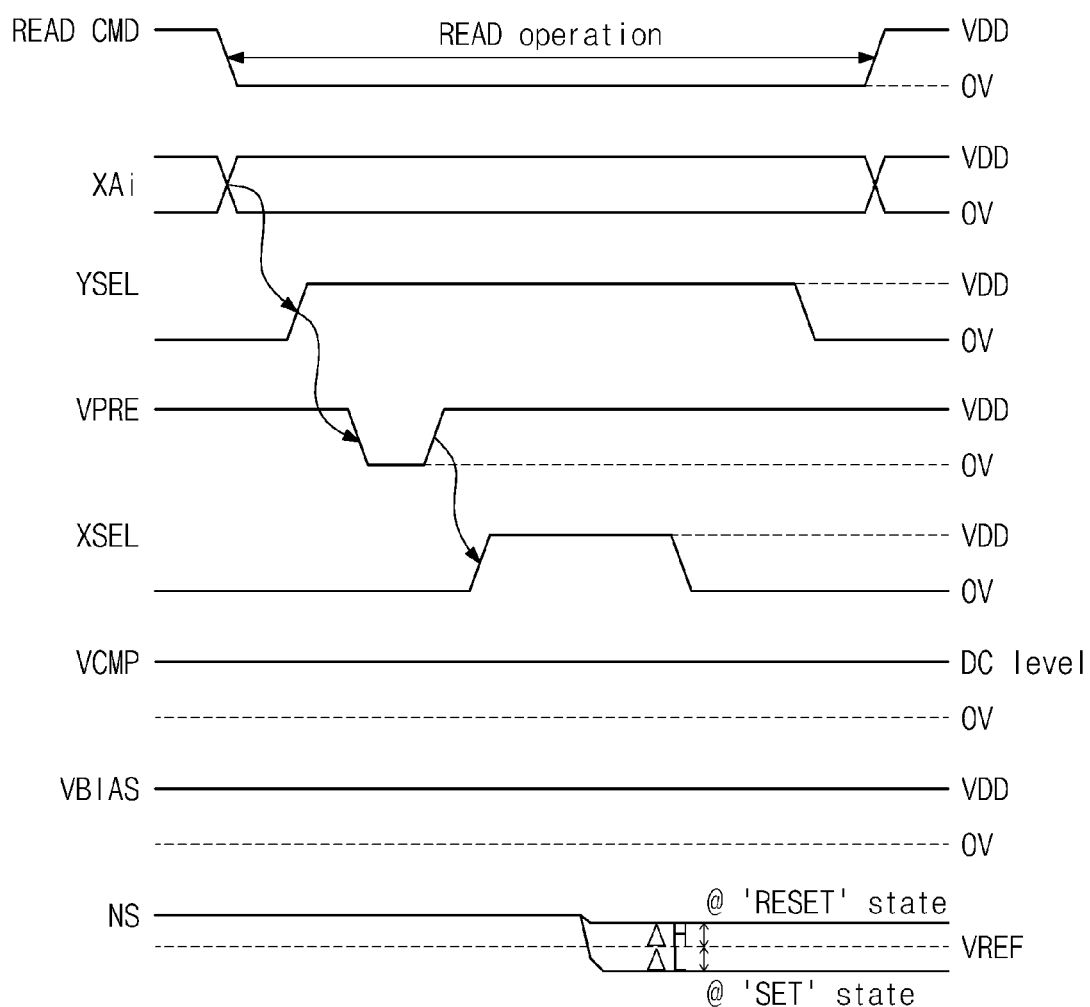
FIG. 29 is a timing diagram further illustrating a read operation for a non-volatile memory device according to an embodiment of the inventive concept.

FIG. 29 is a timing diagram further illustrating a read operation for a non-volatile memory device according to an embodiment of the inventive concept. More specifically, a read operation executed at a temperature higher than room temperature will be described with reference to FIGS. 22 and 29.

First, the read operation begins upon receipt of a read command (READ CMD). A column selection signal (YSEL) goes high in response to an input address (XAi) received with the read command. That is, a bit line BL may be selected.

A pre-charge control signal (VPRE) goes low in response to transition of the column selection signal. Accordingly, the PMOS transistor (MP1) in the pre-charge circuit 12 pre-charges the sensing node NS with a power supply voltage VDD.

Then, once the pre-charge control signal returns to high following precharge, a row selection signal (XSEL) goes high in response to level the re0transition of the pre-charge control signal. That is, a word line WL may be selected.

Once the pre-charge operation is completed the sensing operation begins. The clamp circuit 16 clamps the level of the bit line BL within a range suitable for reading data. In particular, the clamp circuit 16 clamps the level of the bit line BL to a given level below the threshold voltage of a phase change material. For example, if a threshold voltage for a phase change material is assumed to be 1.2V, the level of the bit line BL may be clamped to about 1.0V. In particular, the clamp circuit 16 may supply clamp current in an amount that is less than that provided at room temperature. Herein, a clamp control signal (VCLP) may have a constant voltage level, as illustrated in FIG. 29, or a pulse shape activated only during the read operation.

The compensation circuit 14 provides the compensation current to the sensing node NS to compensate for the reduced voltage level apparent at the sensing node NS, as a result of the current Icell flowing through the selected phase change memory cell 70. In particular, the compensation circuit 14 provides the compensation current in an amount that is greater than that provided at room temperature. Herein, a compensation control signal (VBIAS) may have a constant voltage level, as illustrated in FIG. 29, or a pulse shape activated only during the read operation.

Under the above-described conditions and control signal relationships, the current Icell will depend on the resistance of the selected phase change memory cell 70. If the selected memory cell 70 has the set state, its resistance will be relatively low, and the level of the current Icell will be relatively high. On the other hand, if the memory cell 70 has the reset state, its resistance will be relatively high, and the level of the current Icell will be relatively low. But, since compensation current is provided constantly from the compensation circuit 14, in the reset state case, the voltage level apparent at the sensing node NS may be maintained without reduction. On the other hand, in the set state case, the voltage level apparent at the sensing node NS may be reduced. Accordingly, the sense amplifier 18 will effectively sense a difference ΔH (see, FIG. 29) between the voltage level apparent at the sensing node NS and the reference level (VREF) for a reset state, or a difference ΔL (see, FIG. 29) between the voltage level apparent at the sensing node NS and the reference level (VREF) for the set state.

In analogous manner, in certain embodiments of the inventive concept, as the operating temperature rises, the compensation circuit 14 will increase the amount of compensation current and the clamp circuit 16 will decrease the amount of clamp current. Accordingly, the voltage level apparent at the sensing node NS for the reset state may be maintained constantly without reduction.

Figure 30:
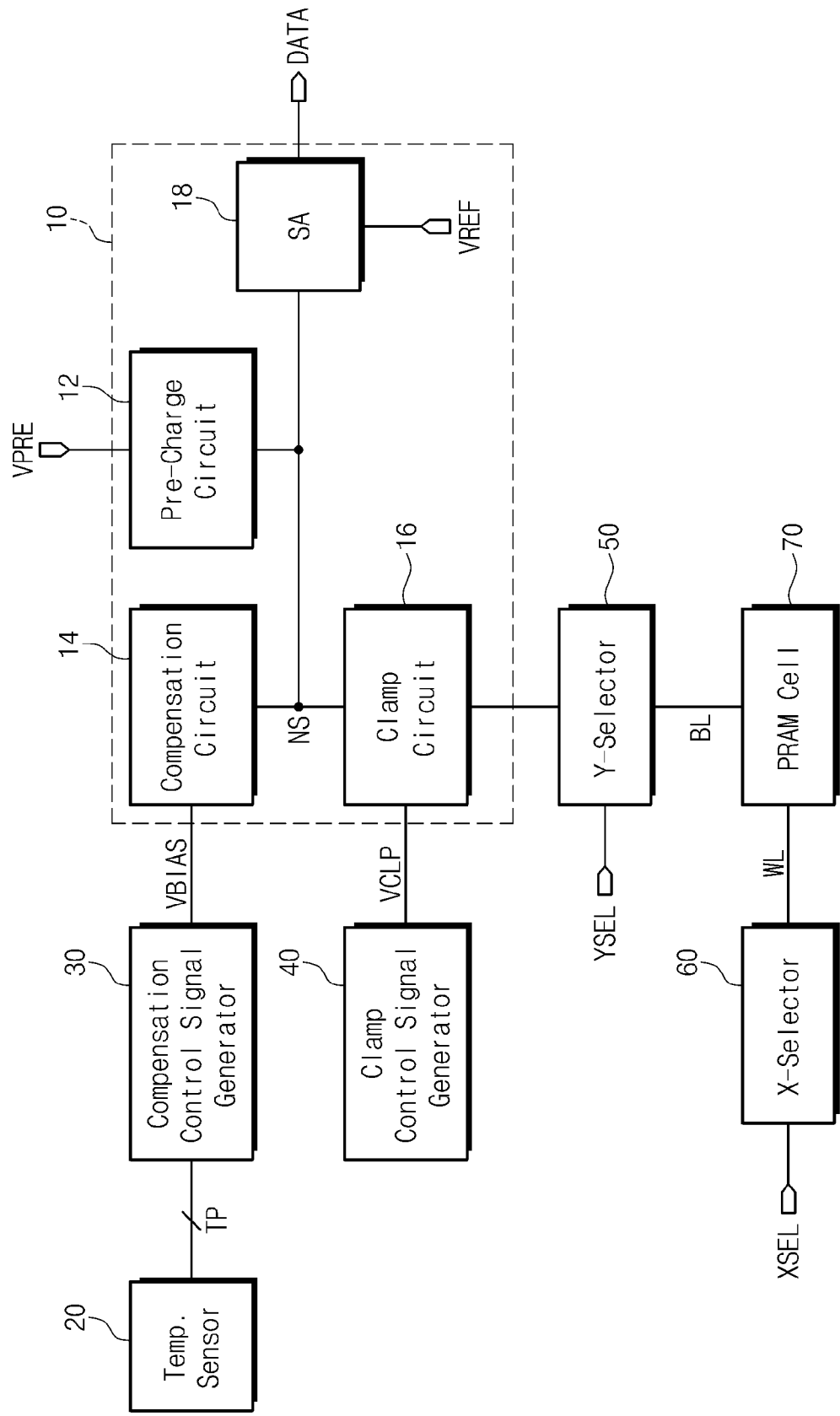
FIG. 30 is a block diagram illustrating a non-volatile memory device according to still another embodiment of the inventive concept.
Figure 31:
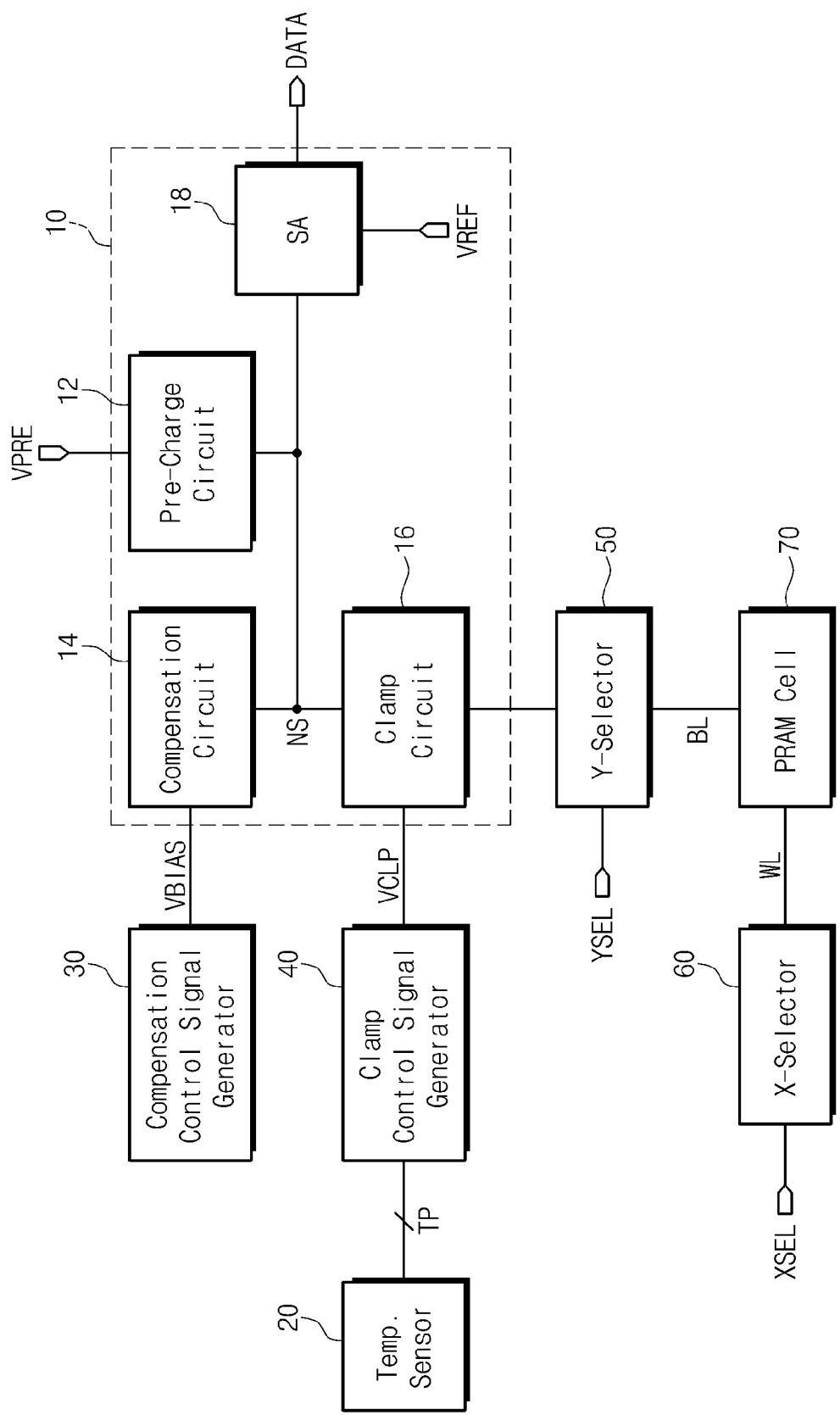
FIG. 31 is a block diagram illustrating a non-volatile memory device according to still another embodiment of the inventive concept.

FIGS. 30 and 31 are block diagrams illustrating additional non-volatile memory devices according to embodiments of the inventive concept. In FIGS. 30 and 31, elements which are substantially identical to those in FIG. 21 are indicated with like reference numbers and description thereof is thus omitted.

In FIG. 30, the temperature signal TP provided by the temperature sensor 20 is applied to only the compensation control signal generator circuit 30. This means that the amount of compensation current is only adjusted according to a variation of an operating temperature. In FIG. 31, the temperature signal TP provided by the temperature sensor 20 is applied to only the clamp control signal generator circuit 40. This means that the amount of clamp current is only adjusted according to a variation of an operating temperature.

Figure 32A:
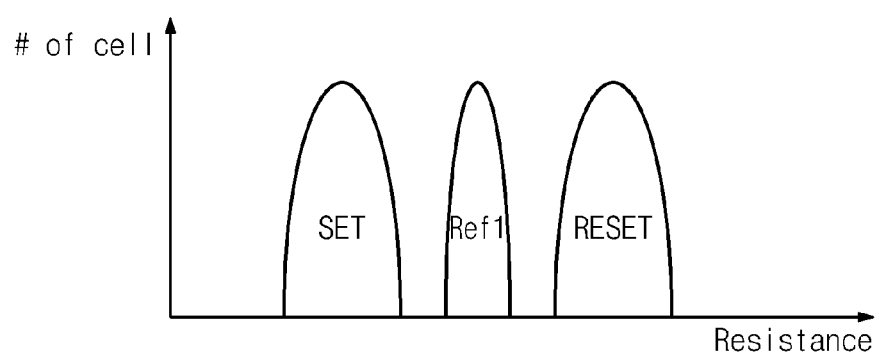
FIGS. 32A, 32B, 33, and 34 are diagrams additionally illustrating a non-volatile memory device according to more embodiments of the inventive concept.
Figure 32B:
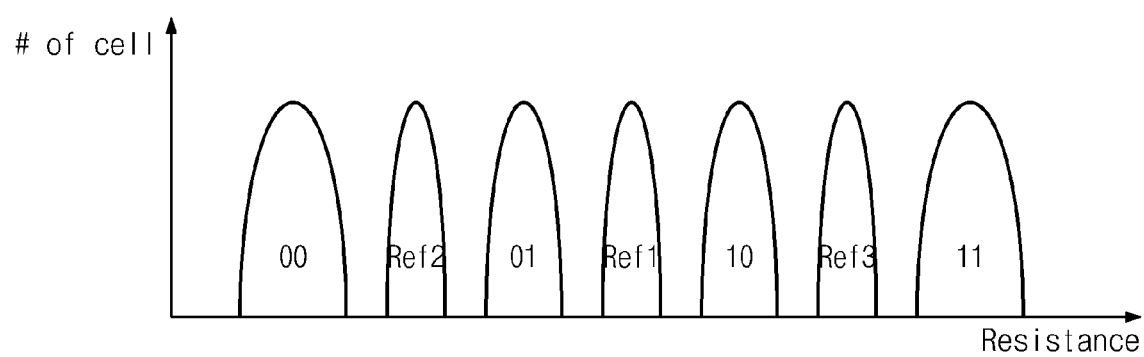
Figure 33:
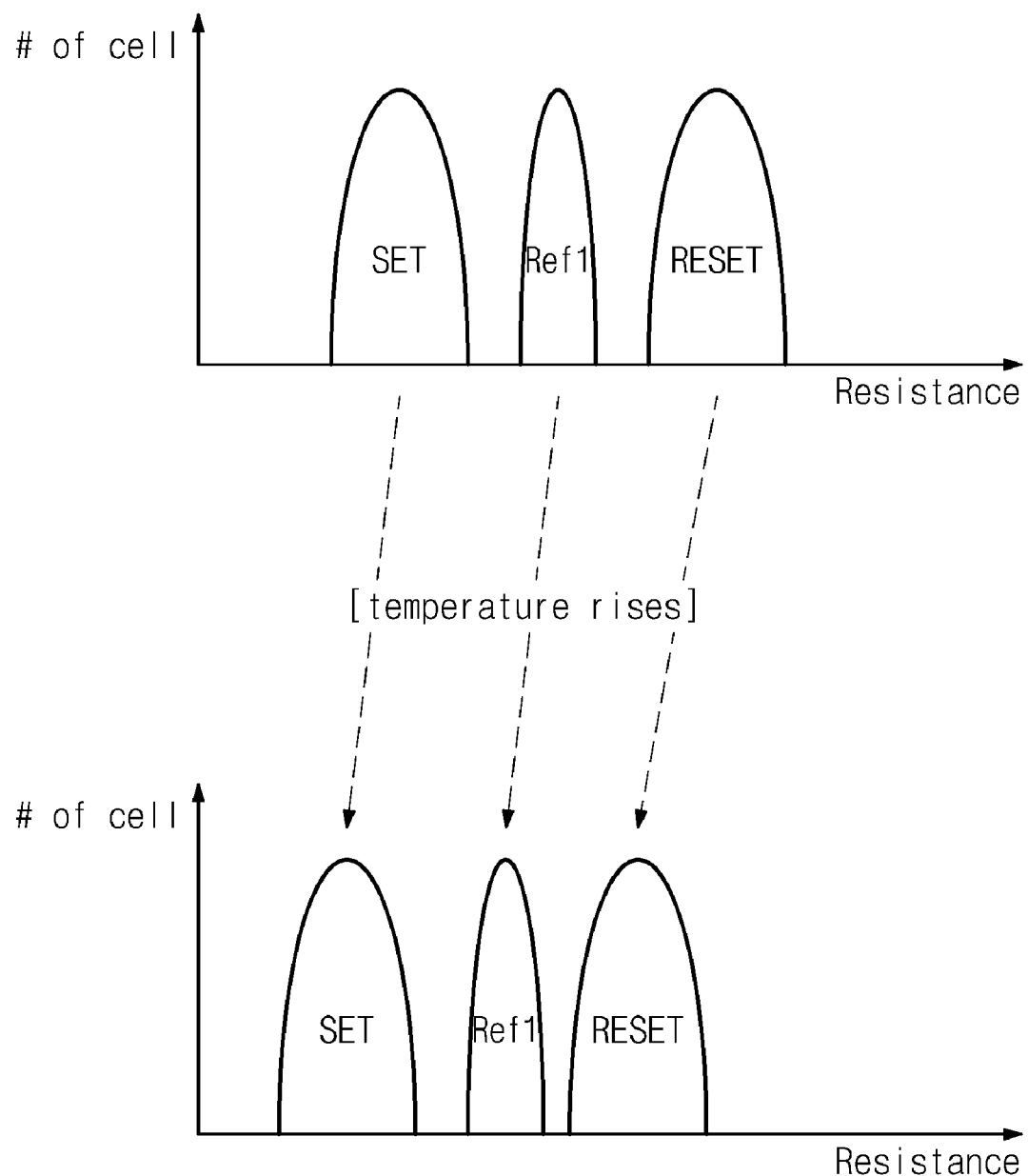
Figure 34:
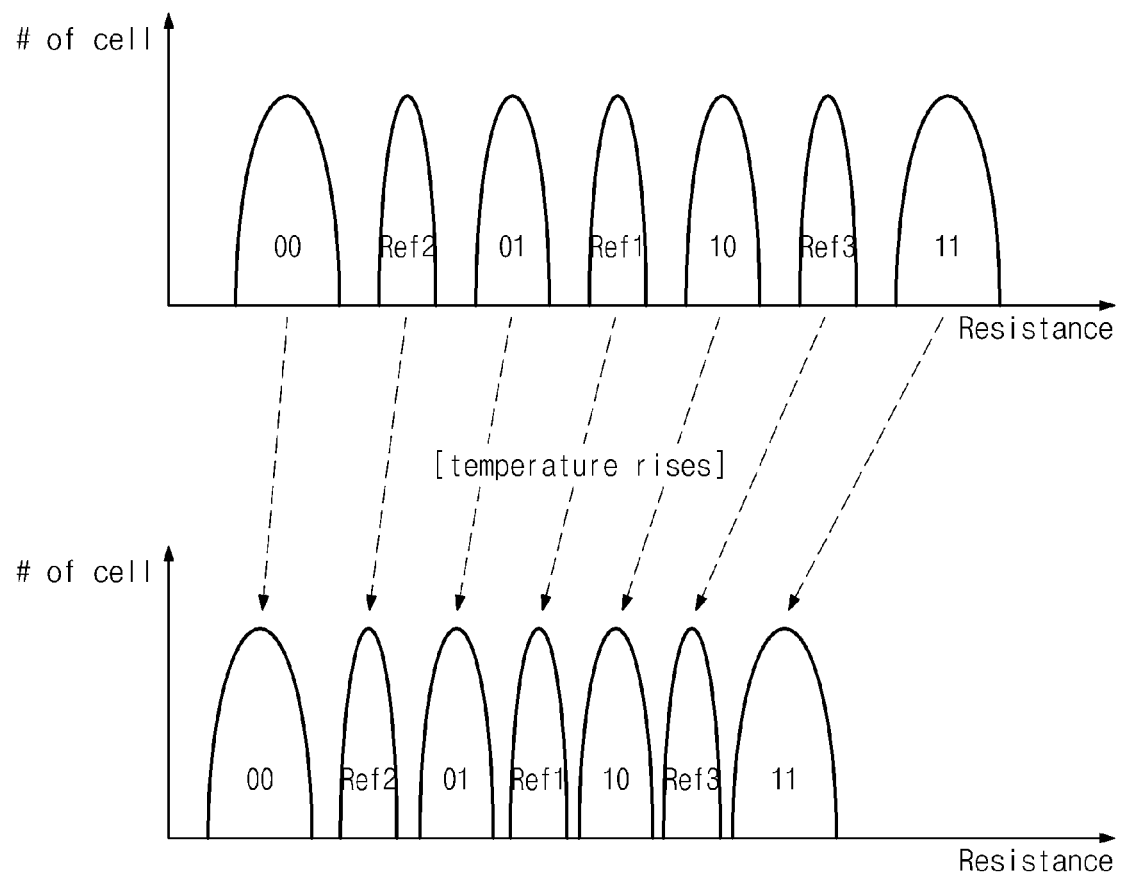

FIGS. 32A, 32B, 33, and 34 are voltage distribution diagrams further describing the operation of a non-volatile memory device according to certain embodiments of the inventive concept. FIGS. 32A and 33 are related to a single-level memory cell (i.e., memory cells storing 1-bit data), and FIGS. 32B and 34 are related to a multi-level memory cell (i.e., memory cells storing N-bit data, where "N" is an integer greater than 1).

In the illustrated examples, the non-volatile memory cell may have one of a plurality of first resistance distributions that are spaced apart (i.e., do not overlapped) in order to secure an adequate read margin.

For example, in the event that the non-volatile memory cell is a single-level cell, the plurality of first resistance distributions may include a set state and a reset state as illustrated in FIG. 32A. The non-volatile memory cell may have a resistance corresponding to one of the plurality of first resistance distributions.

In a case where a non-volatile memory cell is a multi-level cell, it may have one of $2^N$ different resistance distributions. In one embodiment, if the non-volatile memory cell is a 2-bit multi-level cell, the plurality of first resistance distributions will include four ($2^2$) cases: '00', '01', '10', and '11' as illustrated in FIG. 32B. The non-volatile memory cell may have a resistance corresponding to one of the plurality of first resistance distributions. The cases '00', '01', '10', and '11' may be determined according to an amorphous amount of a phase change material. For example, '00' may correspond to a crystalline of a phase change material, and an amorphous amount of a phase change material may increase in this order of '01', 10', and '11'.

Further, a non-volatile memory device according to an embodiment of the inventive concept may include at least one reference cell for adjusting the amount of compensation or clamp current to improve the reliability of a read operation. The reference cell may be identical to the ordinary non-volatile memory cells forming the memory cell array. That is, like each non-volatile memory cell, the reference cell may include a resistance variable element and an access element, the resistance variable element being a phase change material.

The reference cell may have at least one resistance distribution, that is, at least one second resistance distribution. The second resistance distribution may be formed not to be overlapped with the plurality of first resistance distributions.

In the event that a non-volatile memory cell is a single-level cell, as illustrated in FIG. 32A, a corresponding reference cell may have one resistance distribution Ref1. On the other hand, if a non-volatile memory cell is a multi-level cell, a corresponding reference cell will have ($2^N-1$) resistance distributions. For example, if a non-volatile memory cell is a 2-bit multi-level cell, as illustrated in FIG. 32B, three different resistance distributions may be formed which correspond to Ref1, Ref2, and Ref3, respectively.

Further, as illustrated in FIGS. 32A and 32B, the second resistance distribution may be disposed between adjacent resistance distributions of the plurality of first resistance distributions. For example, as illustrated in FIG. 32B, an Ref2 resistance distribution is disposed between a '00' resistance distribution and a '01' resistance distribution, an Ref1 resistance distribution is disposed between a '01' resistance distribution and a '10' resistance distribution, and an Ref3 resistance distribution is disposed between a '10' resistance distribution and a '11' resistance distribution.

Herein, referring to FIG. 33, resistance distributions of a non-volatile memory cell and a reference cell may vary according to a variation (e.g., an increase) in operating temperature. That is, as the operating temperature rises, variation of a reset resistance distribution (RESET) may be greater than variation of a set resistance distribution (SET). Accordingly, as the operating temperature rises, there may be reduced read margin between the set resistance distribution (SET) and the reset resistance distribution (RESET).

But, a disposition order of a set resistance distribution (SET), a resistance distribution Ref1 of a reference cell, and a reset resistance distribution RESET may be maintained before and after an increase in the operating temperature. Further, the set resistance distribution (SET), the resistance distribution Ref1 of the reference cell, and the reset resistance distribution (RESET) may overlap. Accordingly, a resistance of the reference cell may be used as a reference to distinguish the set and reset resistances quite distinctly.

Herein, referring to FIG. 34, resistance distributions for a non-volatile memory cell and a reference cell may vary according to an increase in operating temperature. That is, as the operating temperature rises, the reduction ratio may increase in the order of '00', '01', '10', and '11'. Accordingly, as the operating temperature rises, the corresponding read margins as between the resistance distributions '00', '01', '10', and '11' may be reduced.

However, a disposition order of the '00', '01', '10', and '11' resistance distributions and resistance distributions Ref1, Ref2, and Ref3 for the reference cell may be maintained exactly as before the increase in the operating temperature. Further, the '00', '01', '10', and '11' resistance distributions and the resistance distributions Ref1, Ref2, and Ref3 will not overlap. Thus, it is possible to use a resistance of the reference cell as a reference to fully distinguish the '00', '01', '10', and '11' resistances.

In certain embodiments of the inventive concept, it is possible to adjust the amount of compensation or clamp current using a resistance of a reference cell. As described in FIGS. 33 and 34, a resistance variation associated with a reference cell and varying with respect to the operating temperature may sufficiently reflect a resistance variation in a non-volatile memory cell as a function of the operating temperature. That is, as the resistance of a non-volatile memory cell varies according to operating temperature, the resistance of a reference memory cell will similarly vary with the operating temperature. Thus, the amount of compensation current and/or clamp current may be accurately defined for a certain operating temperature variation.

Further, it is possible to exactly adjust the amount of compensation current and/or clamp current using a resistance variation indicated by a reference cell. Since the reference cell and the non-volatile memory cell are formed with the same memory cell structure, a resistance variation of the reference cell may exactly reflect a resistance variation of the non-volatile memory cell.

Hereafter, certain configurations (blocks or circuits) for adjusting the amount of compensation current and/or clamp current using a reference cell will be more fully described.

Figure 35:
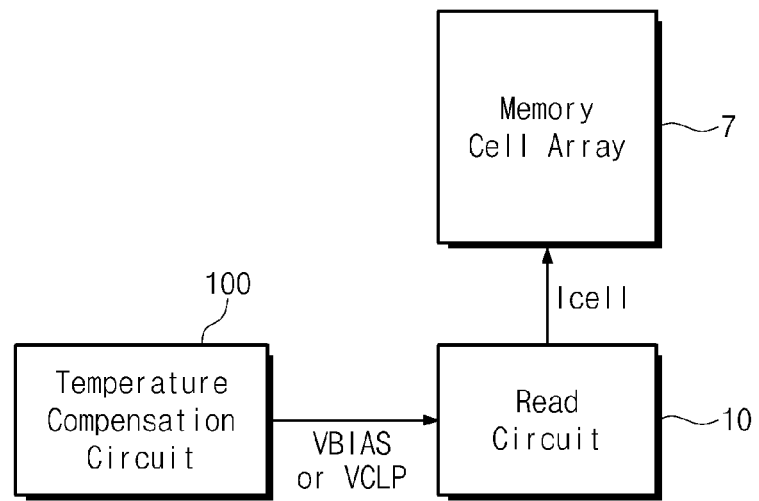
FIG. 35 is a block diagram illustrating a non-volatile memory device according to still another embodiment of the inventive concept.

FIG. 35 is a block diagram illustrating a non-volatile memory device according to still another embodiment of the inventive concept. Below, a read operation using a resistance of a reference cell will be more fully described with reference to FIGS. 32A, 32B, 33, 34, and 35.

Referring to FIG. 35, the non-volatile memory device comprises a memory cell array 7, a read circuit 10, and a temperature compensation circuit 100.

The memory cell array 7 is assumed to include a plurality of non-volatile memory cells, each of which has a resistance corresponding to one of a plurality of first resistance distributions. That is, each non-volatile memory cell may have one of a set resistance and a reset resistance when it is a single-level cell and one of '00', '01', '10', and '11 resistances when it is a multi-level cell.

The temperature compensation circuit 100 comprises at least one reference cell, which has a resistance corresponding to one of one or more second resistance distributions. For example, a reference cell may have a resistance Ref1 as illustrated in FIG. 32A or one of resistances Ref1, Ref2, and Ref3 as illustrated in FIG. 32B.

Further, the reference cell may be formed as part of a reference set. For example, the number of possible resistance distributions of the reference cell may be set identically to the number of reference cells in the reference set. When a non-volatile memory cell is a single-level cell, a reference cell may have one resistance level Ref1. On the other hand, when a non-volatile memory cell is a multi-level cell, a reference cell may have ($2^N-1$) resistance levels. Accordingly, when a non-volatile memory cell is a single-level cell, the reference set may include one reference cell. When a non-volatile memory cell is a multi-level cell, the reference set may include ($2^N-1$) resistance cells. For example, referring to FIG. 32B, the reference set may include $3(=2^2-1)$ reference cells. As a result, when a non-volatile memory cell is an m-bit level cell, the reference set may include ($2^m-1$) resistance cells.

The ($2^m-1$) resistance cells in the reference set may have different resistance distributions from one another. For example, when a non-volatile memory cell is a 2-bit level cell, the reference set may include three reference cells which have different resistance distributions Ref1, Ref2, and Ref3.

The temperature compensation circuit 100 may be configured to generate a compensation control signal VBIAS or a clamp control signal VCLP which is variable according to a resistance of a reference cell. As described in FIGS. 33 and 34, since a resistance of a reference cell varies according to a temperature variation, the control signal VBIAS or VCLP also varies according to a temperature. Configuration and operation of the temperature compensation circuit 100 will be described in some additional detail with reference to FIGS. 36 through 40.

The read circuit 10 may be configured substantially the same as described in FIG. 22, and description thereof is thus omitted. A compensation circuit 14 within the read circuit 10 may be used to adjust the amount of compensation current according to the compensation control signal VBIAS which is variable according to the operating temperature. That is, the compensation circuit 14 may adjust compensation current according to the operating temperature. Likewise, a clamp circuit 16 within the read circuit 10 may be used to adjust the amount of clamp current according to the clamp control signal VCLP which is variable according to the operating temperature. That is, the clamp circuit 16 may adjust compensation current according to operating temperature.

Figure 36:
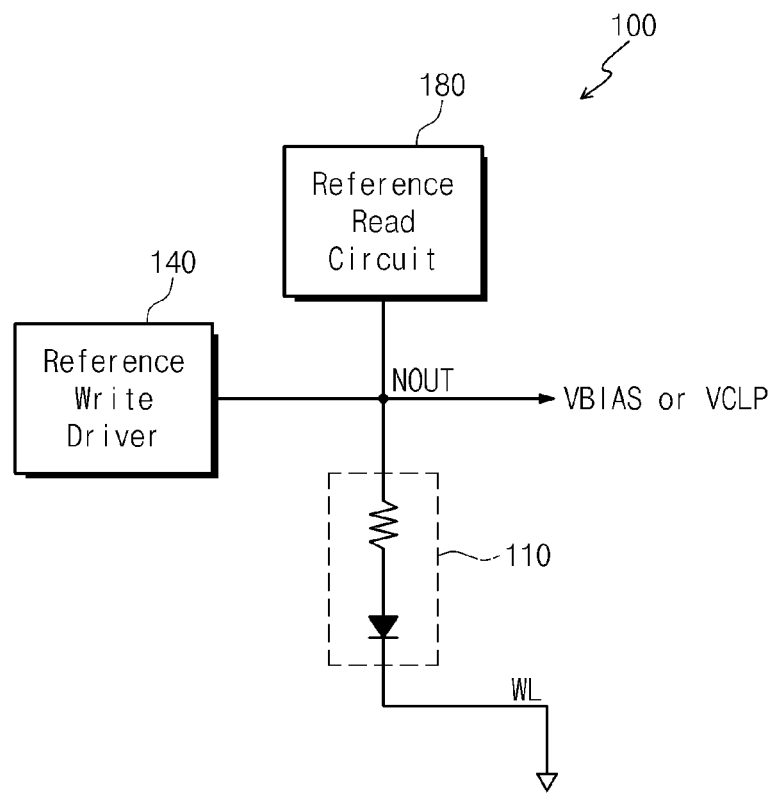
FIG. 36 is a block diagram further illustrating the temperature compensation circuit of FIG. 35.

FIG. 36 is a block diagram further illustrating one possible embodiment of the temperature compensation circuit 100 shown in FIG. 35. Referring to FIG. 36, the temperature compensation circuit 100 comprises a reference memory cell 110, a reference write driver 140, a reference read circuit 180, and an output node NOUT.

The reference write driver 140 is connected with the output node NOUT. The reference write driver 140 may provide write current to the reference cell 110 to determine a resistance distribution of the reference cell 110. Configuration of the reference write driver 140 will be described with reference to FIG. 37.

The reference read circuit 180 is connected with the output node NOUT. The reference read circuit 180 may provide read current (or, sensing current) to the reference cell 110 to read a resistance distribution of the reference cell 110. That is, the reference read circuit 180 may confirm whether a resistance of the reference cell 110 is properly located within a defined resistance distribution. If the resistance of the reference cell 110 is not located in the desired resistance distribution, the reference write driver 140 may provide write current to the reference cell 110 to further define a resistance distribution for the reference cell 110. If a resistance of the reference cell 110 is located within a defined resistance distribution, the compensation or clamp control signal VBAIS or VCLP varied according to a resistance level of the reference cell 110 may be provided via the output node NOUT. Configuration of the reference read circuit 180 will be described with reference to FIGS. 38, 39 and 40.

The reference write driver 140 may be a replica circuit of a write driver which provides write current to a non-volatile memory cell to determine its resistance distribution. The reference read circuit 180 may be a replica circuit of a read circuit (refer to FIG. 22) which provides read (or sensing) current to a non-volatile memory cell to read its resistance distribution. As described above, since the reference cell 110 is identical to a non-volatile memory cell, a resistance of the reference cell 110 may vary according to operating temperature variation to sufficiently reflect a resistance variation of a non-volatile memory cell according to a temperature variation. Herein, if the reference write driver 140 and the reference read circuit 180 are a replica circuit, a resistance variation of the reference cell 110 may reflect a resistance variation of a non-volatile memory cell according to a temperature variation more exactly. It will be understood that implementation of the reference write driver 140 and the reference read circuit 180 are not limited to only replica circuit(s).

Figure 37:
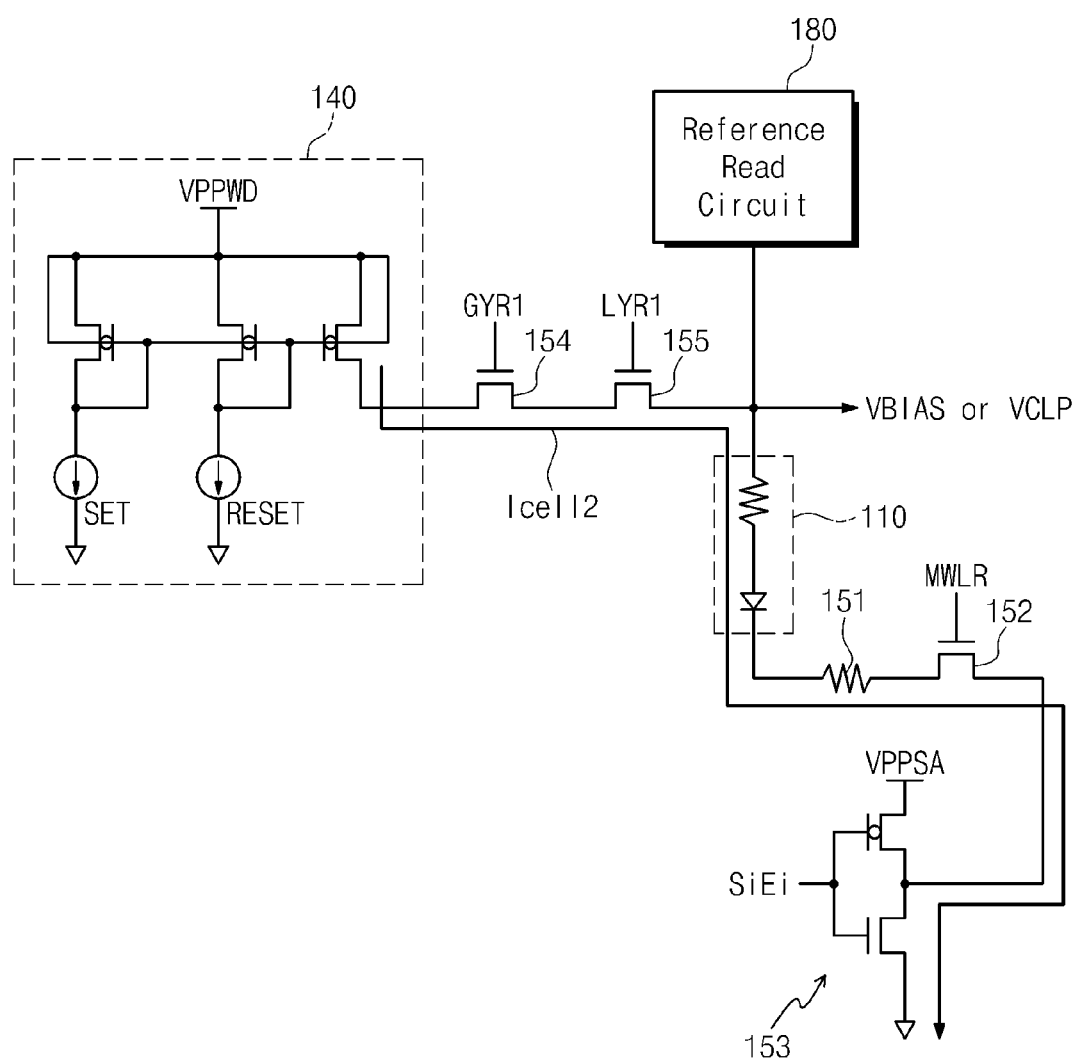
FIG. 37 is a circuit diagram further illustrating the reference write driver of FIG. 36.

FIG. 37 is a circuit diagram further illustrating the reference write driver of FIG. 36. Referring to FIG. 37, the reference write driver 140 provides write current Icell2 for writing set or reset data.

As illustrated in FIG. 37, the write current Icell2 may be obtained from a ground voltage via the first transistor 154, the second transistor 155, a reference cell 110, the first resistor 151, the third transistor 152, and an inverter 153.

The first transistor 154 is controlled by a global column selection replica signal GYR1, the second transistor 155 is controlled by a local column selection replica signal LYR1, and the third transistor 152 is controlled by a main word line replica signal MWR. That is, the first transistor 154 is a replica of a global column selector circuit, the second transistor 155 is a replica of a local column selector circuit, and the third transistor 152 is a replica of a main word line selector circuit. The first resistor 151 is a replica of a resistor of an active region of a substrate. With the above-described configuration, a path of the write current Icell2 when a reference cell is written may be replicated identically to that when a non-volatile memory cell is written.

In the illustrated embodiment of FIG. 37, it will be understood that the reference write driver 140 may be configured to include the elements 154 and 155. Further, it will be understood that the reference cell 110 may be configured to include the elements 151, 152, and 153.

Figure 38:
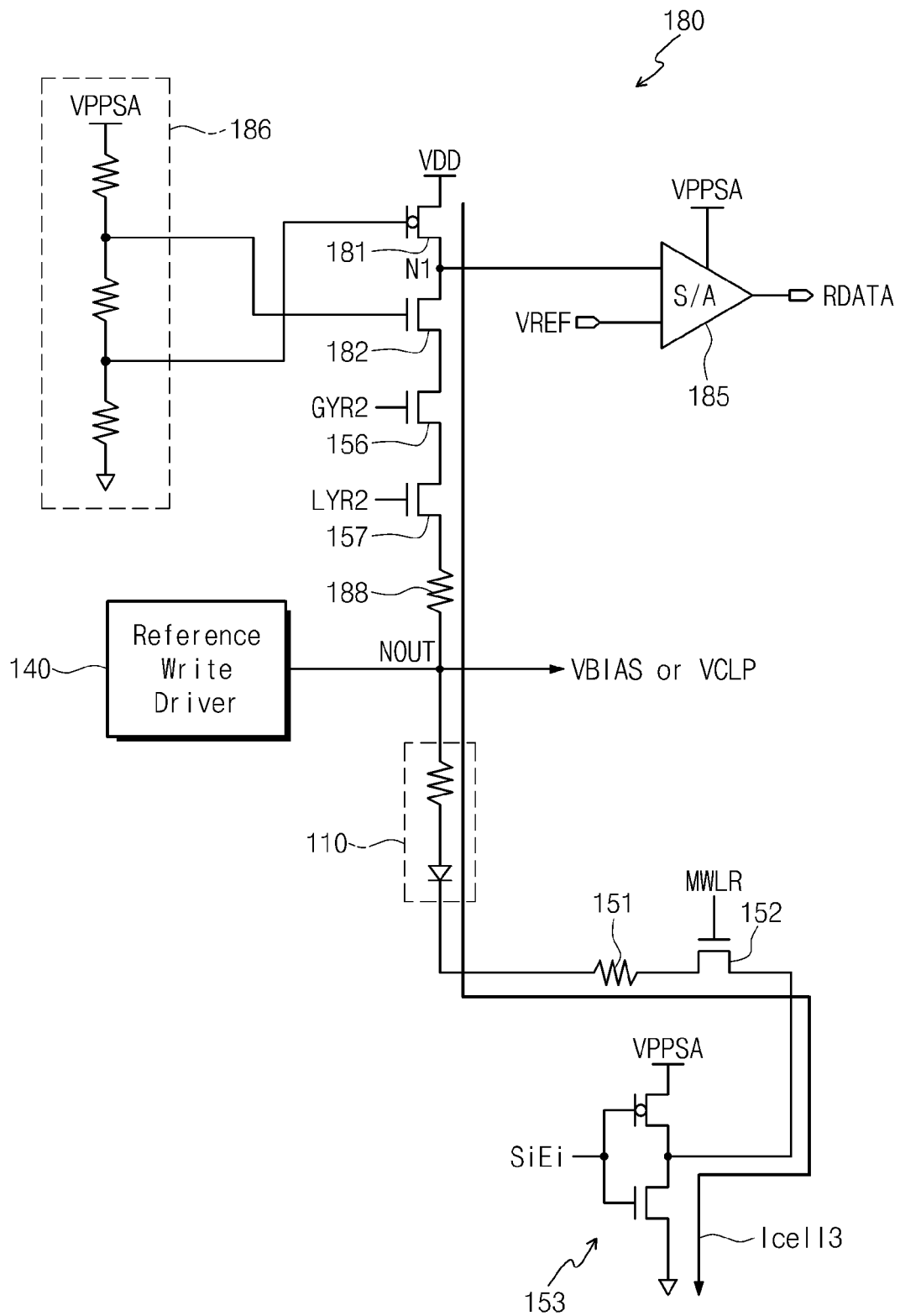
FIG. 38 is a circuit diagram further illustrating the reference read circuit illustrated of FIG. 36.

FIG. 38 is a circuit diagram further illustrating the reference read circuit of FIG. 36.

Referring to FIG. 38, the reference read circuit 180 comprises a fourth transistor 181, a fifth transistor 182, a sense amplifier 185, a resistor string 186, and the second resistor 188.

The transistors 181 and 182 are serially connected between a boosted voltage VPPSA and an output node NOUT. The resistor string 186 is connected between the boosted voltage VPPSA and ground, and provides the first voltage and the second voltage. The first voltage is applied to a gate of the fourth transistor 181, and the second voltage is applied to a gate of the fifth transistor 182. Herein, the fourth transistor 181 may be a replica of a compensation circuit (14, refer to FIG. 22), and the fifth transistor 182 may be a replica of a clamp circuit (16, refer to FIG. 22). The second resistor 188 may be a replica of a bit line.

As described above, read current Icell3 may be obtained from ground voltage via the fourth transistor 181, the fifth transistor 182, the sixth transistor 156, the seventh transistor 157, the second resistor 188, a reference cell 119, the first resistor 151, the third transistor 152, and an inverter 153.

Herein, the sixth transistor 156 is controlled by a global column selection replica signal GYR2, and the seventh transistor 157 is controlled by a local column selection replica signal LYR2. That is, the sixth transistor 156 may be a replica of a global column selector circuit, and the seventh transistor 157 may be a replica of a local column selector circuit. With the above-described configuration, a path of the read current Icell3 when a reference cell is read may be replicated identically to that when a non-volatile memory cell is read.

The sense amplifier 185 compares the voltage level apparent at node N1 with a reference voltage VREF to output reference data RDATA. It may thus be determined whether the reference cell 110 has the desired resistance based on the reference data RDATA. If no reference cell 110 has a desired resistance, a write operation may be iterated. If the reference cell 110 has a desired resistance, the compensation or clamp control signal VBIAS or VCLP may be provided through the output node NOUT. For example, it is possible to provide a voltage to the output node NOUT directly as the compensation or clamp control signal VBIAS or VCLP. Alternatively, a voltage apparent at the output node NOUT may be adjusted by trimming, and the adjusted result provided as the compensation or clamp control signal VBIAS or VCLP. This will be described in some additional detail hereafter with reference to FIG. 40.

Alternatively, a voltage provided at the output node NOUT may be adjusted by controlling a resistance of the second resistor 188. This is because a voltage provided to the output node NOUT is a voltage divided by resistances of the second resistor 188 and the reference cell 110. At this time, it is assumed that resistances of elements 181, 182, 156, 157, and 152 are very small. Accordingly, since the resistance of the reference cell 110 is determined in relation to a write operation, it is possible to easily adjust a voltage provided to the output node NOUT by controlling a resistance of the second resistor 188 during the fabrication process.

Figure 39:
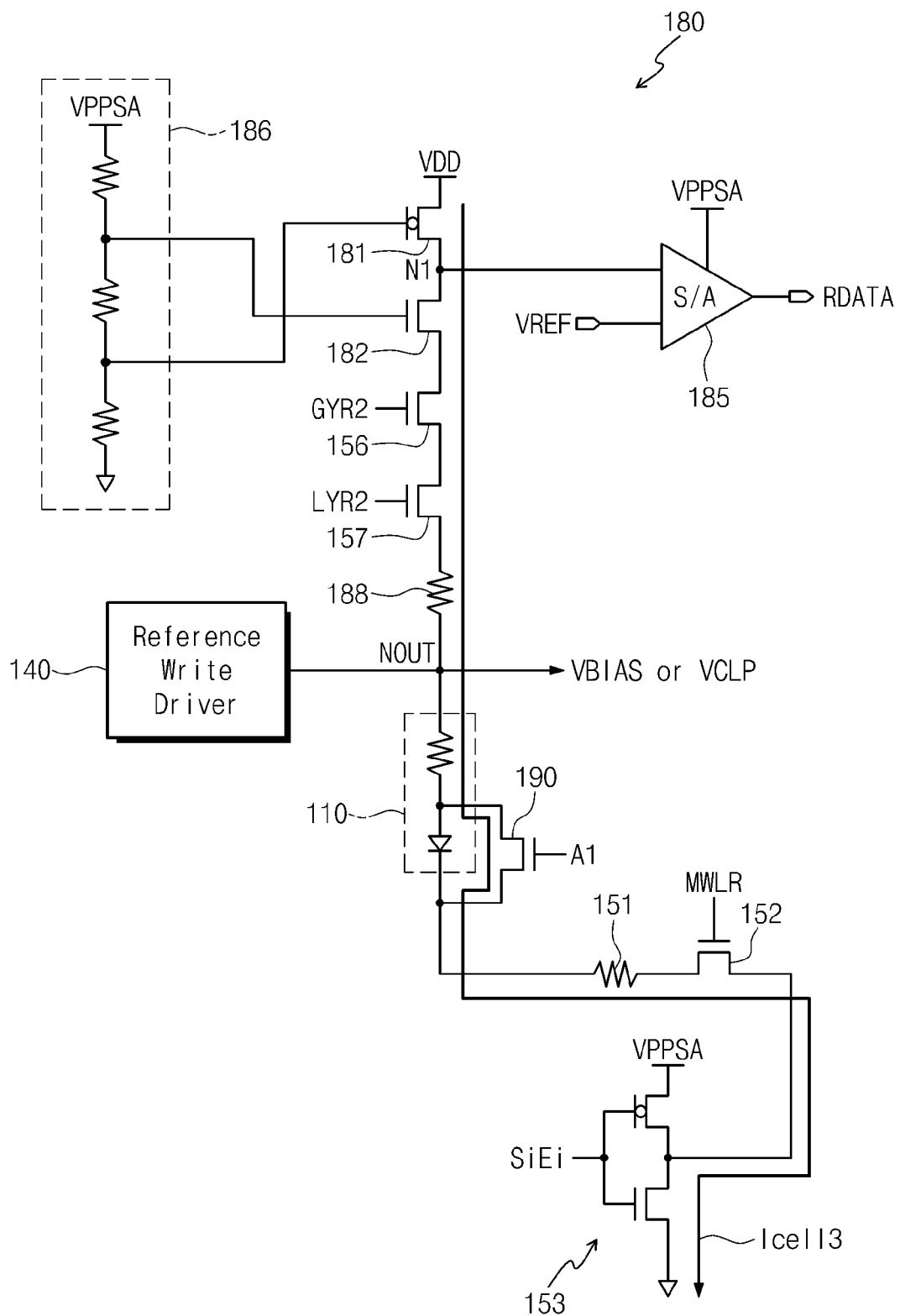
FIG. 39 is a circuit diagram further illustrating the reference read circuit illustrated of FIG. 36 according to an embodiment of the inventive concept.

FIG. 39 is a circuit diagram illustrating the reference read circuit of FIG. 36 according to another embodiment of the inventive concept. The circuit illustrated in FIG. 39 is identical to that of FIG. 38, except that a bypass circuit 190 is added. When reading the reference cell 110, the bypass circuit 190 may be turned ON in response to a control signal A1. Thus, the read current Icell3 will pass through a resistance variable element, but will bypass the corresponding access element (i.e., the diode).

In a case where no reference cell 110 has the desired resistance, a write operation may be iterated. Thus, it is preferable to reduce read time. The bypass circuit 190 is used to reduce a time when the read current Icell3 passes an n-type semiconductor of a diode. As a result, overall read time is reduced. On the other hand, the bypass circuit 190 is turned OFF when a write operation is performed so that the current may flow to an access element (i.e., the diode).

Figure 40:
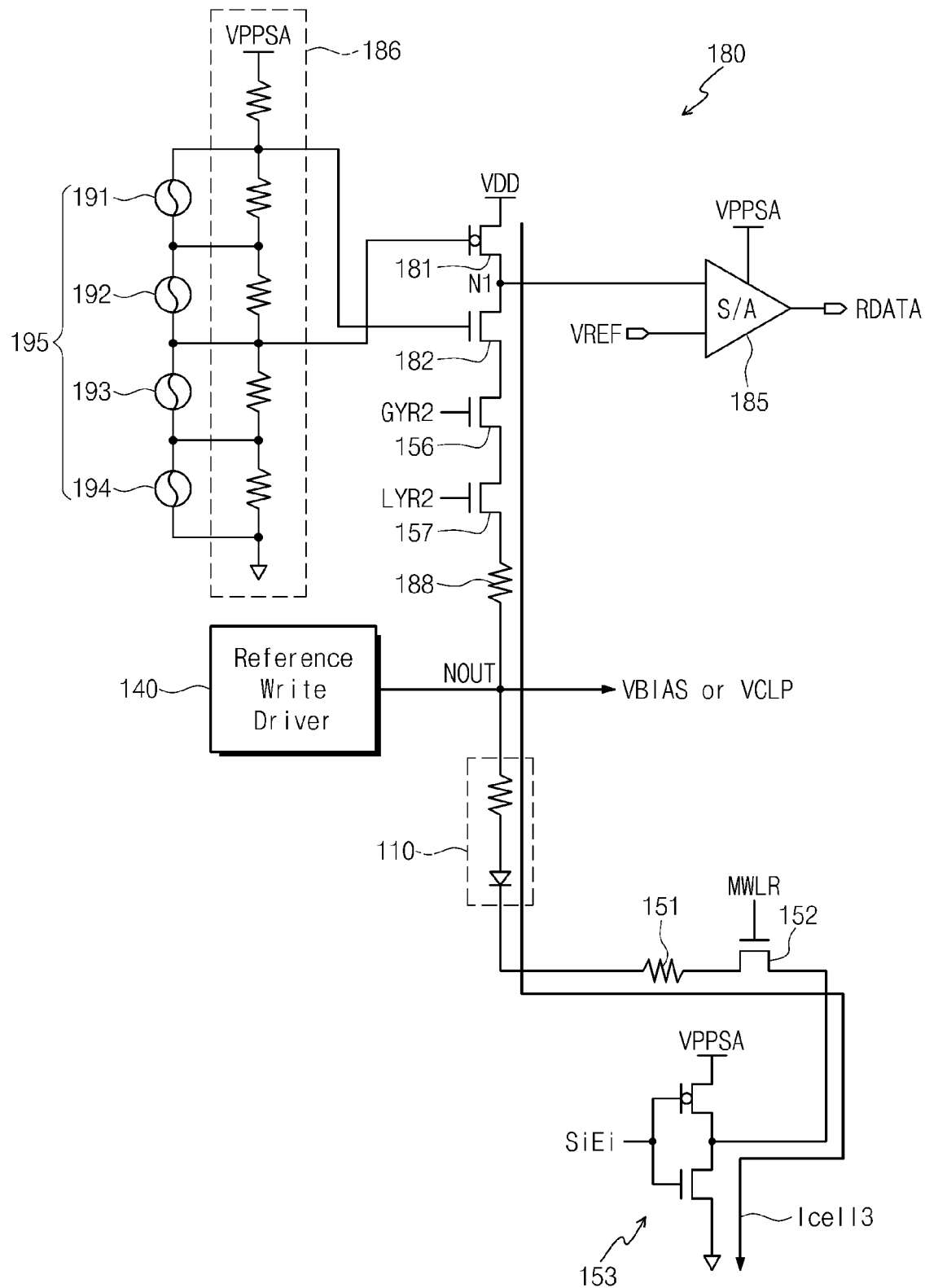
FIG. 40 is a circuit diagram further illustrating the reference read circuit of FIG. 36 according to another embodiment of the inventive concept.

FIG. 40 is a circuit diagram illustrating the reference read circuit of FIG. 36 according to yet another embodiment of the inventive concept. The circuit of FIG. 40 is configured identical to that of FIG. 38, except a trimming circuit 195 has been added. As illustrated, the trimming circuit 195 comprises a plurality of fuses 181 through 194.

With this configuration, it is possible to adjust the voltage levels applied to the fourth and fifth transistors 181 and 182 by cutting at least one of the plurality of fuses 191 to 194 using a Mode Register Set (MRS). With the trimming circuit 195, it is also possible to adjust a voltage of the compensation control signal VBIAS or the clamp control signal VCLP provided via the output node NOUT. That is, although the reference cell 110 is set to a desired resistance, the trimming circuit 195 can be used when fine adjustment for the voltage of the compensation or clamp control signal VBIAS or VCLP is necessary.

Figure 41:
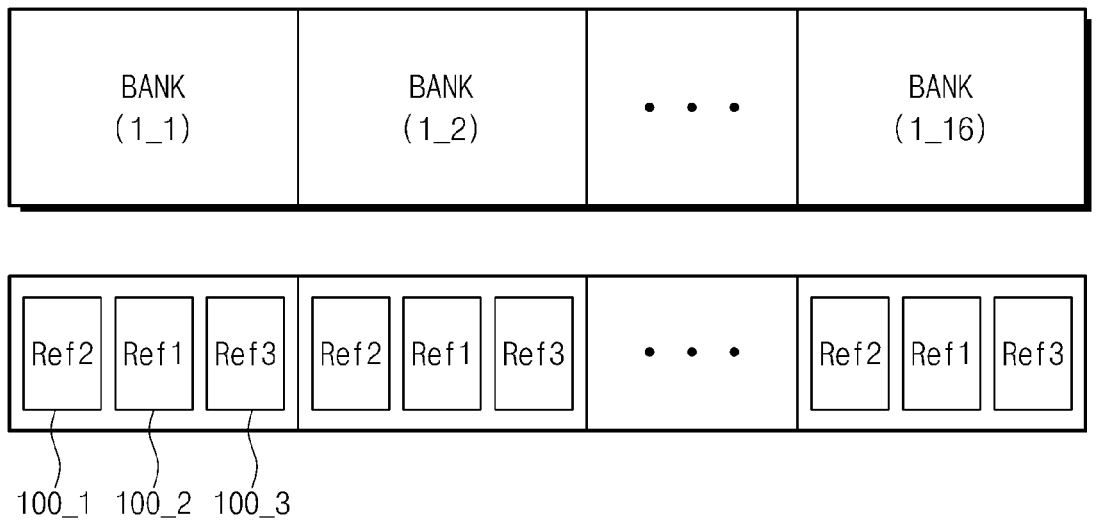
FIG. 41 is a diagram for illustrating a non-volatile memory device according to still another embodiment of the inventive concept.

FIG. 41 is a conceptual block diagram illustrating a non-volatile memory device according to still another embodiment of the inventive concept. Referring to FIG. 41, reference sets may be provided to correspond to a plurality of memory banks 1_1 to 1_16, respectively. As described above, when a non-volatile memory cell is a 2-bit level cell, three reference cells are needed. The reference cells may store resistance values corresponding to Ref1, Ref2, and Ref3 resistance distributions, respectively. Accordingly, as illustrated in FIG. 41, three temperature compensation circuits 100_1, 100_2, and 100_3 may be disposed in relation to each memory bank. Each of the temperature compensation circuits 100_1, 100_2, and 100_3 may include a corresponding one of three reference cells.

Figure 42:
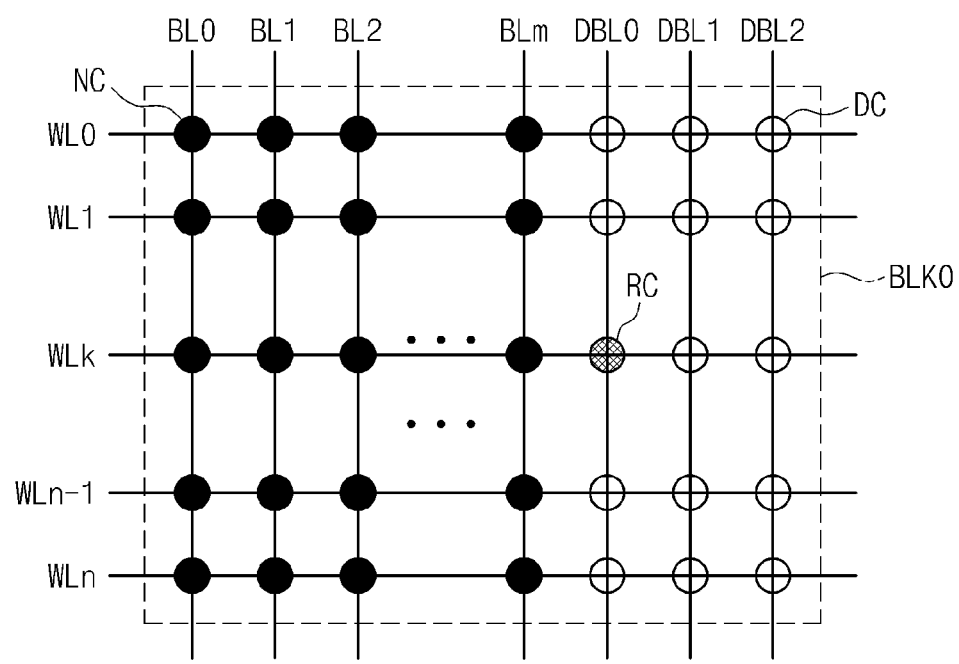
FIGS. 42 and 43 are diagrams illustrating a non-volatile memory device according to still another embodiment of the inventive concept.
Figure 43:
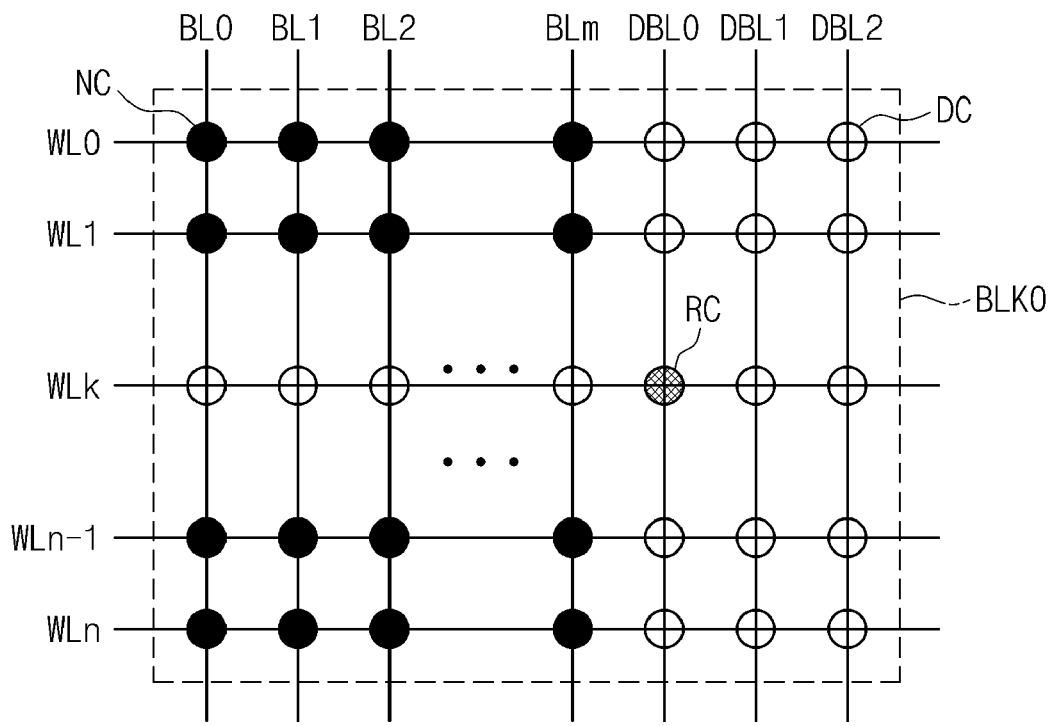

FIGS. 42 and 43 are memory array diagrams further describing a non-volatile memory device according to an embodiment of the inventive concept. In FIGS. 42 and 43, there is illustrated one memory block BLK0, in which the above-described one or more reference cells are disposed.

Referring to FIG. 42, normal memory cells NC are arranged in a matrix of word lines WL0 to WLn and bit lines BL0 to BLm. Further, dummy memory cells DC are arranged in a matrix of word lines WL0 to WLn and dummy bit lines DBL0 to DBL2. A reference cell RC is disposed to be connected with a word line WLk and a dumpy bit line DBL0.

Herein, the normal memory cells NC are used to store, while data is not stored in the dummy memory cells. As described above, the reference cell RC is used to adjust the amount of compensation or clamp current, that is, to reflect operating temperature variation.

As illustrated in FIG. 42, the reference cell RC may be disposed at a center portion of the dummy bit line DBL0 to prevent the edge loading.

As illustrated in FIG. 43, no normal cells NC are connected with a word line WLk which is connected with the reference cell RC. That is, the word line WLk is only connected with the reference cell RC and dummy memory cells DC.

When reading data from normal memory cells NC in the memory block BLK0, the reference cell RC can be read at the same time. For this reason, a word line WLk connected with the reference cell RC may be grounded very frequently. In this case, if the word line WLk is connected with normal memory cells NC, the normal memory cells NC may be affected poorly. Thus, no normal memory cells NC may be connected with the word line WLk to which the reference cell RC is connected.

Figure 44:
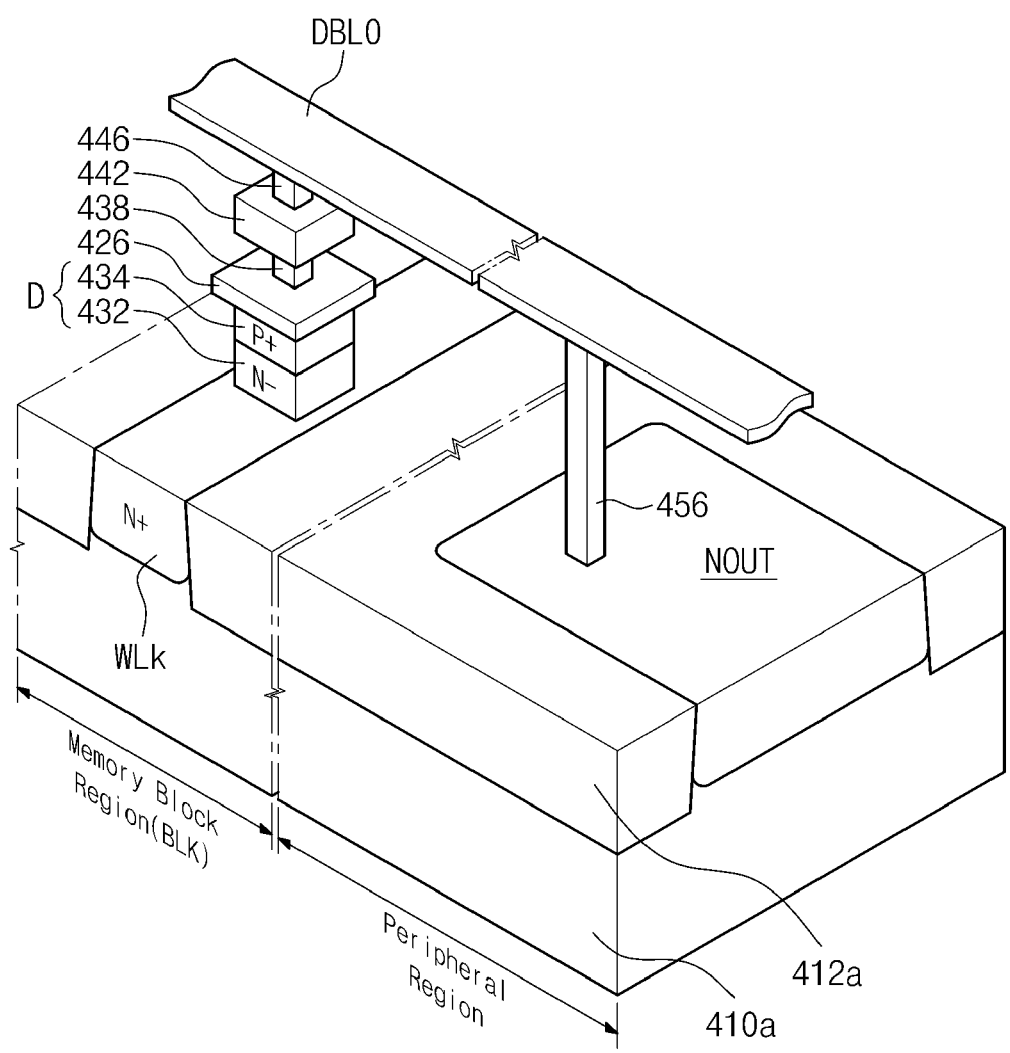
FIG. 44 is a perspective view illustrating a non-volatile memory device according to still another embodiment of the inventive concept.
Figure 45:
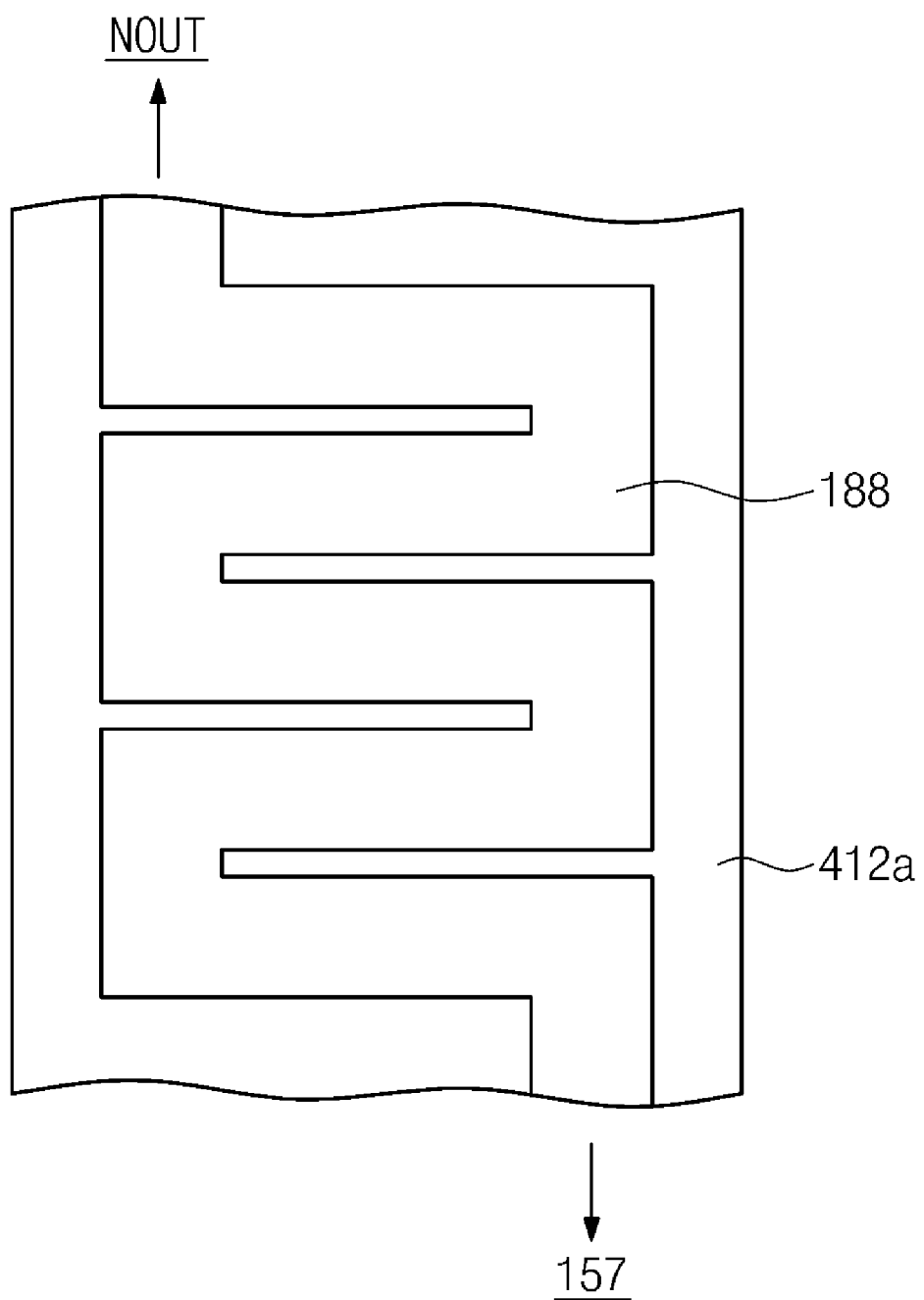
FIG. 45 is a layout diagram illustrating the second resistor used of a non-volatile memory device according to an embodiment of the inventive concept.

FIG. 44 is a perspective view further describing a non-volatile memory device according to an embodiment of the inventive concept. FIG. 45 is a layout diagram further illustrating an example in which the second resistor 188 used at a non-volatile memory device according to an embodiment of the inventive concept is implemented.

Referring to FIG. 44, if a reference cell RC is disposed within a memory block BLK0 as described in FIGS. 42 and 43, a reference write driver 140 and a reference read circuit 180 may be disposed within a peripheral region (refer to FIG. 20).

A plurality of active regions may be defined by forming a device isolation region 412a within a substrate 410 having the first conduction type (e.g., P-type). For example, an active region formed within a memory block BLK0 may be extended into the first direction. A word line WLk may be formed by implanting impurities having the second conduction type (e.g., N-type) into the active region of the memory block BLK0. The substrate 410a may be a silicon substrate, an SOI substrate, a GaAs substrate, a SiGe substrate, or the like.

A method of forming the word line WLk is not limited to this disclosure. For example, the word line WLk can be formed using an epitaxial growth process.

A diode D may be formed by forming the first and second semiconductor patterns 432 and 434 on the word line WLk. For example, the first and second semiconductor patterns 432 and 434 may be formed by forming a mold pattern on the substrate 410, forming a semiconductor pattern along the mold pattern using a selective epitaxial growth manner or a solid phase epitaxial manner, and implanting impurities to the semiconductor pattern.

And then, an ohmic contact layer 436 is formed on the diode D. For example, the ohmic contact layer 436 may be formed of a metal material, such as tungsten. Further, the ohmic contact layer 436 may be formed by certain well understood deposition processes, such as PVD, CVD, ALD, and the like.

A bottom electrode contact 438 is formed on the ohmic contact layer 436. The bottom electrode contact 438 may be formed of at least material selected from a group of materials, such as TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON, or TaON.

A phase change material 442 is formed on the bottom electrode contact 438. A top electrode contact (TEC) 446 is formed on the phase change material 442. The top electrode contact 446 may be eliminated, if the need arises.

A dummy bit line DBL0 may be formed on the top electrode contact 446 so as to be extended in the second direction different from the first direction. That is, the word line WLk and the dummy bit line DBL0 may be disposed in an intersecting manner. It is possible to extend the dummy bit line DBL0 to a peripheral circuit region. The dummy bit line DBL0 may be formed from aluminum or copper, for example, and be a metal wire formed at the lowest level.

It is possible to connected an active region (i.e., a region corresponding to an output node NOUT) of the peripheral circuit region and the dummy bit line DBL0 using a contact 456. In certain embodiments of the inventive concept, the contact 456 may be formed by vertically stacking a plurality of contacts.

The second resistor 188 may be implemented using a variety of different fabrication techniques and in a number of different geometries. For example, as illustrated in FIG. 45, the second resistor 188 may be formed as an active region disposed on the substrate 410 in a zigzag pattern. That is, the second resistor 188 can be formed as an active region between a region where the output node NOUT is formed, and a region where the seventh transistor 157 is formed. It is possible to adjust a size of the second resistor 188 by determining a physical length of an active region via iteration of the zigzag pattern.

Figure 46:
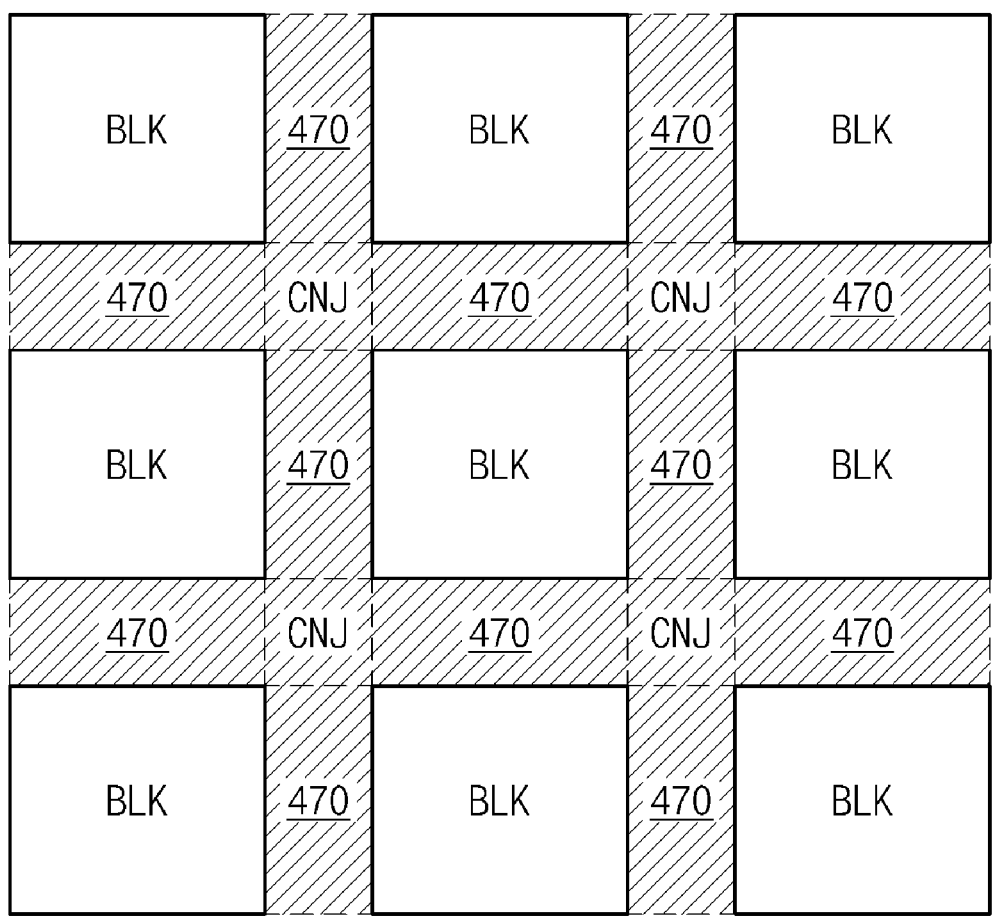
FIG. 46 is a layout diagram illustrating a non-volatile memory device according to still another embodiment of the inventive concept.
Figure 47:
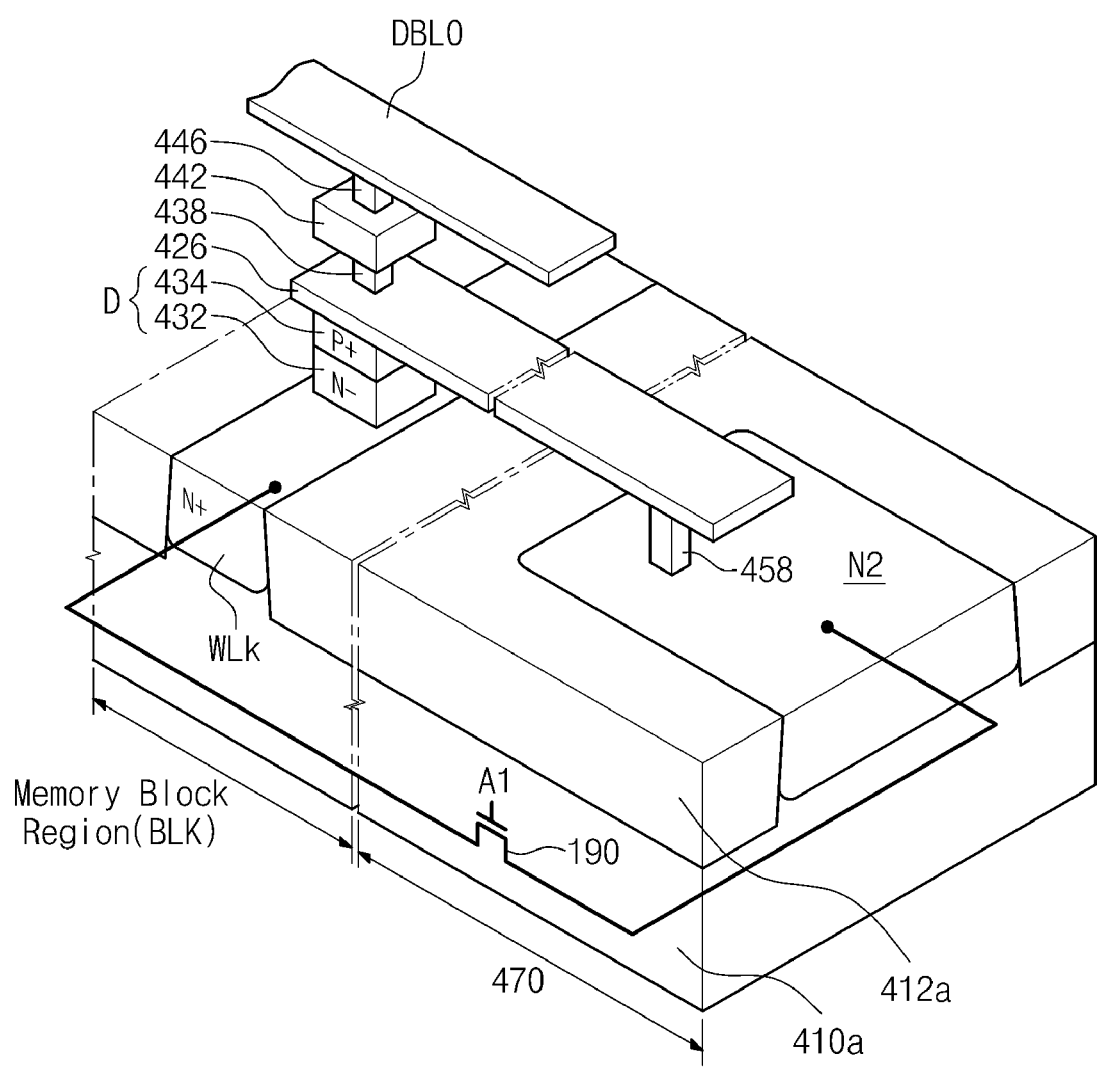
FIG. 47 is a perspective view for illustrating a non-volatile memory device according to still another embodiment of the inventive concept.

FIG. 46 is a layout diagram further illustrating a non-volatile memory device according to an embodiment of the inventive concept. FIG. 47 is a perspective view still further describing the non-volatile memory device.

Referring to FIG. 46, a plurality of memory blocks BLK are disposed in a 3×3 matrix, for example. Regions 470 for disposing a local column selector circuit are disposed between memory blocks BLK, and conjunction regions CNJ are disposed between neighboring regions 470.

A reference cell RC may be disposed within a memory block BLK, and a bypass circuit 190 (refer to FIG. 39) may be disposed within the region 470 or the conjunction region CNJ.

In FIG. 47, there is illustrated a case wherein the bypass circuit 190 is formed within the region 470. Referring to FIG. 47, an ohmic contact layer 437 connected with a reference cell RC is formed to be extended from a memory block region to a region 470. A node N2 formed in an active region 470 may be connected with the ohmic contact layer 437 via a contact 458. The bypass circuit 190 is formed within the region 470 and connected between the node N2 and a word line WLk.

Figure 48:
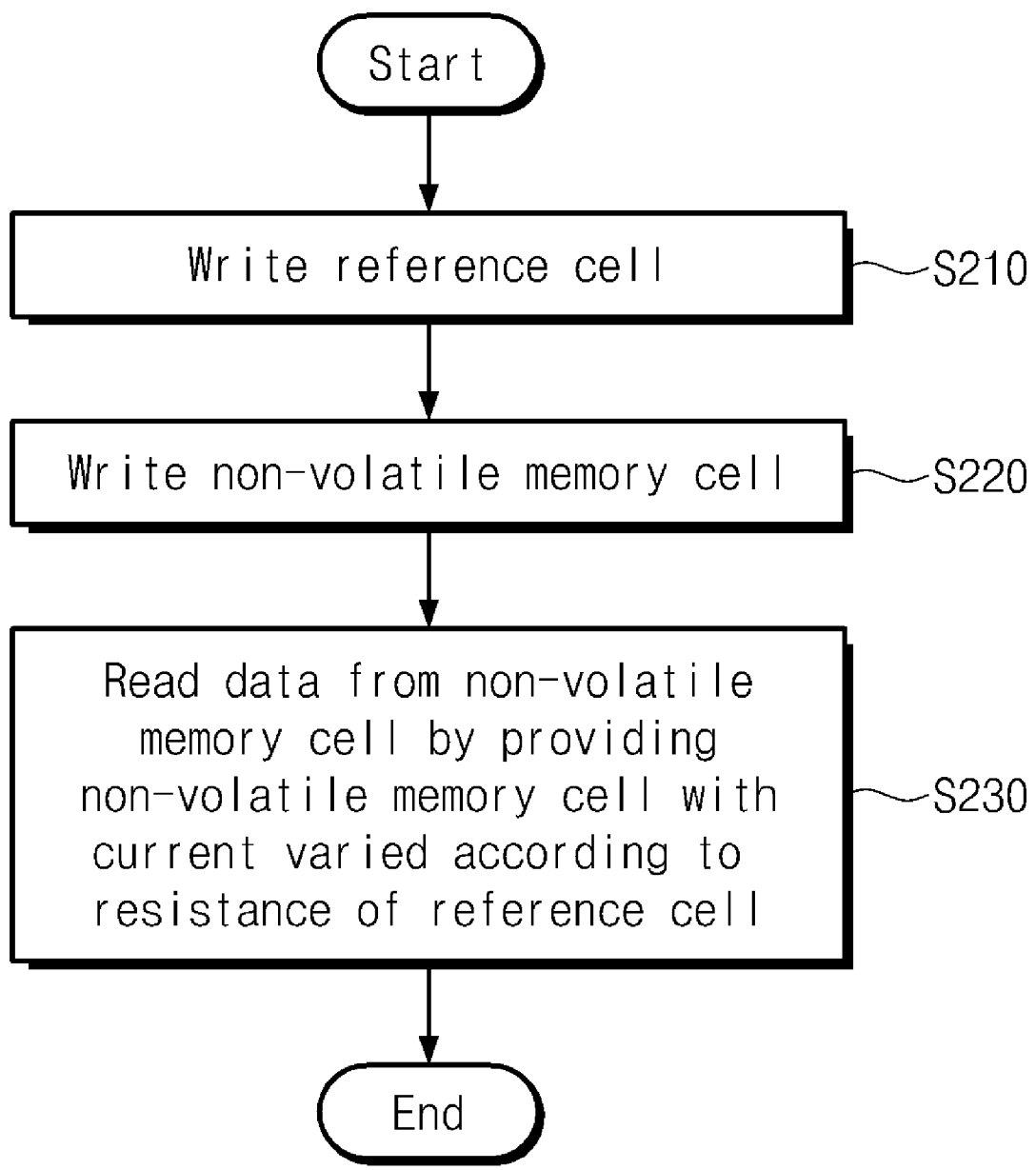
FIG. 48 is a diagram for describing a driving method for a non-volatile memory device according to certain embodiments of the inventive concept.

FIG. 48 is a flowchart summarizing a driving method for a non-volatile memory device according to an embodiment of the inventive concept. Description of the driving method assumes a memory cell array including m-bit level memory cells and a reference set including ($2^m-1$) reference cells.

First, the ($2^m-1$) reference cells in the reference set are written to such that different resistance distributions are achieved (S210). For example, when the m-bit level cell is a 2-bit level cell, the reference set includes three reference cells, which store resistances corresponding to Ref1, Ref2, and Ref3 resistance distributions, respectively. Then, data is written to the non-volatile memory cell (S220).

Thereafter, data is read from the non-volatile memory cell by providing the memory cell with current that varies according to the resistance of a corresponding reference cell of the ($2^m-1$) reference cells (S230). For example, data may be read by sequentially providing the non-volatile memory cell with compensation current variable according to resistances of Ref1, Ref2, and Ref3 resistance distributions.

Figure 49:
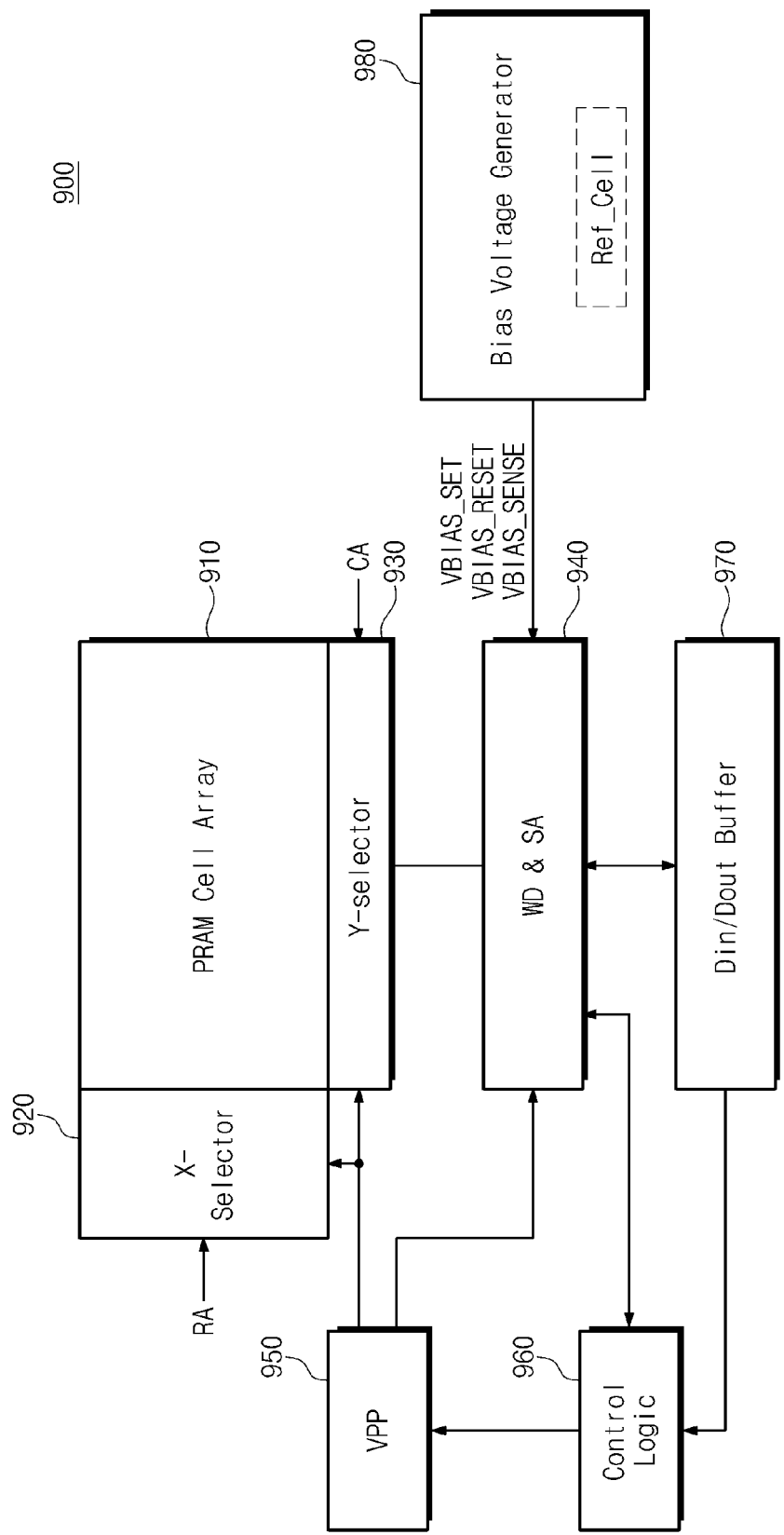
FIG. 49 is a block diagram illustrating a phase change memory device according to another embodiment of the inventive concept.

FIG. 49 is a block diagram illustrating a phase change memory device according to another embodiment of the inventive concept.

Referring to FIG. 49, as a non-volatile memory device, a phase change memory device 900 may include a memory cell array 910, a row selector circuit 920, a column selector circuit 930, a block 940 (hereinafter, referred to as a write driver and sense amplifier block) including write drivers WD and sense amplifiers SA, a high voltage generator circuit 950, control logic 960, a data input/output buffer circuit 970, and a bias voltage generator circuit 980. Elements 910 to 970 in FIG. 49 may be identical to those in one of FIGS. 5, 13, and 15, and description thereof is thus omitted. Further, the write driver and sense amplifier block 940 in FIG. 49 may be formed of that illustrated in FIG. 21. In this case, the phase change memory device 900 may further comprise the temperature sensor 20, compensation control signal generator circuit 30, clamp control signal generator circuit 40, and compensation circuit 14. Alternatively, the phase change memory device 900 in FIG. 49 can be configured to further include the temperature compensation circuit 100 of FIG. 35. In this case, the block 940 in FIG. 49 may be configured to include sense amplifiers (or, data read circuits) each of which has a corresponding compensation circuit 14, as illustrated in FIG. 21.

The bias voltage generator circuit 970 may be configured to generate bias voltages VBIAS_SET, VBIAS_RESET, and VBIAS_SENSE which are to be supplied to the write driver and sense amplifier block 940 at a read operation (for example, a normal or verify read operation). For example, the bias voltages VBIAS_SET, VBIAS_RESET, and VBIAS_SENSE may be applied to sense amplifiers. The write driver and sense amplifier block 940 supplied with the bias voltages VBIAS_SET, VBIAS_RESET, and VBIAS_SENSE may include sense amplifiers VSA (refer to FIG. 5) configured to perform a verify read operation and sense amplifiers RSA (refer to FIG. 5) configured to perform a normal read operation. Alternatively, the write driver and sense amplifier block 940 may include sense amplifiers configured to perform a normal read operation and a verify read operation in common. As set forth above, the bias voltage VBIAS_SET is used to generate verify current I_SET (refer to FIG. 4) for a set state, and the bias voltage VBIAS_RESET is used to generate verify current I_RESET (refer to FIG. 4) for a reset state. The bias voltage VBIAS_SENSE is used to generate sense current I_CELL for judging a set state and a reset state. Further, the bias voltage generator circuit 980 may be configured to generate the bias voltage DC_BIAS to be supplied to write drivers. As set forth above, the bias voltage DC_BIAS may increase stepwise at iteration of write loops.

As described above, resistances of memory cells may vary according to a temperature. In the event that resistances of memory cells vary, if the bias voltages do not vary according to the temperature, read error may arise. This may become more serious at a phase change memory device which stores multi-bit data. To solve this problem, the bias voltage generator circuit 980 according to an embodiment of the inventive concept may be configured to generate the bias voltages VBIAS_SET, VBIAS_RESET, and VBIAS_SENSE which are variable according to the temperature. The bias voltages VBIAS_SET, VBIAS_RESET, and VBIAS_SENSE may be generated by reference cells to reflect variation of cell resistances according to the temperature. Reference cells of the bias voltage generator circuit 980 may be programmed to have resistance values (for example, refer to a graph in FIG. 4) each corresponding to the bias voltages VBIAS_SET, VBIAS_RESET, and VBIAS_SENSE. Programming of the reference cells may be made in the same manner as described in any one of FIGS. 36 to 40, and description thereof is thus omitted. Increase in the operating temperature may cause reduction in the resistance values of memory cells each having one of set and reset states, thus increasing the amount of current flowing though the memory cell. Thus, the bias voltages may be adjusted such that the amount of current supplied to the memory cell is increased.

In the illustrated embodiment, the reference cells of the bias voltage generator circuit 980 may be formed with the same structure as PRAM cells in the memory cell array 910. This means that resistances of the reference cells vary identically with resistances of memory cells varied in relation to operating temperature. As resistances of the reference cells vary according to the operating temperature, the bias voltages VBIAS_SET, VBIAS_RESET, and VBIAS_SENSE may vary according to operating temperature. Thus, it is possible to perform normal and verify read operations stably.

Figure 50:
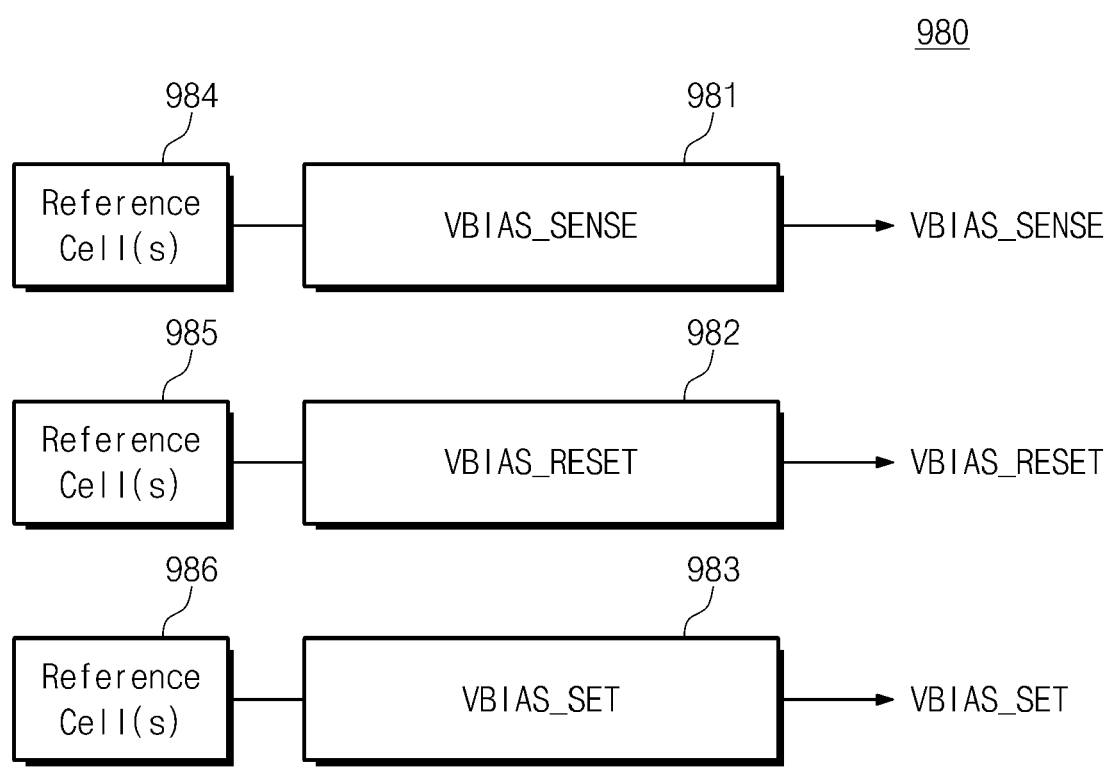
FIG. 50 is a block diagram further illustrating the bias voltage generator circuit of FIG. 49.

FIG. 50 is a block diagram further illustrating the bias voltage generator circuit of FIG. 49. And FIG. 51 further illustrates related bias voltages that vary with operating temperature.

Referring to FIG. 50, the bias voltage generator circuit 980 comprises a plurality of (e.g.) the first, second and third voltage generators 981, 982, and 983. The first voltage generator 981 is connected with at least one reference cell 984 and programs the reference cell 984 to have a resistance value corresponding to a bias voltage VBIAS_SENSE. The first voltage generator 981 generates the bias voltage VBIAS_SENSE corresponding to a resistance value of the reference cell 984. In a case where 1-bit data is stored in a memory cell being a PRAM cell, the first voltage generator 981 may be connected with one reference cell having a resistance value corresponding to the bias voltage VBIAS_SENSE1 (refer to FIG. 51). On the other hand, if multi-bit data is stored in a memory cell, the first voltage generator 981 may be connected with a plurality of reference cells having resistance values each corresponding to the bias voltages VBIAS_SENSE1 to VBIAS_SENSEm (refer to FIG. 51). Reset state distributions may be determined according to the number of data bits which are stored in each memory cell. For example, in the event that 2-bit data is stored in each memory cell, the reset state distributions a MSB/full reset state distribution and two intermediate reset state distributions between the MSB/full reset state distribution and a set state distribution.

The second voltage generator 982 is connected with at least one reference cell 985 and programs the reference cell 985 to have a resistance value corresponding to a bias voltage VBIAS_RESET. The second voltage generator 982 may generate the bias voltage VBIAS_RESET corresponding to a resistance value of the reference cell 985. In a case where 1-bit data is stored in a memory cell being a PRAM cell, the second voltage generator 982 may be connected with one reference cell having a resistance value corresponding to the bias voltage VBIAS_RESET1 (refer to FIG. 51). On the other hand, if multi-bit data is stored in a memory cell, the second voltage generator 982 may be connected with a plurality of reference cells having resistance values each corresponding to the bias voltages VBIAS_RESET1 to VBIAS_RESEtm (refer to FIG. 51).

The third voltage generator 983 is connected with at least one reference cell 986 and programs the reference cell 985 to have a resistance value corresponding to a bias voltage VBIAS_SET. The third voltage generator 983 may generate the bias voltage VBIAS_SET corresponding to a resistance value of the reference cell 986. In a case where 1-bit data is stored in a memory cell being a PRAM cell, the third voltage generator 983 may be connected with one reference cell having a resistance value corresponding to the bias voltage VBIAS_SET1 (refer to FIG. 51). On the other hand, if multi-bit data is stored in a memory cell, the third voltage generator 983 may be connected with a plurality of reference cells having resistance values each corresponding to the bias voltages VBIAS_SET1 to VBIAS_SETm (refer to FIG. 51).

In an embodiment, the first voltage generator 981 may be configured to program the reference cell(s) and to read the state(s) of the reference cell(s) as described above. For example, the first voltage generator 981 may be configured to include a reference write driver 140 in FIG. 37 and a reference read circuit 180 in FIG. 38, FIG. 39, or FIG. 40. The number of reference write drivers and reference read circuits may be determined according to the number of bits stored in a memory cell. For example, if 1-bit data is stored in a memory cell, the first voltage generator 981 may be configured to include one reference write driver and one reference read circuit. If 2-bit data is stored in a memory cell, the first voltage generator 981 may be configured to include three reference write drivers and three reference read circuits. Alternatively, if 2-bit data is stored in a memory cell, the first voltage generator 981 can be configured to include one reference write driver and one reference read circuit. In this case, the number of write current provided from a reference write driver, the amount of sense current provided from a reference read circuit, and a reference voltage of a reference read circuit may be changed according to resistance values of reference cells. The second and third voltage generators 982 and 983 may be configured the same as the first voltage generator 981.

Figure 51:
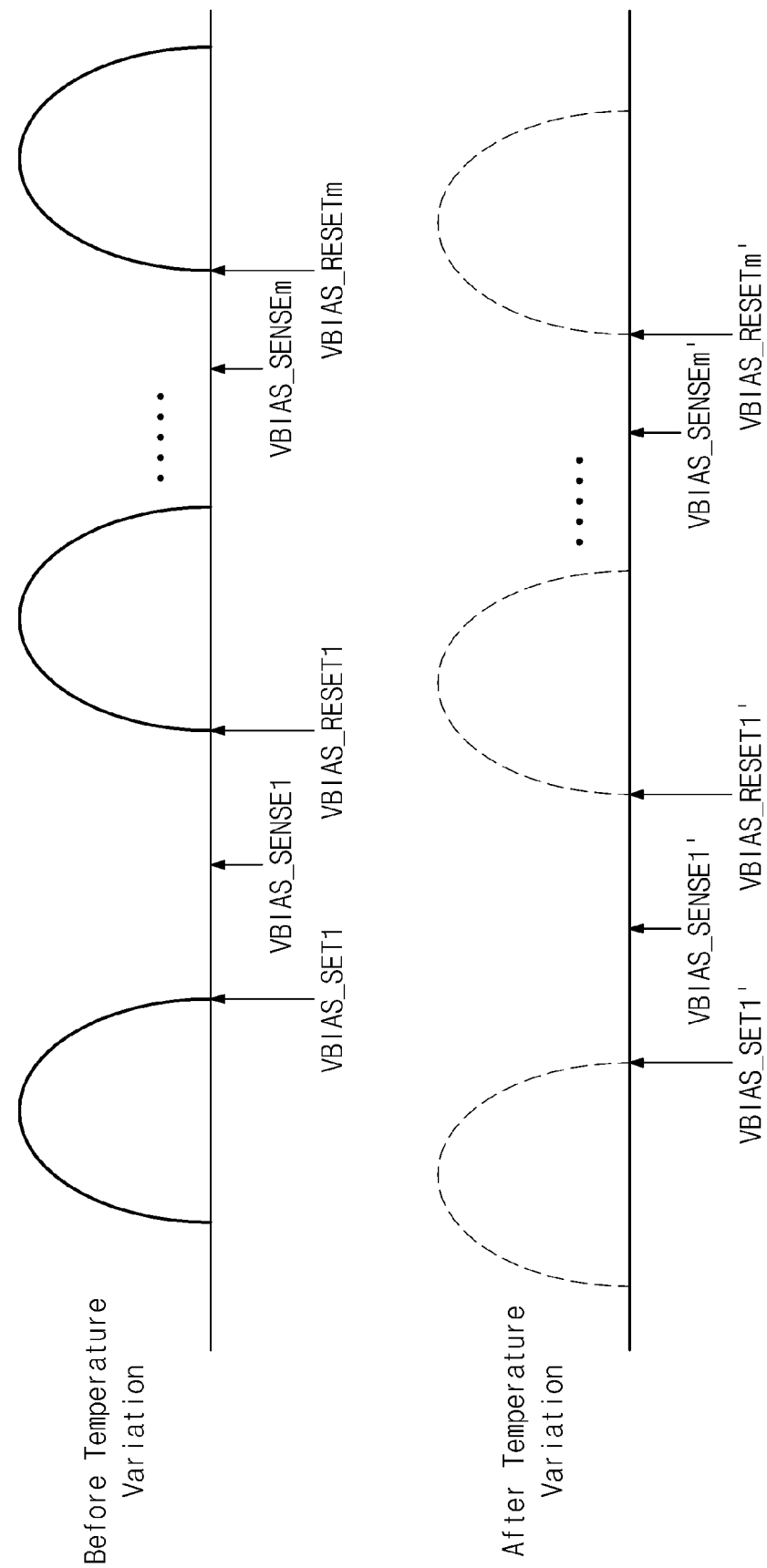
FIG. 51 is a diagram further illustrating bias voltages varied in accordance with temperature variations.

As set and reset state distributions are varied due to temperature variation as illustrated by a dotted line in FIG. 51, the bias voltage generator circuit 980 may generate bias voltages (VBIAS_SENSE1', VBIAS_RESET1', and VBIAS_SET1') or (VBIAS_SENSE1' to VBIAS_SENSEm', VBIAS_RESET1' to VBIAS_RESETm', and VBIAS_SET1' to VBIAS_SETm'), which are varied according to the temperature variation.

Although not illustrated in FIG. 50, the bias voltage generator circuit 980 may be configured to include a voltage generator for generating a bias voltage DC_BIAS to be supplied to a write driver. The voltage generator may be configured to generate the bias voltage DC_BIAS which increases stepwise at iteration of write loops.

Figure 52:
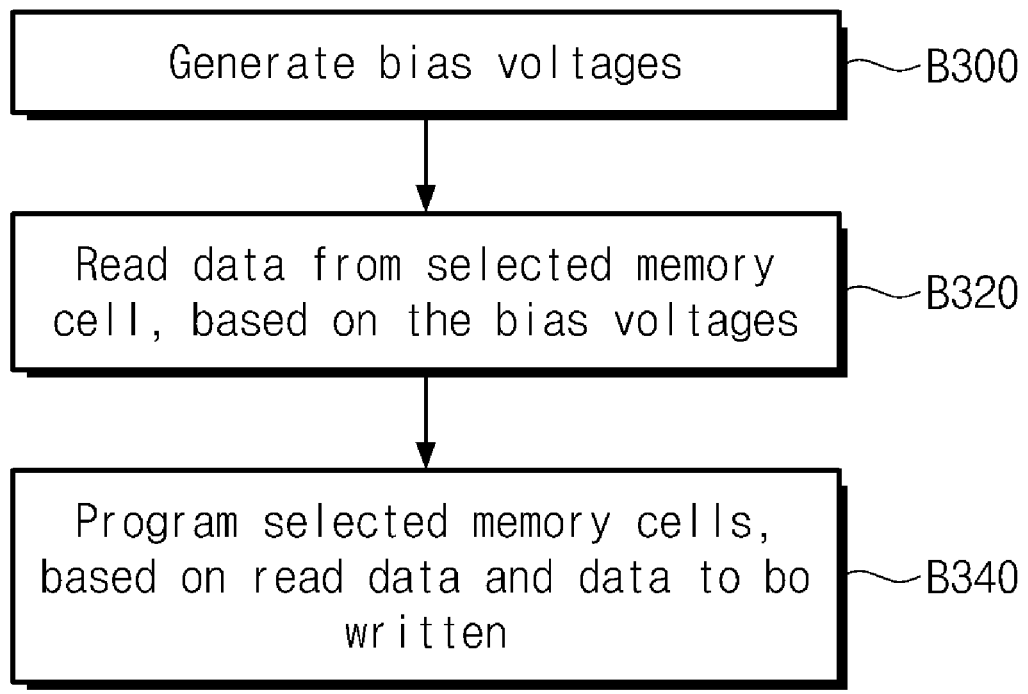
FIG. 52 is a flow chart summarizing a write method for the phase change memory device of FIG. 49.

FIG. 52 is a flow chart summarizing a write method applied to the phase change memory device of FIG. 49. Referring to FIG. 52, the write method for the phase change memory device may include generating bias voltage to be applied to sense amplifiers at a verify/normal read operation (B300); reading data from selected memory cells (that is, resistance-variable memory cells) based on the bias voltages (B320); and programming the selected memory cells based on the read data and program/write data (B340). Herein, the bias voltages may be generated using reference cells as described above. This means that the bias voltages vary according to temperature variation. Bias voltages to be used in the step B320 may include voltages VBIAS_RESET and VBIAS_SET necessary to generate verify currents I_RESET and I_SET. In case of a normal read operation, a bias voltage VBIAS_SENSE may be generated in the step B300.

In the illustrated embodiment, the step of reading data from selected memory cells based on the bias voltages (B320) may be carried out in the same manner the analogous step (B110) previously described in FIG. 3 and description thereof is thus omitted. The step of programming the selected memory cells based on the read data and program/write data (B340) may be carried out in the same manner as the analogous steps (B120 though B170) previously described in FIG. 3 and description thereof is thus omitted.

A PRAM cell may be set to a set state or a reset state by heating its phase change layer with Joule heat. At this time, a part of a phase change layer may go to a crystalline state (or, a set state) or an amorphous state (or, a reset state) due to a difference of the heating profile. A design rule of a phase change memory device has been scaled down increasingly. Scale-down of the design rule means that gaps between memory cells are reduced. This may cause the thermal coupling phenomenon. With the thermal coupling phenomenon, a phase change layer of an unselected memory cell adjacent to a selected memory cell may vary due to the Joule heat which is generated when the selected memory cell is programmed. This phenomenon may become more serious in proportion to scale-down of the design rule. In particular, a multi-bit phase change memory device may be much affected by the thermal coupling phenomenon, so that the reliability of the phase change memory device is lowered. This problem may be prevented or suppressed by determining bias voltages considering the thermal coupling phenomenon, which will be more fully described with reference to FIG. 53.

Figure 53:
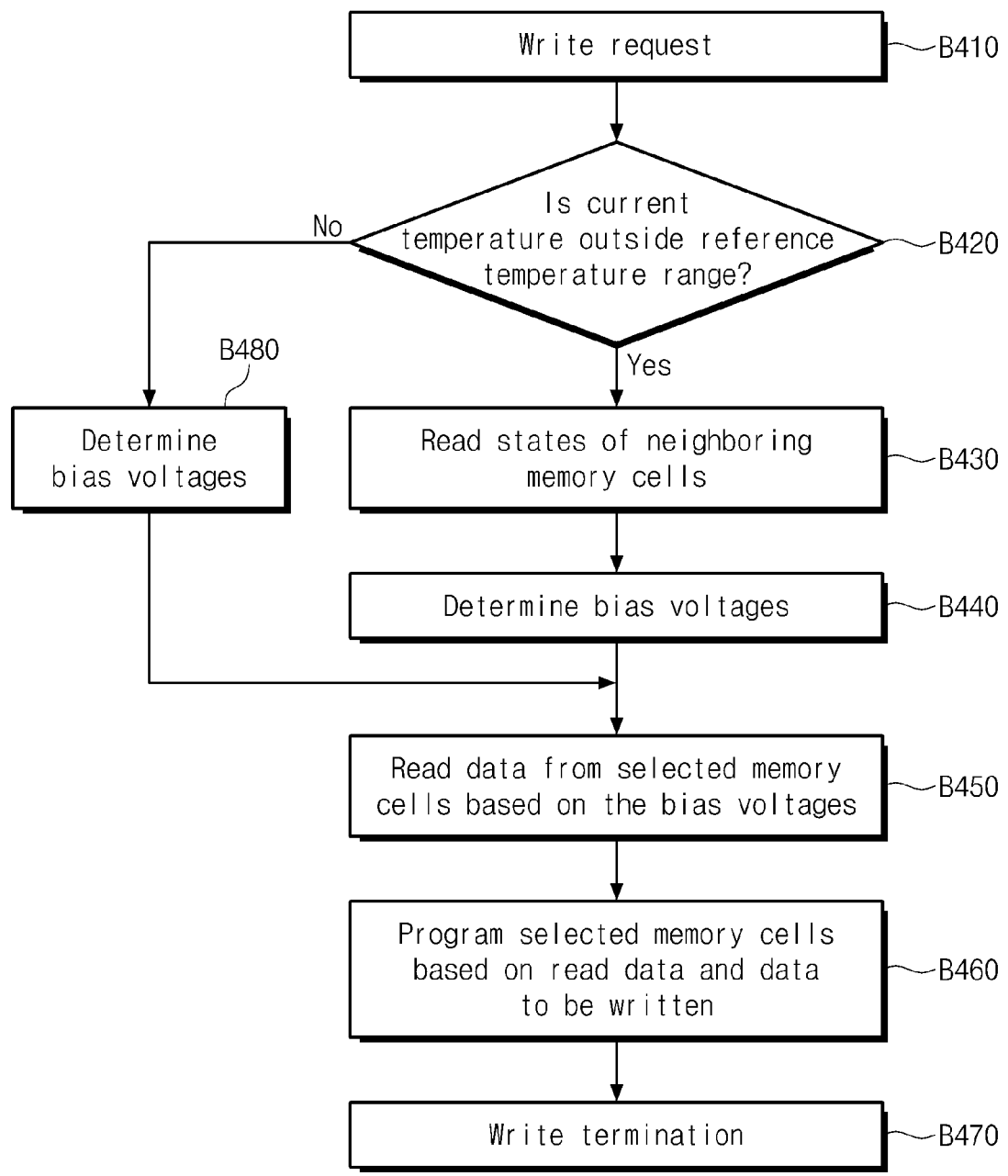
FIG. 53 is a flow chart summarizing a write method for a phase change memory device according to another embodiment of the inventive concept.

FIG. 53 is a flow chart summarizing a write method applied to a phase change memory device according to an embodiment of the inventive concept.

Referring to FIG. 53, upon receiving a write operation request (B410), it is first determined whether a current operating temperature is outside a reference operating temperature range (B420). This determination may be made using a temperature sensor 20 (refer to FIG. 21). If the current operating temperature is determined to be outside the reference temperature range, the state(s) of memory cell(s) proximate to (hereinafter, referred to as "neighboring cell(s)") the selected memory cell (hereinafter, referred to as the "target cell") (B430) are read. Then, bias voltages are determined according to the read cell states of the neighboring memory cells and the state of the target cell (B440).

In certain embodiments, the bias voltages may be determined differently according to cases, each indicating combination of a state of a neighboring cell and a state of a target cell, such as a set state and a set state, a set state and a reset state, a reset state and a set state, and a reset state and a reset state. The bias voltages may be generated using reference cells in the same manner as described in FIG. 50. Bias voltages may be selected according to the determined case. That is, bias voltages may be determined differently according to the determined case. Herein, the number of the bias voltages may be more than that described in FIG. 50.

If the current operating temperature is determined to be within the defined reference temperature range (S420=NO), then the bias voltages may be determined in the same manner as step B300 described above in relation to in FIG. 52 (B480).

However, determined, once the bias voltages have been determined, data is read from the selected memory cells based on the bias voltages (S450). Then, the selected memory cell may be programmed based on the read data and program/write data (B460). Afterwards, the procedure is terminated (B470). The steps indicated as B450 and B460 in the current working example may be identical to the analogous steps B320 and B340 previously described in relation to FIG. 50 and description thereof is thus omitted.

In other embodiments of the inventive concept, it is possible to place reference cells within a PRAM cell array so as to experience the thermal coupling phenomenon forced upon normal memory cells. Herein, the reference cells may be used to generate bias voltages to be supplied to a write driver and sense amplifier block in FIG. 49.

In other embodiments of the inventive concept, it is possible to program reference cells so as to experience the same thermal coupling phenomenon when normal memory cells are programmed. In this case, reference cells may be formed of a plurality of groups, and reference cells in each group may be programmed within a given number. That is, if reference cells in one group are programmed within a given number, reference cells in another group may be used. Herein, the reference cells may be used to generate bias voltages.

In certain embodiments of the inventive concept, the generation of the bias voltage(s) may be performed before or after an input of write data.

Figure 54:
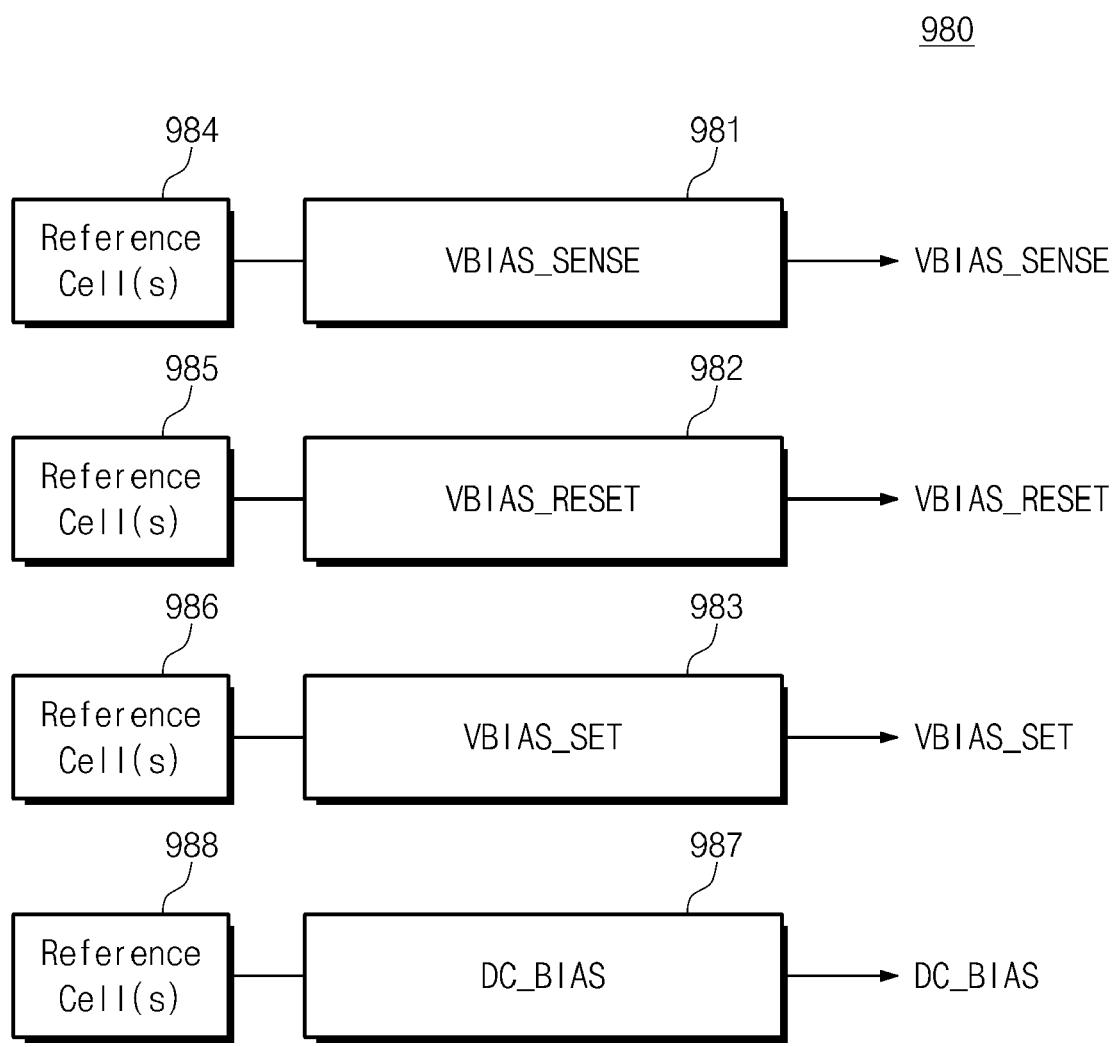
FIG. 54 is a block diagram illustrating a bias voltage generator circuit according to another embodiment of the inventive concept.

FIG. 54 is a block diagram illustrating a bias voltage generator circuit according to an embodiment of the inventive concept.

A bias voltage generator circuit 980 illustrated in FIG. 54 may be substantially identical to that illustrated in FIG. 50 except a voltage generator 987 (hereinafter, referred to as the fourth voltage generator) and reference cells 988. The fourth voltage generator 987 is electrically coupled with the reference cells 988 and generates a bias voltage DC_BIAS to be applied to a write driver (refer to FIG. 14). As set forth above, the bias voltage DC_BIAS may increase stepwise at iteration of write loops. The fourth voltage generator 987 may be configured to program the reference cells 988 so as to have required resistance values. For example, as described above, the fourth voltage generator 987 may include a reference write driver(s) and a reference read circuit(s). The reference cells 988 may be used to generate bias voltages each corresponding to write loops. The fourth voltage generator 987 may select one of the reference cells 988 every write loop and generate a bias voltage DC_BIAS based on a resistance value of the selected reference cell. Resistance values of the reference cells 988 may be determined such that the bias voltage DC_BIAS increases stepwise. Accordingly, it is possible to generate the bias voltage DC_BIAS, used to generate write current, using reference cells. It is possible to program a memory cell with a wanted resistance value by reflecting a resistance variation of a memory cell due to operating temperature variation to the bias voltage DC_BIAS.

Figure 55:
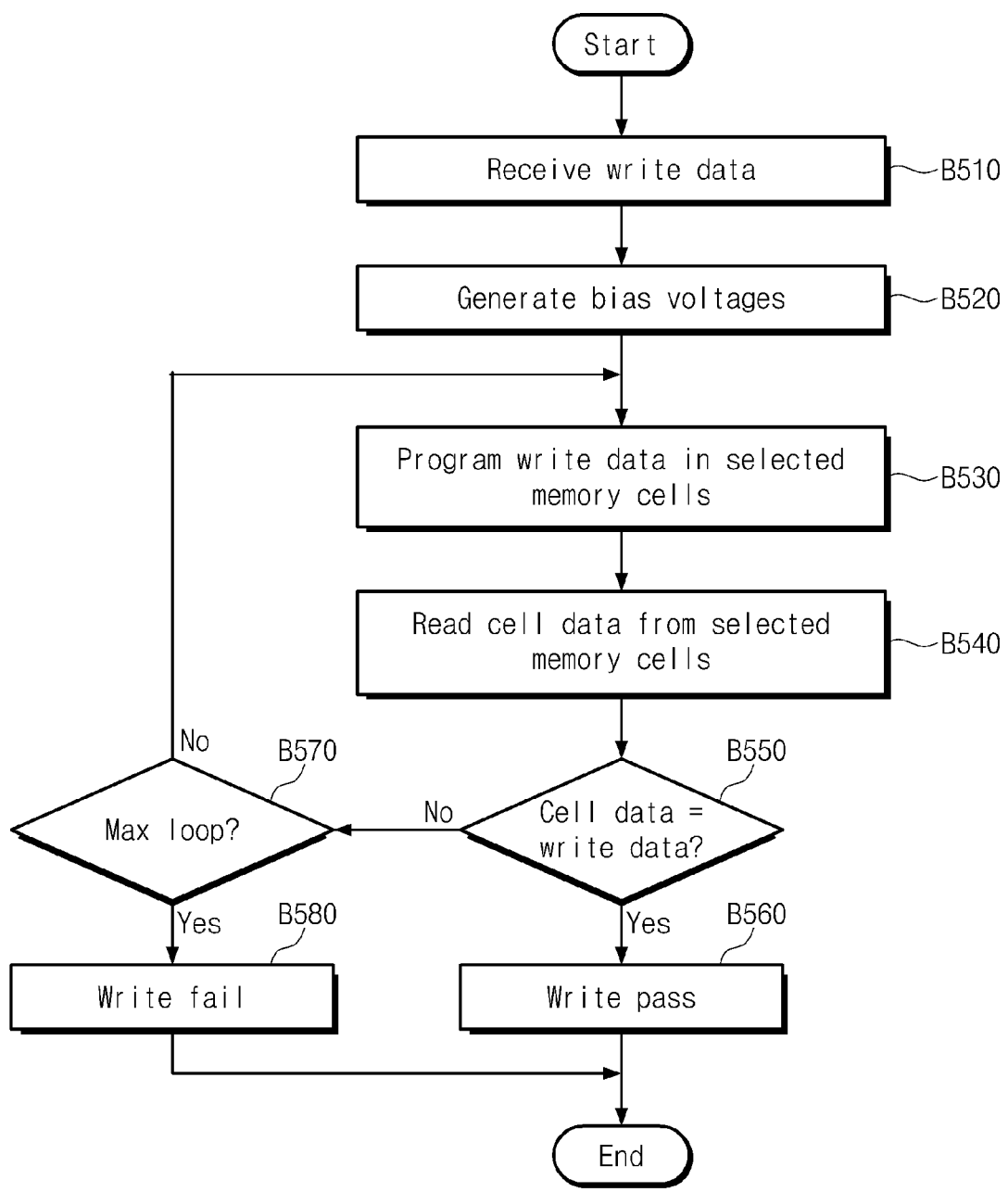
FIG. 55 is a flow chart summarizing a write method for a phase change memory device according to still another embodiment of the inventive concept.

FIG. 55 is a flow chart summarizing a write method applied to a phase change memory device according to an embodiment of the inventive concept.

Referring to FIG. 55, a write method comprises receiving write data (B510); generating bias voltages (B520); programming selected memory cells with write data (B530); reading cell data from the selected memory cells (B540); determining whether the cell data is identical to the write data (B550); terminating a write operation as write pass when the cell data is judged to be identical to the write data (B560); determining whether a write loop reaches a max loop when the cell data is judged not to be identical to the write data (B570); terminating a write operation as write fail when a write loop is judged to reach a max loop (B580); and going to the B530 step after increasing a write loop when a write loop is judged not to reach a max loop.

Herein, bias voltages generated at the B520 step may be generated using reference cells, which will be made identically to that described in FIG. 50 or FIG. 54.

A phase change memory device according to embodiments of the inventive concept may be used as a storage data memory. In a computing system, the storage data memory may be used as a large-volume memory which is placed between CPU and HDD/SSD. A buffer memory can be used between the storage data memory and the CPU.

With embodiments of the inventive concept, sensing cell data, determining whether cell data is identical to write data, supplying write current to memory cells according to the determination ensures adequate control of a resistance value of a selected memory cell, and the write current speeds up the Joule effect directly to the point where its efficiency is maximum.

In certain embodiments of the inventive concept, it is possible to configure a phase change memory device in FIG. 49 so as to perform the characteristics operations and components described in relation to FIG. 20 through FIG. 48. For example, it is possible to configure a bias voltage generator circuit 980 so as to include a temperature compensation circuit 100 in FIG. 35. In this case, a write driver and sense amplifier block in FIG. 49 may be configured to include functions of a read circuit 10 in FIG. 35. In the phase change memory device, it is well understood that characteristics described in FIG. 1 to FIG. 55 may be variously combined.

In certain embodiments of the inventive concept, after iteration of write loops is terminated, a write operation can be performed additionally. This is to lower an upper-tail portion of a MSB resistance distribution (or, a resistance distribution corresponding to each reset state). The iteration of write loops may be ended when a write operation is passed within a max loop.

FIGS. 56 through 60 are system diagrams illustrating various data storage system capable of incorporating a phase change memory device according to an embodiment of the inventive concept.

Figure 56:
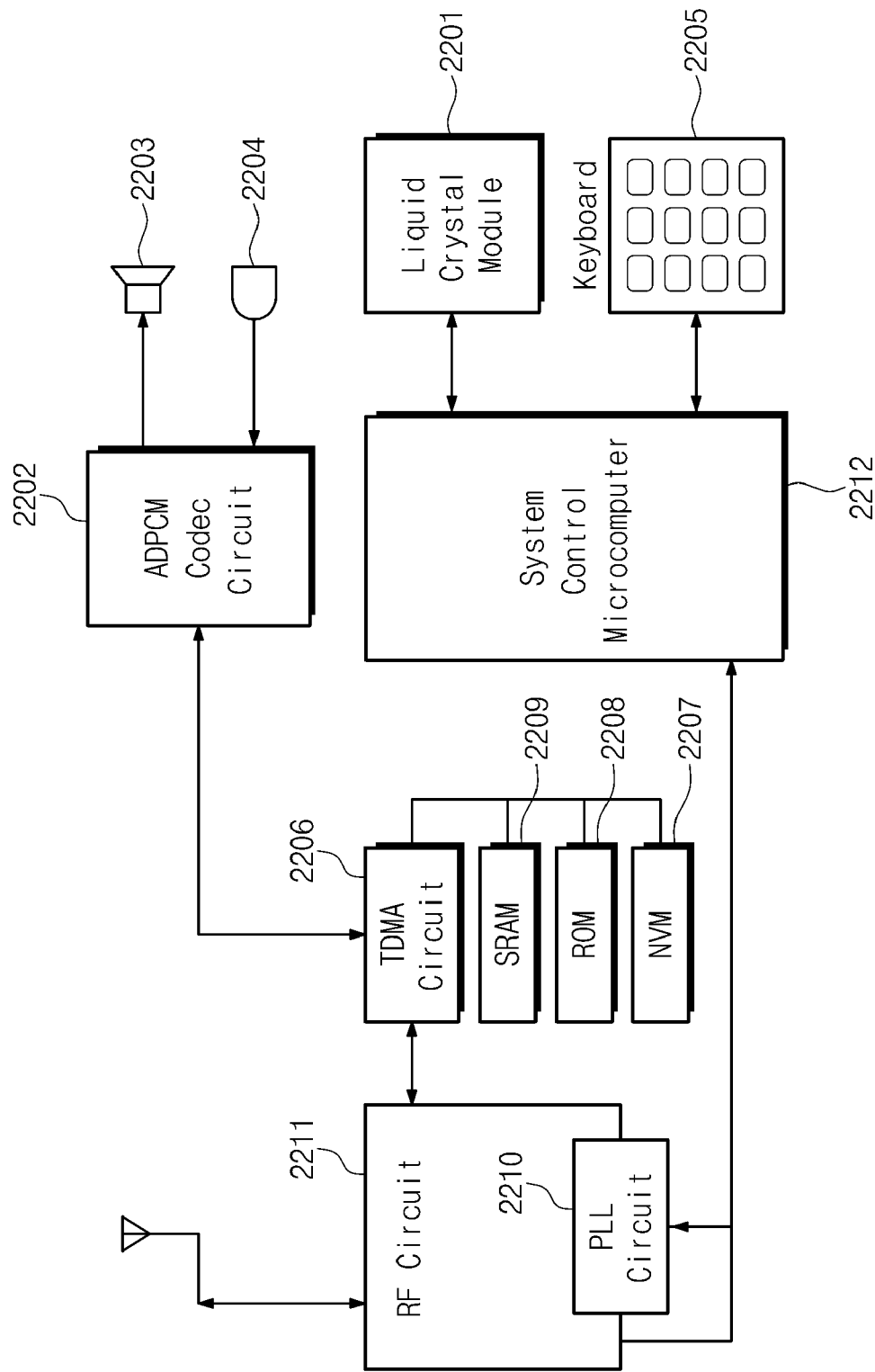
FIGS. 56, 57, 58, 59 and 60 are diagrams illustrating various data storage systems incorporating a phase change memory device according to certain embodiments of the inventive concept.

FIG. 56 is a block diagram illustrating a cellular phone system to which a phase change memory device according to embodiments of the inventive concept is applied. Referring to FIG. 56, a cellular phone system may include an ADPCM codec circuit 2202 for compressing a voice and decompressing a compressed voice, a speaker 2203, a microphone 2204, a TDMA circuit 2206 for time-division multiplexing digital data, a PLL circuit 2210 configured to set a carrier frequency of a radio frequency signal, an RF circuit 2211 configured to send and receive a radio frequency signal, and the like.

Further, the cellular phone system may include various types of memories, such as the non-volatile memory device 2207, the ROM 2208, and the SRAM 2209. The non-volatile memory device 2207 may be formed of a phase change memory device being a non-volatile memory device according to embodiments of the inventive concept and used to store ID numbers. The ROM 2208 may be used to store programs, and the SRAM 2209 may be used as a work region for the system control microcomputer 2212 or/and to temporarily store data. Herein, the system control microcomputer 2212 is a processor which is configured to control write and read operations of the non-volatile memory device 2207.

Figure 57:
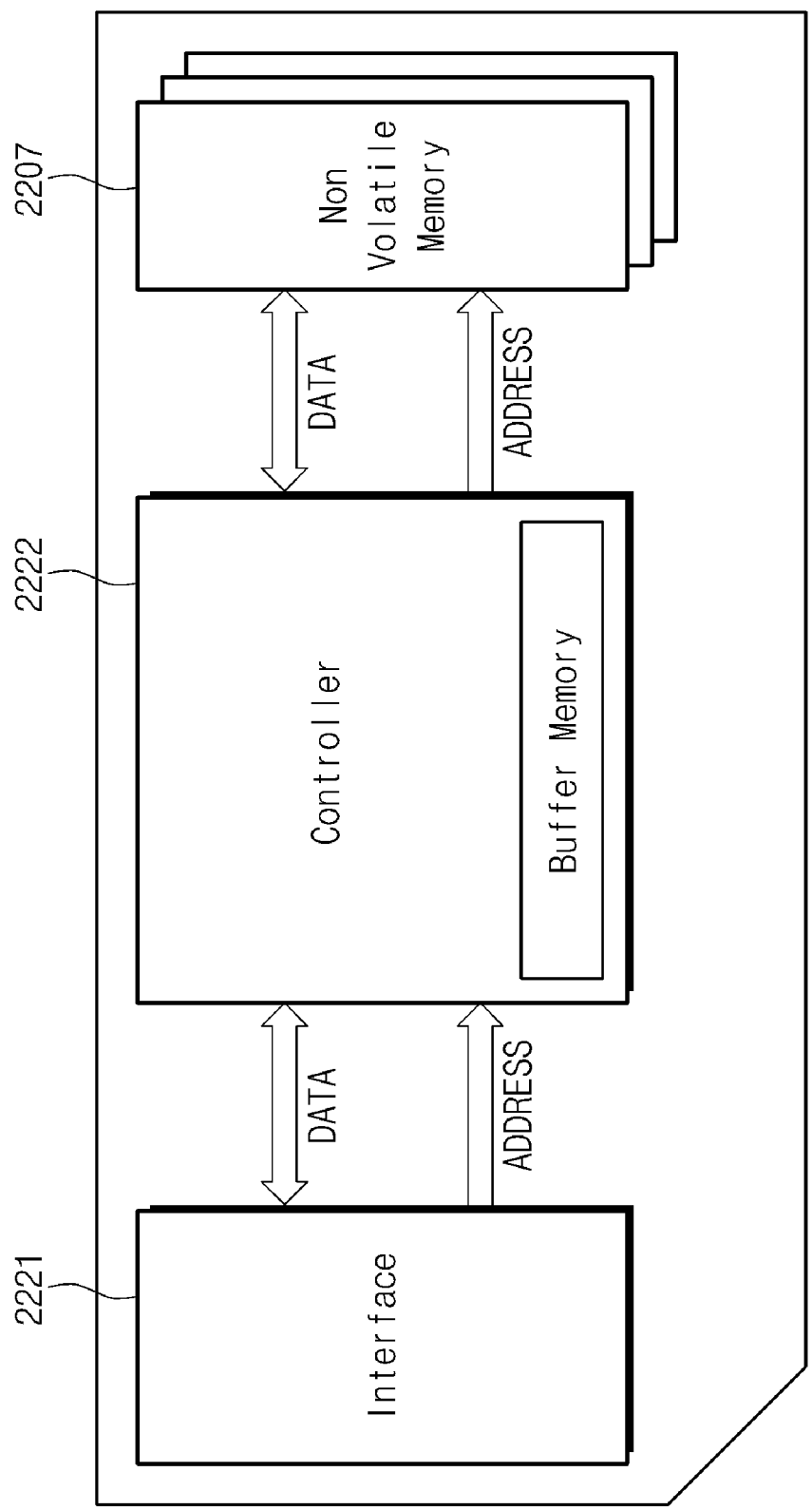

FIG. 57 is a block diagram illustrating a memory card to which a non-volatile memory device according to embodiments of the inventive concept is applied. A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 57, the memory card may include an interface circuit 2221 for interfacing with an external device, a controller 2222 including a buffer memory and controlling an operation of the memory card, and at least one non-volatile memory device 2207 according to embodiments of the inventive concept. The controller 2222 may be a processor which is configured to control write and read operations of the non-volatile memory device 2207. In particular, the controller 2222 may be coupled with the non-volatile memory device 2207 and the interface circuit 2221 via a data bus and an address bus.

Figure 58:
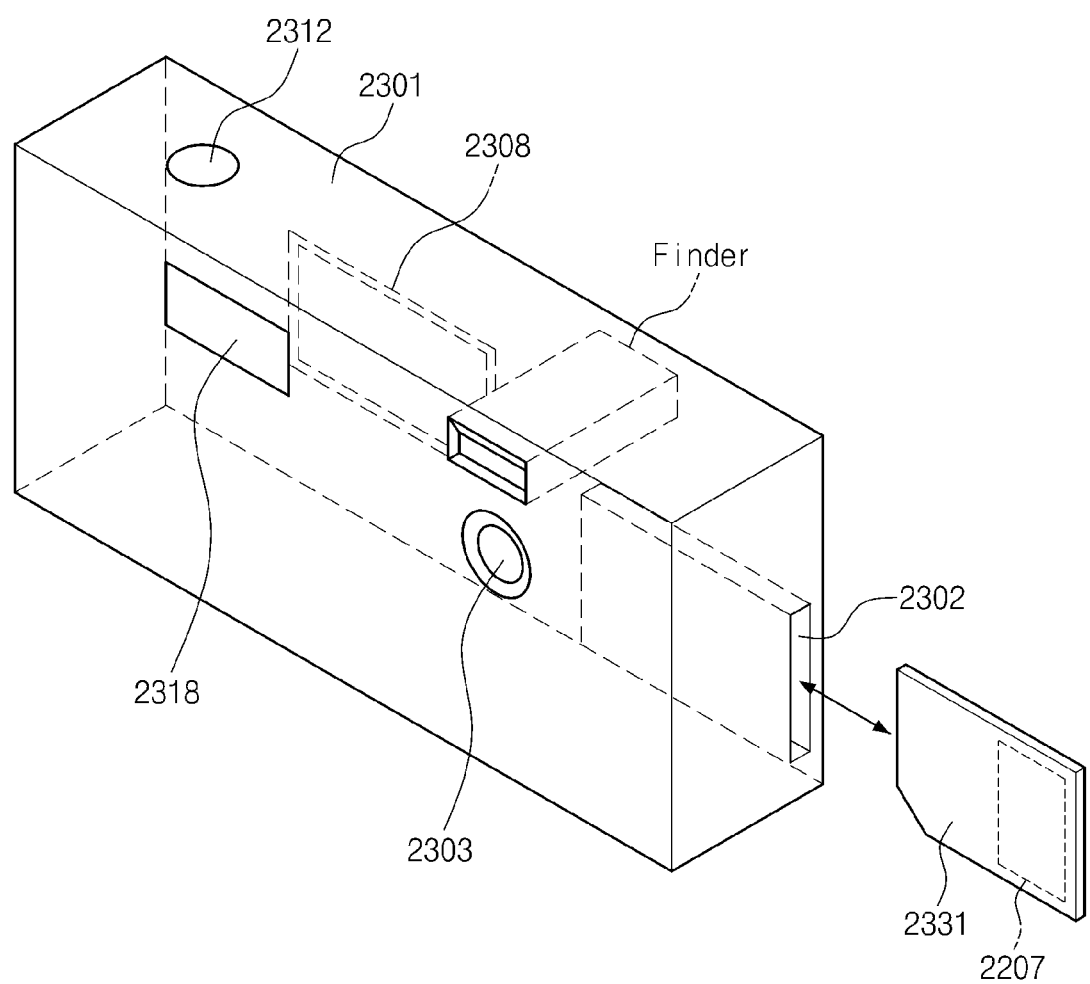

FIG. 58 is a block diagram illustrating a digital still camera to which a non-volatile memory device according to embodiments of the inventive concept is applied. Referring to FIG. 58, a digital still camera may include a body 2301, a slot 2302, a lens 2303, a display circuit 2308, a shutter button 2312, a strobe 2318, and the like. In particular, a memory card 2331 may be inserted in the slot 2308 and include at least one non-volatile memory device 2207 according to embodiments of the inventive concept.

If the memory card 2331 has a contact type, an electric circuit on a circuit board may be electrically contacted with the memory card 2331 when it is inserted in the slot 2308. In the event that the memory card 2331 has a non-contact type, an electric circuit on a circuit board may communicate with the memory card 2331 in a radio-frequency manner.

Figure 59:
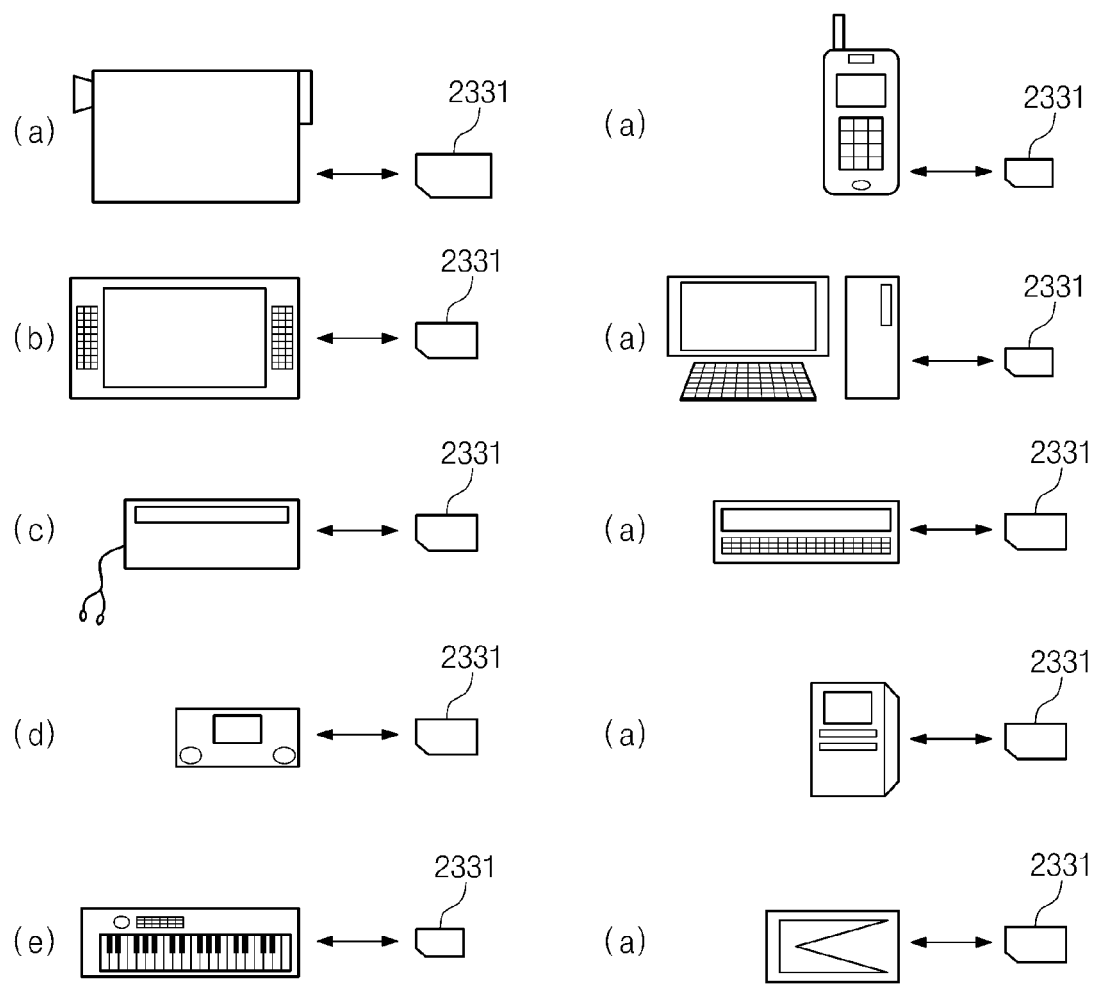

FIG. 59 is a diagram illustrating various systems to which a memory card in FIG. 57 is applied.

Referring to FIG. 59, a memory card 2331 may be applied to (a) a video camera, (b) a television, (c) an audio device, (d) a game machine, (e) an electronic music device, (f) a cellular phone, (g) a computer, (h) a Personal Digital Assistant (PDA), (i) a voice recorder, (j) a PC card, and the like.

Figure 60:
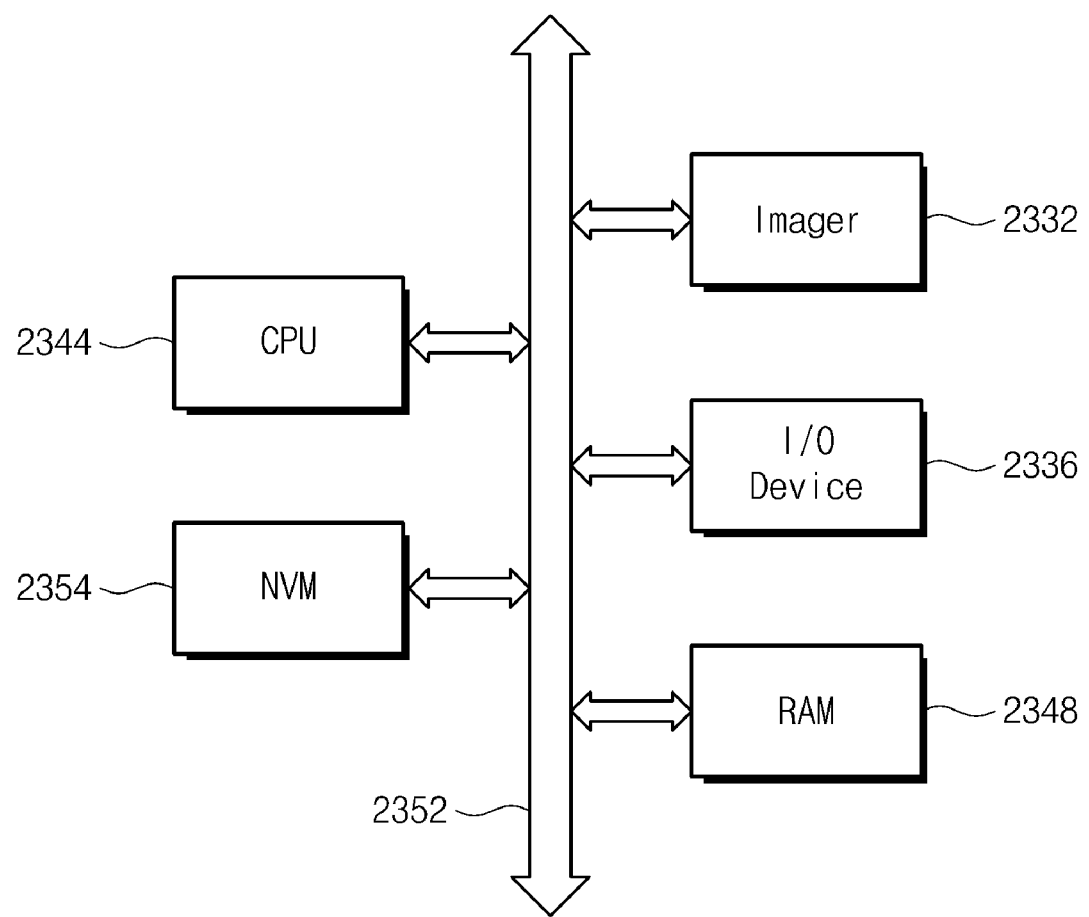

FIG. 60 is a block diagram illustrating an image sensor system to which a non-volatile memory device according to embodiments of the inventive concept is applied.

Referring to FIG. 60, an image sensor system may include an image sensor 2332, an input/output device 2336, RAM 2348, CPU 2344, and a non-volatile memory device 2354 according to embodiments of the inventive concept. Elements in FIG. 60 may communicate with one another via a bus 2352. The image sensor 2332 may include a photo sensing device such as a photo-gate, photo-diode, or the like. Elements in FIG. 60 may be formed of a single chip together with a processor or independently from the processor.

The foregoing embodiments are presented as teaching examples. Those of ordinary skill in the art will understand that various changes in form and details may be made to the embodiments without departing from the scope of the inventive concept as defined by the following claims.

What is claimed is:

1. A method of performing a program operation in a phase change memory device comprising a plurality of phase change memory cells, the method comprising:
receiving program data to be programmed in selected memory cells among the plurality of phase change memory cells;
generating bias voltages based on reference cells;
sensing read data stored in the selected memory cells by supplying the selected memory cells with verification currents each determined by the bias voltages;
determining whether the read data is identical to the program data; and
upon determining that the program data for one or more of the selected memory cells is not identical to the corresponding read data, iteratively applying a write current to the one or more selected memory cells.

2. The method of claim 1, wherein the reference cells are formed identical to the plurality of phase change memory cells within the phase change memory device.

3. The method of claim 1, wherein a level of the write current increases with each iterative application of the write current.

4. The method of claim 3, wherein the write current is generated by a plurality of reference cells respectively programmed to exhibit different resistances.

5. The method of claim 1, wherein at least a tail portion of a resistance distribution for the selected memory cell is shifted in an increasing resistance direction or a decreasing resistance direction by iteratively performing the steps of sensing data stored in the selected phase change memory cell, determining whether or not the sensed data is equal to the wrote data, and iteratively applying the write current to the selected phase change memory cell.

6. A memory device comprising:
a memory array comprising a plurality of phase change memory cells configured to store write data; and
a generator configured to generate a level-controlled write current based on first reference cells and apply the level-controlled write current to the memory array,
wherein the level-controlled write current is adjusted with each iterative application of the level-controlled write current, until a resistive state of the selected phase change memory cell falls within a defined resistance distribution corresponding to the write data.

7. The memory device of claim 6, wherein the level-controlled write current is increased stepwise according to iteration of write loops.

8. The memory device of claim 7, wherein the generator is configured to program the first reference cells with resistances respectively corresponding to the write loops.

9. The memory device of claim 6, wherein the generator further comprises second reference cells, the generator being further configured to generate bias voltages based on the second reference cells.

10. The memory device of claim 9, further comprising:
a sense amplifier block configured to generate verification currents based on the bias voltages and write data to be stored in selected phase change memory cells among the plurality of phase change memory cells,
the verification currents being applied to the selected phase change memory cells before or after supplying of the level-controlled write current to judge resistance states of the selected phase change memory cells.

11. The memory device of claim 10, wherein the supplying of the level-controlled write current is determined according to whether data of the selected phase change memory cells sensed according to the verification currents is identical to the write data.

12. A memory device comprising:
an array of phase change memory cells divided into a first memory block including a first selected memory cell and a second memory block including a second selected memory cell;
a bias voltage generator circuit configured to generate bias voltages in relation to respective resistance states for a plurality of reference cells; and
sensing and writing circuitry configured to simultaneously write data to the first and second selected memory cells by iteratively applying a level-controlled write current to the first and second selected memory cells based, at least in part on the generated bias voltages and thereafter perform a verify-read operation on the first and second selected memory cells until respective programmed states for the first and second memory cells are equal to the write data, wherein the sensing and writing circuitry are further configured to supply the first and second selected memory cells with verification currents based on the at least one of the bias voltages during each read-verify operation.

13. The memory device of claim 12, wherein the plurality of reference cells is formed identically to the phase change memory cells.

14. The memory device of claim 12, wherein the plurality of reference cells is disposed within the array of phase change memory cells to thereby experience a thermal coupling phenomenon caused when the phase change memory cells are programmed.

15. A method of writing data to a memory comprising a plurality phase change memory cells each storing N-bit data according to respectively corresponding $N^2$ resistance distributions, the method comprising:

receiving write data to be written to a selected phase change memory cell in the plurality of phase change memory cells;

applying a write current to the selected phase change memory cell, wherein the write current is defined in relation to the write data;

after applying the write current, sensing a resistive state of the selected phase change memory cell;

comparing the sensed resistive state of the selected phase change memory cell to a reference defined in relation to the write data; and if the sensed resistive state fails comparison with the reference, adjusting the write current, and applying the adjusted write current to the selected phase change memory cell, the write current being generated based on reference cells formed identically to the phase change memory cells.

16. The method of claim 15, wherein the adjusting of the write current and applying of the adjusted write current to the selected phase change memory cell continues iteratively until the sensed resistive state falls within one of the $N^2$ resistance distributions corresponding to the write data, as indicated by a successful comparison between the sense resistive state and the reference.

17. The method of claim 16, wherein the adjusting of the write current and applying of the adjusted write current to the selected phase change memory cell continues iteratively within a maximum number of iterations.

18. The method of claim 15, wherein a tail portion of any one of the $N^2$ resistance distributions corresponding to the write data is shifted into either one of a resistance increasing direction and a resistance decreasing direction by the adjusting of the write current and the iterative applying of the adjusted write current.

19. The method of claim 15, wherein the sensing a resistive state of the selected phase change memory cell comprises applying a verification current to the selected phase change memory cell.

20. The method of claim 19, wherein the verification current is determined by a bias voltage generated according to at least one reference cell.

* * * * *